(12) United States Patent
Vitale et al.

(10) Patent No.: US 12,080,742 B2
(45) Date of Patent: Sep. 3, 2024

(54) IMAGE CAPTURE DEVICE

(71) Applicant: GoPro, Inc., San Mateo, CA (US)

(72) Inventors: Nicholas Vitale, Foster City, CA (US); Michael Brookmire, Half Moon Bay, CA (US); Matthew David Thomas, Castro Valley, CA (US); Jesse Patterson, Pacifica, CA (US); John George Muhlenkamp, IV, Brisbane, CA (US); Heman Au, San Mateo, CA (US)

(73) Assignee: GoPro, Inc., San Mateo, CA (US)

( * ) Notice: Subject to any disclaimer, the term of this patent is extended or adjusted under 35 U.S.C. 154(b) by 0 days.

(21) Appl. No.: 18/206,505

(22) Filed: Jun. 6, 2023

(65) Prior Publication Data

US 2023/0326943 A1 Oct. 12, 2023

Related U.S. Application Data

(63) Continuation of application No. 17/036,687, filed on Sep. 29, 2020, now Pat. No. 11,721,712, which is a
(Continued)

(51) Int. Cl.
  *G02B 3/00* (2006.01)
  *H01L 27/146* (2006.01)
  *H04N 23/55* (2023.01)

(52) U.S. Cl.
  CPC ...... *H01L 27/14627* (2013.01); *G02B 3/0075* (2013.01); *H04N 23/55* (2023.01)

(58) Field of Classification Search
  CPC . H01L 27/14627; G02B 3/0075; G02B 7/022; H04N 23/55; H04N 23/45
  See application file for complete search history.

(56) References Cited

U.S. PATENT DOCUMENTS

| 5,832,153 A | 11/1998 | Duck |
| 6,215,924 B1 | 4/2001 | Hulse |

(Continued)

FOREIGN PATENT DOCUMENTS

| CN | 101833157 A | 9/2010 |
| CN | 202587158 U | 12/2012 |

(Continued)

OTHER PUBLICATIONS

International Search Report and Written Opinion for PCT/US2016/021269, May 17, 2016, 14 Pages.
(Continued)

*Primary Examiner* — Nhan T Tran
(74) *Attorney, Agent, or Firm* — Young Basile Hanlon & MacFarlane, P.C.

(57) ABSTRACT

An image capture device includes a first housing, a second housing, a first integrated sensor-lens assembly (ISLA), and a second ISLA. The second housing is coupled to the first housing to form an internal compartment. The first ISLA includes a first image sensor coupled to a first lens in fixed alignment. The second ISLA includes a second image sensor coupled to a second lens in fixed alignment. The first ISLA is positively statically connected to the first housing, and the second ISLA is coupled to the first housing indirectly via the first ISLA.

20 Claims, 58 Drawing Sheets

Related U.S. Application Data continuation-in-part of application No. 29/706,014, filed on Sep. 17, 2019, now Pat. No. Des. 918,989, and a continuation-in-part of application No. 29/705,671, filed on Sep. 13, 2019, now Pat. No. Des. 918,988, and a continuation-in-part of application No. 29/694,559, filed on Jun. 11, 2019, now Pat. No. Des. 907,101, and a continuation-in-part of application No. 29/661,818, filed on Aug. 31, 2018, now Pat. No. Des. 907,680.

(60) Provisional application No. 62/908,169, filed on Sep. 30, 2019.

(56) References Cited

U.S. PATENT DOCUMENTS

| | | | | |
|---|---|---|---|---|
| 7,139,473 | B2 | 11/2006 | Shimano | |
| 7,190,389 | B1 | 3/2007 | Abe | |
| 7,283,854 | B2 | 10/2007 | Sato | |
| 7,397,511 | B2 | 7/2008 | Ezawa | |
| 7,619,683 | B2 | 11/2009 | Davis | |
| 7,626,612 | B2 | 12/2009 | John | |
| 7,724,284 | B2* | 5/2010 | Mentzer | H04N 23/45 348/262 |
| 7,856,180 | B2 | 12/2010 | Chishima | |
| 7,859,588 | B2 | 12/2010 | Parulski | |
| 7,961,234 | B2 | 6/2011 | Jarkko | |
| 8,004,555 | B2 | 8/2011 | Oswald | |
| 8,046,026 | B2 | 10/2011 | Koh | |
| 8,149,327 | B2 | 4/2012 | Lin | |
| 8,208,062 | B2 | 6/2012 | Lin | |
| 8,451,312 | B2 | 5/2013 | Lee | |
| 8,730,299 | B1 | 5/2014 | Kozko | |
| 9,007,431 | B1 | 4/2015 | Kozko | |
| 9,148,588 | B2 | 9/2015 | Jung | |
| 9,185,279 | B2 | 11/2015 | Masuda | |
| 9,197,885 | B2 | 11/2015 | Sun | |
| 9,232,151 | B1 | 1/2016 | Azuma | |
| 9,330,436 | B2 | 5/2016 | MacMillan | |
| 9,332,167 | B1 | 5/2016 | Pance | |
| 9,521,321 | B1 | 12/2016 | Kozko | |
| 9,589,317 | B2 | 3/2017 | Ozaki | |
| 9,754,159 | B2 | 9/2017 | MacMillan | |
| 9,756,243 | B2 | 9/2017 | Shohara | |
| 9,760,768 | B2 | 9/2017 | MacMillan | |
| 9,977,226 | B2 | 5/2018 | Davies | |
| 9,992,394 | B2 | 6/2018 | Abbas | |
| 10,054,845 | B1* | 8/2018 | Garcia | G03B 37/04 |
| 10,404,901 | B2 | 9/2019 | Abbas | |
| 10,429,625 | B2 | 10/2019 | Davies | |
| 10,462,442 | B2 | 10/2019 | Walker | |
| 10,574,871 | B2 | 2/2020 | Abbas | |
| 10,904,414 | B2 | 1/2021 | Abbas | |
| 2004/0021792 | A1* | 2/2004 | Yasui | H05K 1/189 348/E7.079 |
| 2004/0048633 | A1 | 3/2004 | Sato | |
| 2005/0046740 | A1* | 3/2005 | Davis | H04N 7/142 348/E7.079 |
| 2005/0237424 | A1* | 10/2005 | Weekamp | H04N 23/57 348/E5.025 |
| 2006/0087751 | A1 | 4/2006 | Liu | |
| 2006/0187560 | A1 | 8/2006 | Chou | |
| 2007/0070204 | A1 | 3/2007 | Mentzer | |
| 2007/0269205 | A1* | 11/2007 | Lee | G03B 17/02 396/542 |
| 2007/0279482 | A1 | 12/2007 | Oswald | |
| 2008/0064437 | A1 | 3/2008 | Chambers | |
| 2008/0218611 | A1 | 9/2008 | Parulski | |
| 2008/0218612 | A1 | 9/2008 | Border | |
| 2009/0017867 | A1 | 1/2009 | Koh | |
| 2009/0047995 | A1 | 2/2009 | Futter | |
| 2009/0148149 | A1 | 6/2009 | Chishima | |
| 2010/0045773 | A1 | 2/2010 | Ritchey | |
| 2010/0072373 | A1 | 3/2010 | Nakajima | |
| 2010/0165155 | A1 | 7/2010 | Chang | |
| 2010/0231779 | A1* | 9/2010 | Lin | G03B 35/08 348/335 |
| 2011/0164105 | A1 | 7/2011 | Lee | |
| 2012/0019661 | A1 | 1/2012 | Thomson | |
| 2012/0148192 | A1 | 6/2012 | Nakanishi | |
| 2012/0274800 | A1* | 11/2012 | Vakil | H04N 23/57 29/829 |
| 2013/0242040 | A1* | 9/2013 | Masuda | H04N 23/51 348/36 |
| 2014/0168424 | A1 | 6/2014 | Attar | |
| 2014/0192144 | A1* | 7/2014 | St. Clair | H04N 23/698 348/36 |
| 2014/0218587 | A1 | 8/2014 | Shah | |
| 2014/0267596 | A1* | 9/2014 | Geerds | H04N 23/51 348/38 |
| 2015/0256746 | A1 | 9/2015 | MacMillan | |
| 2015/0271483 | A1 | 9/2015 | Sun | |
| 2015/0279038 | A1 | 10/2015 | MacMillan | |
| 2016/0061954 | A1 | 3/2016 | Walsh | |
| 2016/0274338 | A1* | 9/2016 | Davies | H04N 23/698 |
| 2017/0111559 | A1* | 4/2017 | Abbas | G03B 17/12 |
| 2018/0278818 | A1* | 9/2018 | Abbas | G02B 7/021 |
| 2021/0111210 | A1 | 4/2021 | Nicholas | |
| 2021/0132326 | A1* | 5/2021 | Nakamura | H04N 23/00 |

FOREIGN PATENT DOCUMENTS

| | | |
|---|---|---|
| KR | 20180023172 A | 3/2018 |
| WO | 2010037176 A1 | 4/2010 |

OTHER PUBLICATIONS

International Search Report and Written Opinion for PCT/US2016/021269, May 17, 2016, 8 Pages.

\* cited by examiner

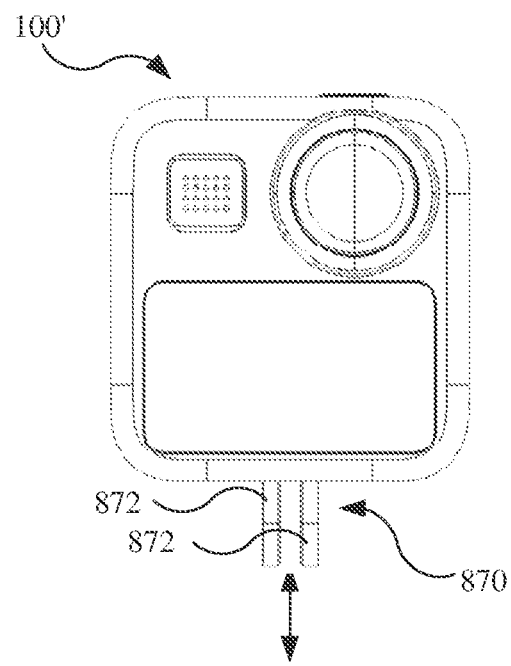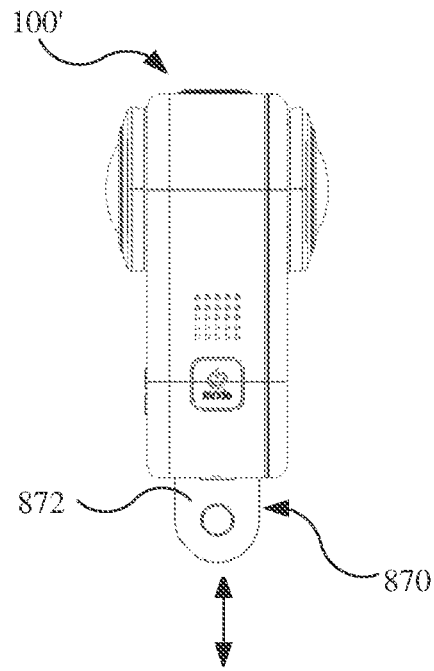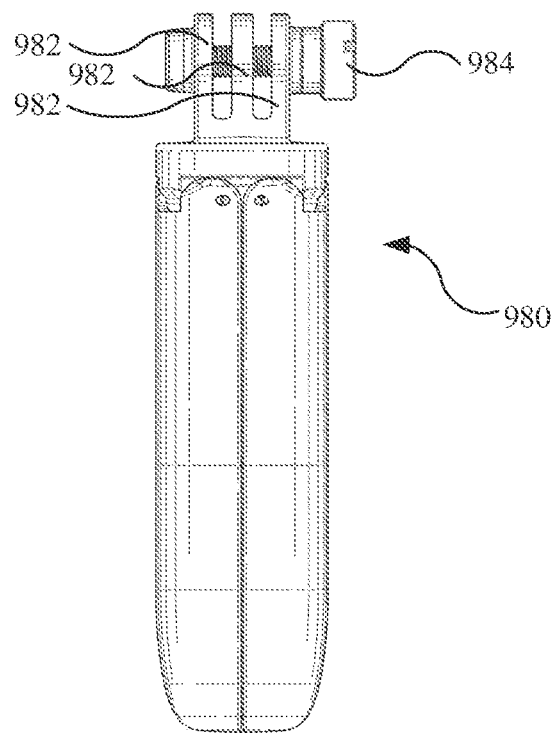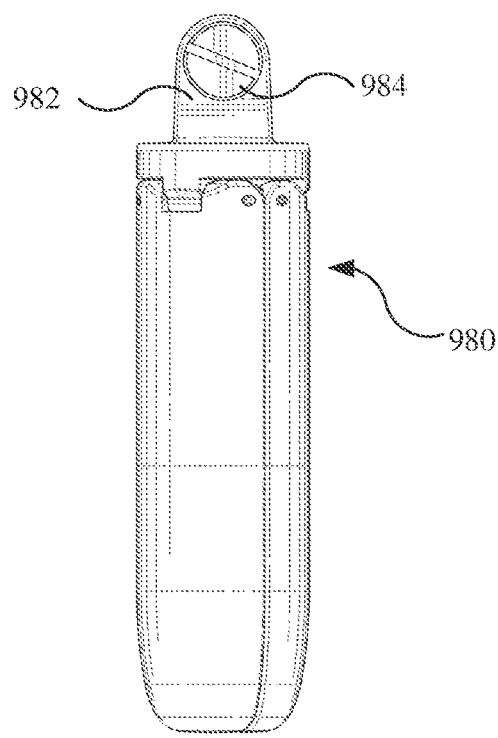
FIG. 9C  FIG. 9D

IMAGE CAPTURE DEVICE

CROSS-REFERENCE TO RELATED APPLICATION(S)

This application is a continuation of U.S. patent application Ser. No. 17/036,687, filed Sep. 29, 2020, which claims priority to and the benefit of U.S. Provisional Application No. 62/908,169, filed Sep. 30, 2019, and is a continuation-in-part of the following Design Patent Applications: U.S. Design patent application Ser. No. 29/706,014, filed Sep. 17, 2019, now U.S. Pat. No. D918,989; U.S. Design patent application Ser. No. 29/705,671, filed Sep. 13, 2019, now U.S. Pat. No. D918,988; U.S. Design patent application Ser. No. 29/694,559, filed Jun. 11, 2019, now U.S. Pat. No. D907,101; and U.S. Design patent application Ser. No. 29/661,818, filed Aug. 31, 2018, now U.S. Pat. No. D907,680. The entire content of each of the above-identified applications is hereby incorporated by reference.

TECHNICAL FIELD

This disclosure relates to image capture devices and, more particularly, structures thereof and accessories therefor.

BACKGROUND

An image capture device is an electronic image capture device that captures images and may also record audio. Depending on their environment and types of use, image capture devices may be subject to adverse environmental conditions (e.g., water, debris, temperature) and forces (e.g., impacts with other objects).

SUMMARY

Disclosed herein are implementations of image capture devices, accessories therefor, and image capture systems.

In one implementation, an image capture device includes a first housing, a second housing, a first integrated sensor-lens assembly (ISLA), and a second ISLA. The second housing is coupled to the first housing to form an internal compartment. The first ISLA includes a first image sensor coupled to a first lens in fixed alignment. The second ISLA includes a second image sensor coupled to a second lens in fixed alignment. The first ISLA is positively statically connected to the first housing, and the second ISLA is coupled to the first housing indirectly via the first ISLA.

In one implementation, an image capture device includes a housing, a chassis, and a mount. The housing defines an internal compartment that is sealed. The chassis is positioned within the internal compartment and has coupled thereto electronic components of the image capture device. The mount is configured to couple the image capture device to a support device. The mount is positively statically connected to the chassis through the housing via a fastener.

In one implementation, an image capture system includes an image capture device and two lens covers. The image capture device includes a body, two lenses disposed on opposite sides of the body, and two lens bezels. Each of the lens bezels surround one of the two lenses and is spaced apart from the body to define a circumferential channel therebetween and extending around the lens. Each of the two lens covers defines a recess and includes a coupling flange that protrudes inwardly toward the recess. For each of the two lens covers, the recess is configured to receive one of the two lenses, and the coupling flange is configured to be received by the circumferential surround the one of the two lenses to couple the lens cover to the image capture device.

BRIEF DESCRIPTION OF THE DRAWINGS

The disclosure is best understood from the following detailed description when read in conjunction with the accompanying drawings. It is emphasized that, according to common practice, the various features of the drawings are not to-scale. On the contrary, the dimensions of the various features are arbitrarily expanded or reduced for clarity.

FIG. 9C is a rear view of the image capture device of FIG. 1D and a device mount in a disconnected state.

FIG. 9D is a right view of the image capture device of FIG. 1D and the device mount of FIG. 9C in the disconnected state.

DETAILED DESCRIPTION

Described herein are image capture devices, mounts therefor, housings therefor (e.g., protective or removable housings), and systems that include image capture devices, housings, and other devices. As used herein, the term "image capture device" is an electronic device that captures images. An image capture device is considered to include any electronic device having a primary function of capturing images and having tangential functions related to capturing images, such as storing, processing, displaying or otherwise outputting, and transferring captured images and associated audio. An image capture device is also considered to include any electronic device having other functions unrelated to image capture, such as a communications device having functions for both user communication and image capture (e.g., a smartphone) or a portable computing device having functions for both personal computing and image capture (e.g., a tablet or laptop computer). An image capture device may alternatively be referred to as camera or a digital image capture device.

As discussed in further detail below, the image capture devices and housings disclosed herein include structures and mounts that may provide improved robustness to environmental and usage conditions, which may provide improved reliability and longevity over other image capture devices subject to similar environmental and usage conditions.

Figure 1A:
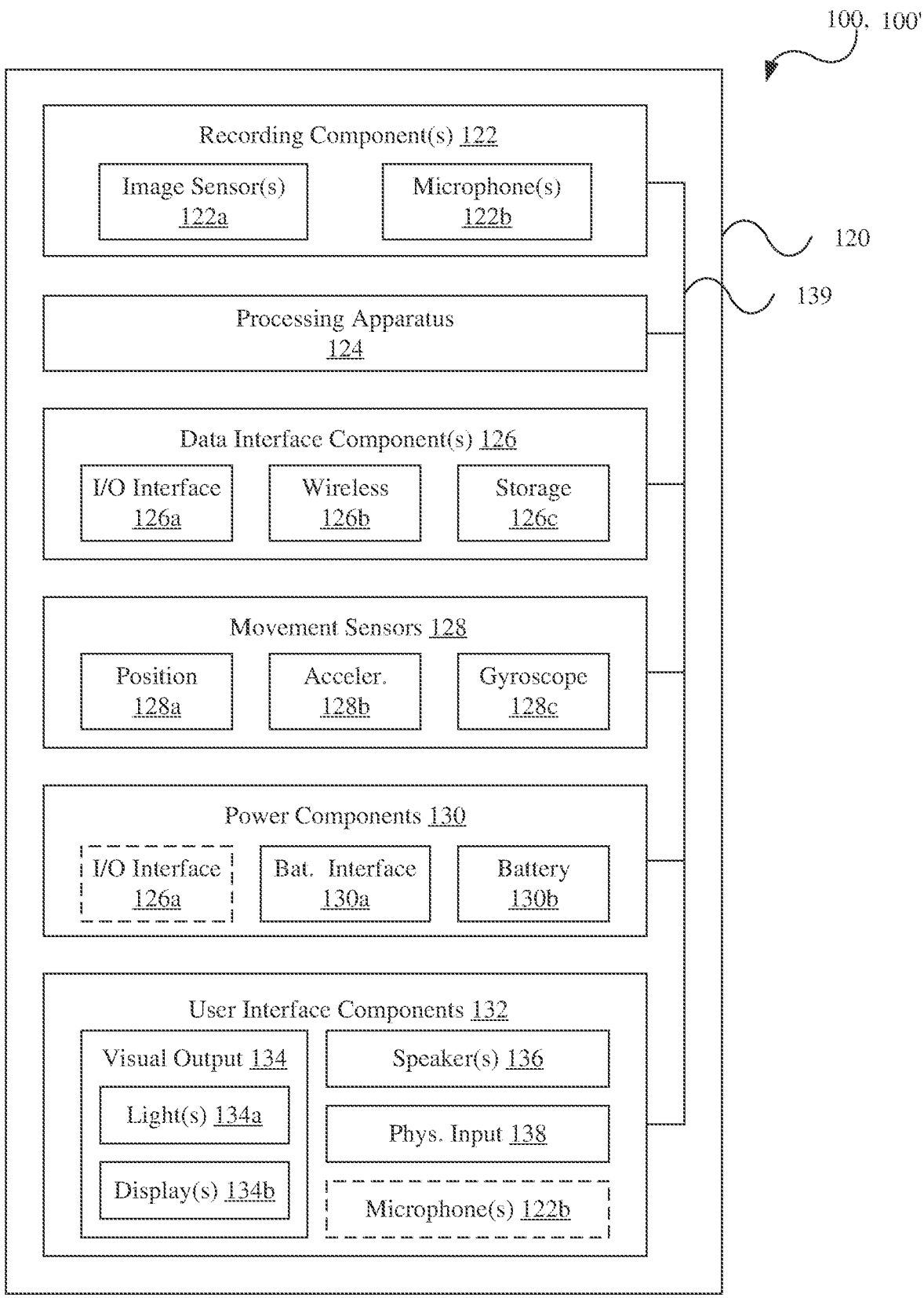
FIG. 1A is a block diagram of electronic components of an image capture device.
Figure 1B:
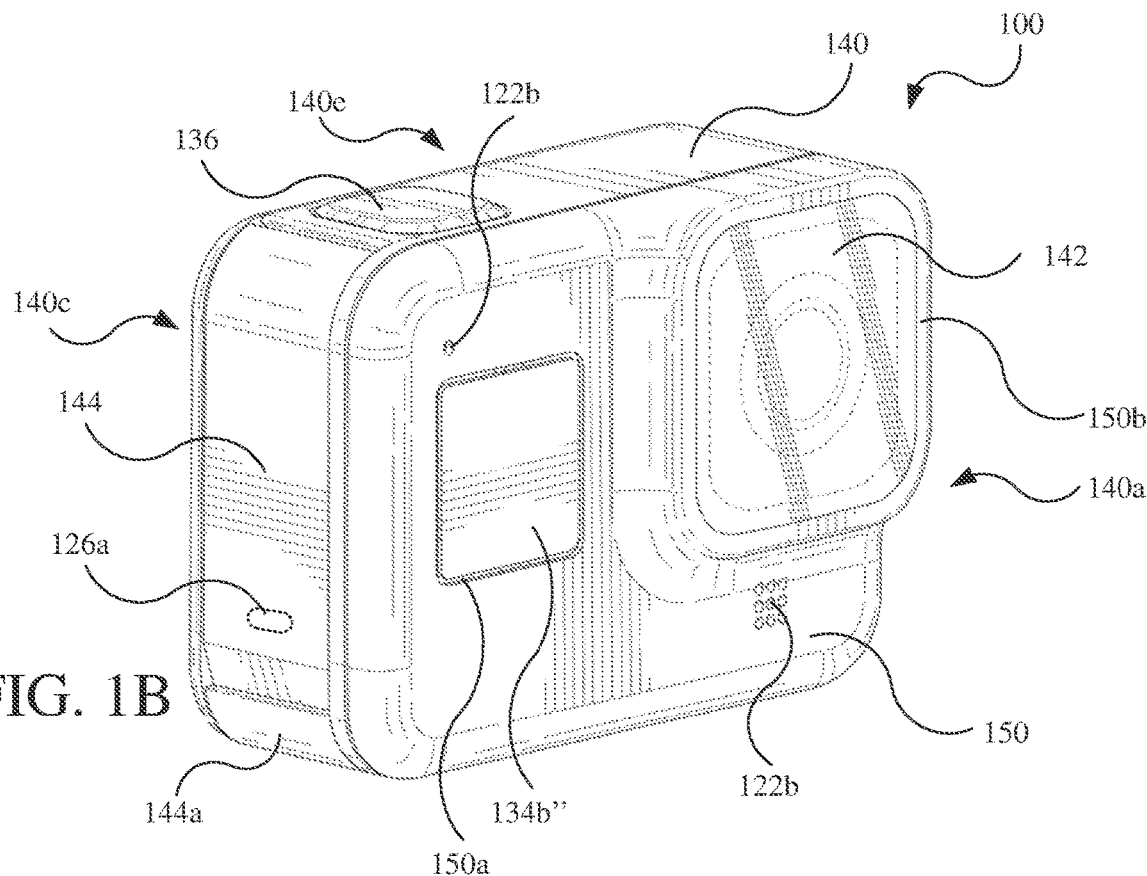
FIG. 1B is an upper, front, left perspective view of a first physical embodiment of the image capture device of FIG. 1A.
Figure 1C:
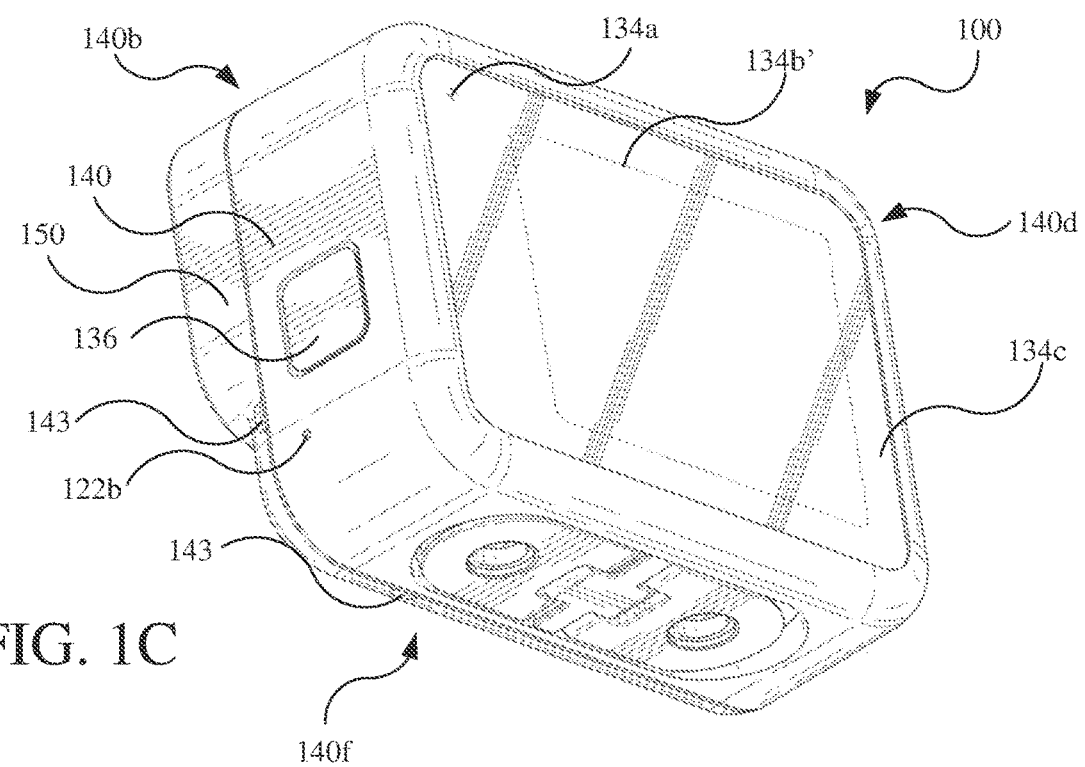
FIG. 1C is a lower, rear, right perspective view of the image capture device of FIG. 1B.
Figure 1D:
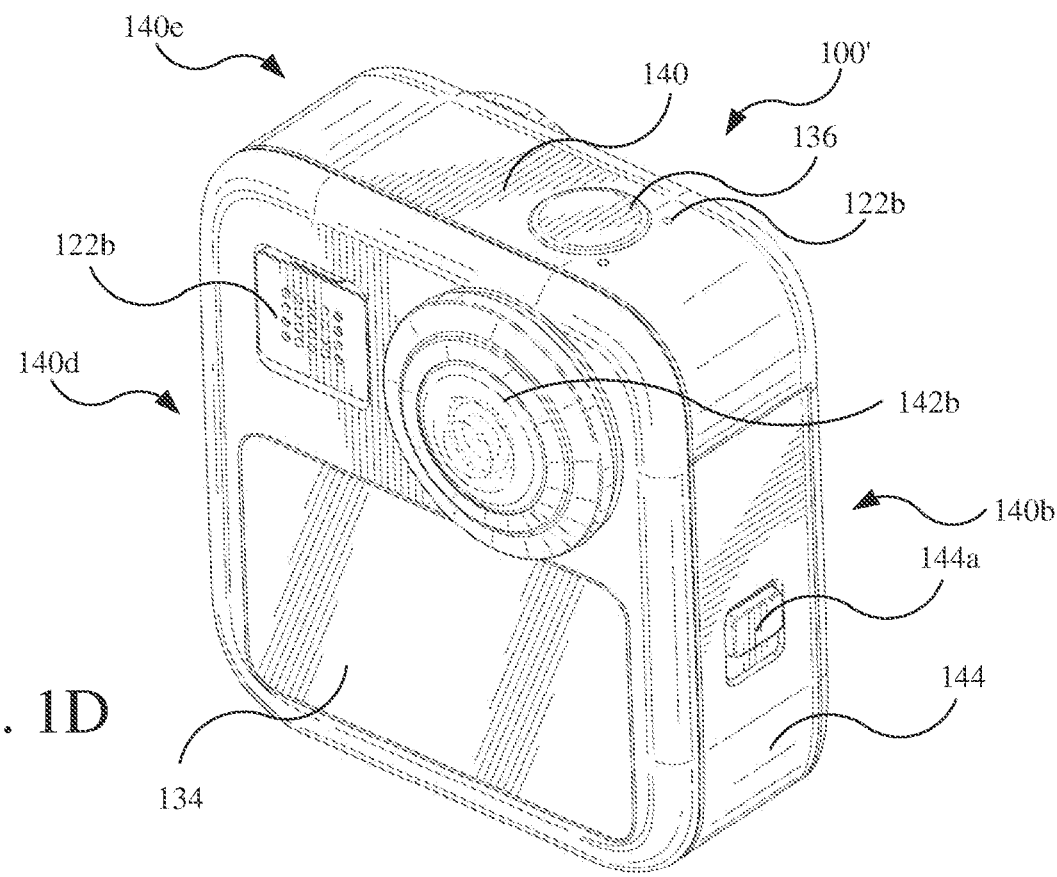
FIG. 1D is an upper, rear, left perspective view of a second physical embodiment of the image capture device of FIG. 1A.
Figure 1E:
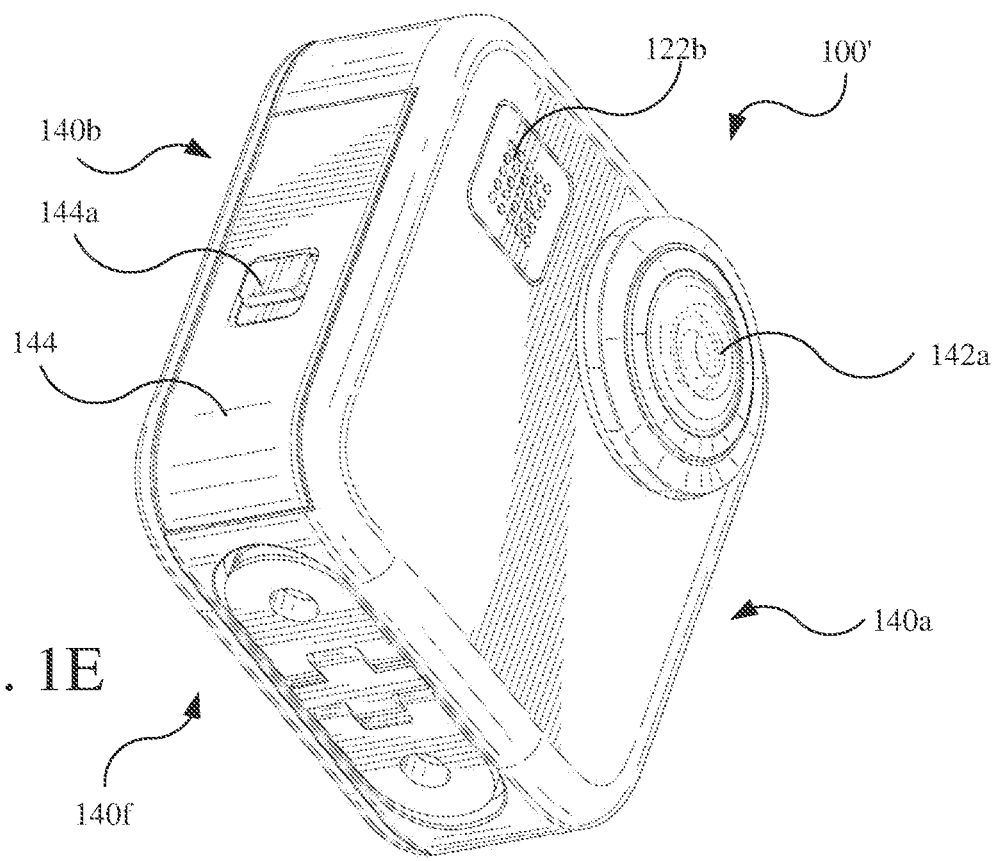
FIG. 1E is a lower, front, left perspective view of the image capture device of FIG. 1D.

FIG. 1A is a block diagram of electronic components of an image capture device 100 and an image capture device 100'. The image capture device 100 is a single-lens image capture device, and the image capture device 100' is a multi-lens image capture device that may be considered a variation of the image capture device 100. For ease of reference, the electronic components of FIG. 1A are described primarily with reference to the image capture device 100 but should be understood to be included in the image capture device 100'. FIGS. 1B and 1C are perspective views of an example of the image capture device 100. FIGS. 1D and 1E are perspective views of the image capture device 100'.

Referring to FIG. 1A, the image capture device 100 includes electronic components 120 and a body 140 that contains or is otherwise coupled to the electronic components 120. The electronic components 120 may generally include capture components 122, a processing apparatus 124, data interface components 126, movement sensors 128, power components 130, and/or user interface components 132.

The capture components 122 include one or more image sensors 122a for capturing images and one or more microphones 122b for capturing audio.

The image sensor 122a is configured to detect light of a certain spectrum (e.g., the visible spectrum or the infrared spectrum) and convey information constituting an image as electrical signals (e.g., analog or digital signals). The image sensor 122a detects light incident through a lens. The image sensor 122a may be any suitable type of image sensor, such as a charge-coupled device (CCD) sensor, active pixel sensor (APS), complementary metal-oxide-semiconductor (CMOS) sensor, N-type metal-oxide-semiconductor (NMOS) sensor, and/or any other image sensor or combination of image sensors. Image signals from the image sensor 122a may be passed to other electronic components 120 of the image capture device 100 via a bus 139, such as to the processing apparatus 124. In some implementations, the image sensors 122a include a digital-to-analog converter. The image capture device 100' includes multiple of the image sensors 122a (e.g., two as described below). The image sensor 122a may be provided as a system-on-chip (SoC), which may include other components (e.g., the processing apparatus 124).

The one or more microphones 122b are configured to detect sound, which may be recorded in conjunction with capturing images to form a video.

The processing apparatus 124 may be configured to perform image signal processing (e.g., filtering, tone mapping, stitching, and/or encoding) to generate output images based on image data from the image sensors 122a. The processing apparatus 124 may include one or more processors having single or multiple processing cores. In some implementations, the processing apparatus 124 may include an application specific integrated circuit (ASIC). For example, the processing apparatus 124 may include a custom image signal processor. The processing apparatus 124 may exchange data (e.g., image data) with other components of the image capture device 100, such as the image sensor 122*a*, via the bus 139.

The processing apparatus 124 may include memory, such as a random-access memory (RAM) device, flash memory, or another suitable type of storage device, such as a non-transitory computer-readable memory. The memory of the processing apparatus 124 may include executable instructions and data that can be accessed by one or more processors of the processing apparatus 124. For example, the processing apparatus 124 may include one or more dynamic random-access memory (DRAM) modules, such as double data rate synchronous dynamic random-access memory (DDR SDRAM). In some implementations, the processing apparatus 124 may include a digital signal processor (DSP).

The one or more data interface components 126 enable communication between the image capture device 100 and another electronic device, which may be referred to as an external device, such as an external user interface. The other external electronic device may be a remote control, smartphone, tablet computer, laptop computer, desktop computer, or storage device. For example, the data interface components 126 may be considered to form a computing communication link that may be used to receive commands for operating the image capture device 100, transfer image data to the other electronic device, and/or transfer other signals or information to and from the image capture device 100. The data interface components 126 may be configured for wired and/or wireless communication. For example, the data interface components 126 may include an I/O interface 126*a* that provides wired communication for the image capture device 100, which may be a USB interface (e.g., USB type-C), a high-definition multimedia interface (HDMI), a FireWire interface, and/or any other suitable wired communications link (e.g., a digital video interface, a display port interface, such as a Video Electronics Standards Association (VESA) digital display interface, an Ethernet link, a Thunderbolt link, or other wired computing communication link). The data interface components 126 may include a wireless data interface 126*b* that provides wireless communication for the image capture device 100, such as being a Bluetooth interface, a ZigBee interface, a Wi-Fi interface, and/or any other suitable wireless communication link (e.g., infrared, near-field communications (NFC), such as an ISO/IEC 20643 protocol, an Advanced Network Technology interoperability (ANT+)). The data interface components 126 may include a storage interface 126*c*, such as a memory card slot, that is configured to receive and operatively couple to a storage device (e.g., a memory card) for data transfer with the image capture device 100 (e.g., for storing captured images and/or recorded audio).

The image capture device 100 may transmit images, such as panoramic images, or portions thereof, to the external user interface device via the computing communication link, and the external user interface device may store, process, display, or a combination thereof the panoramic images.

The external user interface device may be a computing device, such as a smartphone, a tablet computer, a phablet, a smart watch, a portable computer, personal computing device, and/or another device or combination of devices configured to receive user input, communicate information with the image capture device 100 via the computing communication link, or receive user input and communicate information with the image capture device 100 via the computing communication link.

The external user interface device may display, or otherwise present, content, such as images or video, acquired by the image capture device 100. For example, a display of the external user interface device may be a viewport into the three-dimensional space represented by the panoramic images or video captured or created by the image capture device 100.

The external user interface device may communicate information, such as metadata, to the image capture device 100. For example, the external user interface device may send orientation information of the external user interface device with respect to a defined coordinate system to the image capture device 100, such that the image capture device 100 may determine an orientation of the external user interface device relative to the image capture device 100.

Based on the determined orientation, the image capture device 100 may identify a portion of the panoramic images or video captured by the image capture device 100 for the image capture device 100 to send to the external user interface device for presentation as the viewport. In some implementations, based on the determined orientation, the image capture device 100 may determine the location of the external user interface device and/or the dimensions for viewing of a portion of the panoramic images or video.

The external user interface device may implement or execute one or more applications to manage or control the image capture device 100. For example, the external user interface device may include an application for controlling camera configuration, video acquisition, video display, or any other configurable or controllable aspect of the image capture device 100.

The user interface device, such as via an application, may generate and share, such as via a cloud-based or social media service, one or more images, or short video clips, such as in response to user input. In some implementations, the external user interface device, such as via an application, may remotely control the image capture device 100 such as in response to user input.

The external user interface device, such as via an application, may display unprocessed or minimally processed images or video captured by the image capture device 100 contemporaneously with capturing the images or video by the image capture device 100, such as for shot framing or live preview, and which may be performed in response to user input. In some implementations, the external user interface device, such as via an application, may mark one or more key moments contemporaneously with capturing the images or video by the image capture device 100, such as with a tag or highlight in response to a user input or user gesture.

The external user interface device, such as via an application, may display or otherwise present marks or tags associated with images or video, such as in response to user input. For example, marks may be presented in a camera roll application for location review and/or playback of video highlights.

The external user interface device, such as via an application, may wirelessly control camera software, hardware, or both. For example, the external user interface device may include a web-based graphical interface accessible by a user for selecting a live or previously recorded video stream from the image capture device 100 for display on the external user interface device.

The external user interface device may receive information indicating a user setting, such as an image resolution setting (e.g., 3840 pixels by 2160 pixels), a frame rate setting (e.g., 60 frames per second (fps)), a location setting, and/or a context setting, which may indicate an activity, such as mountain biking, in response to user input, and may communicate the settings, or related information, to the image capture device 100.

The movement sensors 128 may detect the position and movement of the image capture device 100. The movement sensors 128 include one or more of a position sensor 128a, an accelerometer 128b, or a gyroscope 128c. The position sensor 128a, such as a global positioning system (GPS) sensor, is used to determine a position of the image capture device 100. The accelerometer 128b, such as a three-axis accelerometer, measures linear motion (e.g., linear acceleration) of the image capture device 100. The gyroscope 128c, such as a three-axis gyroscope, measures rotational motion (e.g., rate of rotation) of the image capture device 100.

The power components 130 may receive, store, and/or provide power for operating the image capture device 100. The power components 130 may include a battery interface 130a and a battery 130b. The battery interface 130a operatively couples to the battery 130b, for example, with conductive contacts to transfer power from the battery 130b to the other electronic components of the image capture device 100. The power components 130 may also include the I/O interface 126a, which may receive power from an external source, such as a wall plug or external battery, for operating the image capture device 100 and/or charging the battery 130b of the image capture device 100. For example, the I/O interface 126a may function to transfer both data and power.

The user interface components 132 allow the user to interact with the image capture device 100, for example, providing outputs to the user and receiving inputs from the user. The user interface components 132 may include one or more visual output components 134 that visually communicate information and/or present captured images to the user. The visual output components 134 may include one or more lights 134a and/or one or more displays 134b. One or more of the displays 134b may be configured as a touch screen that receives inputs from the user. The user interface components 132 may also include one or more speakers 136, which function as audio output components that audibly communicate information and/or present recorded audio to the user. The user interface components 132 may also include one or more physical input interfaces 138 that are physically manipulated by the user to provide input to the image capture device 100. The physical input interfaces 138 may, for example, be configured as buttons or switches. The user interface components 132, as indicated in dotted lines, may also be considered to include the one or more microphones 122b, which may function to receive audio inputs from the user, such as voice commands.

Referring first to FIGS. 1B and 1C, the image capture device 100 includes the body 140, one or more lenses 142 (e.g., one as shown), and one or more doors 144 (e.g., one as shown).

The body 140 of the image capture device 100 includes (e.g., forms) the exterior surfaces of the image capture device 100 and houses and protects internal electronic components. In the present example, the exterior includes six sides (i.e., a front side 140a, a left side 140b, a right side 140c, a rear side 140d, a top side 140e, and a bottom side 140f) that form a rectangular cuboid. Various sides of the body 140 may include and/or be formed by various other components, such as the lens 142 and the displays 134b (as discussed below). In other embodiments, the exterior may have a different shape. Components forming the body 140 of the image capture device 100 may be made of one or more rigid materials such as plastic, aluminum, steel, or fiberglass.

As illustrated, the lens 142 may be arranged on the front side 140a of the body 140. The lens 142, as shown, allows light to pass therethrough to the image sensor 122a that is contained in the body 140. The lens 142 is a transparent structure that protects internal components of the image capture device 100, such as the image sensor 122a and an optical element (e.g., refractive lens).

The image capture device 100 may include one or more of the microphones 122b, which are configured to receive and record audio signals in conjunction with recording video. The microphones 122b may also detect sound that includes voice commands from the user for operating the image capture device 100. The image capture device 100 may also include another microphone (not shown) integrated into the body 140. The front surface of the image capture device 100 may include two drainage ports as part of a drainage channel 143.

The image capture device 100 may include the I/O interface 126a (e.g., hidden as indicated using dotted lines), such as a universal serial bus (USB) type-C socket or other standardized or proprietary interface. As best shown in FIG. 1B, the I/O interface 126a can be covered by the door 144 of the image capture device 100. The door 144 is hingedly coupled to the body 140 of the image capture device 100 and can be secured to the body, for example, using a latch 144a that releasably engages the body 140 generally opposite the hinge. The door 144 may, in addition to covering the I/O interface 126a, cover other types of electronic interfaces (not shown) of the image capture device 100, such as the storage interface 126c that receives a storage device (e.g., a memory card) and/or the battery interface 130a that operatively couples to the battery 130b. The door 144 may seal with the body 140, for example, providing a watertight seal that prevents water and other debris from reaching the I/O interface 126a and the other electronic interfaces. The door 144 may also be removable from the body 140.

As referenced above, the image capture device 100 may include one or more visual output components 134, which may include one or more lights 134a (e.g., light-emitting diodes or LEDs) and displays 134b (e.g., liquid crystal display screens or LCDs). The visual output components 134 communicate various information to the user about the image capture device 100. The lights 134a may be illuminated in various patterns and/or colors, for example, to indicate that the image capture device 100 is currently recording. The one or more displays 134b may display images and information, such as image capture information (e.g., resolution, frames-per-second), image capture mode (e.g., still frame or video), or status information of the image capture device 100 (e.g., recording time or battery life remaining). As shown, the displays 134b may be arranged on each of the front side 140a (e.g., a front display screen 134b") and the back side 140d (e.g., a rear display screen 134b') of the body 140 of the image capture device 100.

As referenced above, one or more of the displays 134b may be configured as an interactive display that allows for interaction with the image capture device 100 while simultaneously displaying information on a surface of the image capture device 100. For example, the rear display screen 134b' on the rear side 140d of the body 140 may be a touch screen that detects user touch (e.g., capacitively) for receiving user inputs for controlling various operations of the image capture device 100.

The image capture device 100 may also include the physical input interfaces 138, such as buttons or switches configured to allow a user to control electronic operations the image capture device 100. The physical input interfaces 138 may allow a user to turn the image capture device 100 on, select between different modes of operation, and/or to instruct the device to capture images (e.g., still images or video). For example, as shown in FIG. 1B, one of the physical input interfaces 138 is a button positioned on the top side 140e of the body 140 and is configured as a shutter button that, when pressed by the user, causes the image capture device 100 to capture one or more images. As another example, as shown in FIG. 1C, one of the physical input interfaces 138 is a button that is positioned on the left side 140b of the image capture device 100 and is configured as a mode button that, when pressed by the user, causes the image capture device 100 to change between modes, such as between modes for capturing still images, capturing video, or playback of still images or video. The image capture device 100 may further include other physical input interfaces, such as other buttons, switches, hinges, or latches configure to allow the user to operate various mechanical features of the image capture device 100, such as doors or other access panels.

Figures 1F, 1G:
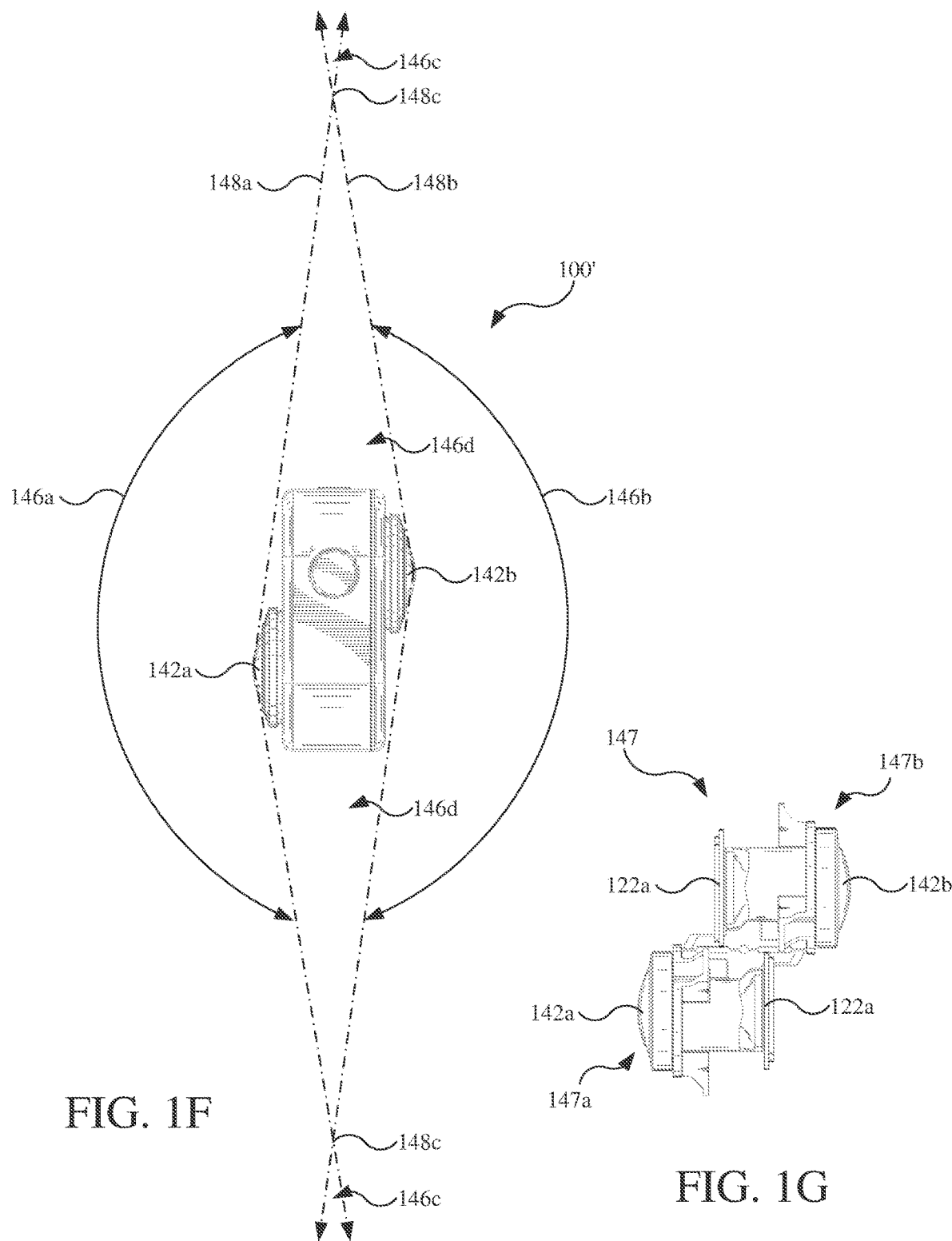
FIG. 1F is a top view of the image capture device of FIG. 1D.
FIG. 1G is a top view of an integrated sensor-lens assembly (ISLA) of the image capture device of FIG. 1D.

Referring to FIGS. 1D-1G, the image capture device 100' is a multi-lens image capture device having multiple of the lenses 142 associated with each of the multiple image sensors 122a, as referenced above. More particularly, the image capture device 100' is a dual-lens image capture device of which the lenses 142 are disposed (e.g., coupled to) opposite sides of the body 140 and may face opposite directions. The lenses 142 include a front lens 142a on the front side 140a and a rear lens 142b on the rear side 140d of the body 140. The front lens 142a is coupled to and directs light onto one of the two image sensors 122a (referred to herein as the front image sensor 122a; see FIG. 1G), and the rear lens 142b is coupled to and directs light onto the of the two image sensors 122a (referred to herein as the rear image sensor 122a; see FIG. 1G). As shown in FIG. 1G, each assembly of the lens 142 and the image sensor 122a may be referred to as an integrated sensor-lens assembly ("ISLA"), such as a front ISLA 147a and a rear ISLA 147b that may be coupled to each other in fixed alignment to form a dual-ISLA assembly 147. The image capture device 100' also includes similar of the electronic components 120 and various of the physical components (e.g., the user interface components 132, the body 140, and subcomponents or features thereof). For ease of reference, like components are generally represented by the same reference numerals for the image capture device 100' as with the image capture device 100.

The front lens 142a and the rear lens 142b may be arranged laterally offset from each other (e.g., having optical axes that are parallel and spaced apart) and/or arranged off-center from a central axis of the image capture device 100'. As compared to other multi-lens image capture devices with coaxial optical axes (e.g., having back-to-back lenses), the offset arrangement of the front lens 142a and the rear lens 142b may provide the image capture device 100' with a reduced thickness (e.g., measured between outer surfaces the lenses and parallel with the optical axes thereof) and/or blind regions (discussed below) of reduced size. For example, the overall thickness of the image capture device 100' may be closer to an axial length of one ISLA compared to the length of two ISLAs in a back-to-back configuration.

Referring to FIG. 1F, the front lens 142a provides a front field of view 146a from which the front image sensor 122a captures images, and the rear lens 142b provides a rear field of view 146b the rear image sensors 122a captures images. The front field of view 146a is defined outward a front boundary 148a, and the rear field of view if defined outward of a rear boundary 148b.

As shown, the front field of view 146a and the rear field of view 146b overlap each other horizontally on left and right sides of the image capture device 100' (as shown). The front field of view 146a and the rear field of view 146b face opposite directions and are greater than 180 degrees horizontal (e.g., approximately 200 degrees as shown). The front field of view 146a and the rear field of view may also overlap each other vertically above and/or below the image capture device 100'. For example, the front field of view 146a and the rear field of view 146b may each be hyper-hemispherical. Thus, the front and rear image sensors 122a may capture hyper-hemispherical image planes from light entering each of the front lens 142a and the rear lens 142b.

The front boundary 148a and the rear boundary 148b intersect at stitch points 148c, which are illustrated as points in FIG. 1F but should be understood as lines extending above and below the illustrated points. The front field of view 146a and the rear field of view 146b are considered to overlap in overlapping regions 146c that are both outward of the stitch points 148c and outward of the front boundary 148a and the rear boundary 148b. Images captured from the front lens 142a and the rear lens 142b will both include content from the overlapping regions 146c. Blind regions 146d are those regions that are both inward of the stitch points 148c and behind the front boundary 148a and the rear boundary 148b. Images captured from the front lens 142a and the rear lens 142b will both not include content from the blind regions 146d.

Images captured contemporaneously with the front and rear image sensors 122a may be combined to generate a combined image. Combining the respective images may include correlating the overlapping regions captured by the front and rear image sensors 122a, aligning content of the images captured from the front field of view 146a and the rear field of view 146b, and stitching the images together to form the combined image. The combined image may, depending on the fields of view, be a spherical, 360 degree, or panoramic image, any of which may be an equirectangular planar image. Generating the combined image may include three-dimensional, or spatiotemporal, noise reduction (3DNR). In some implementations, pixels along the stitch boundary may be matched accurately to minimize boundary discontinuities.

Changes in alignment of the front lens 142a and the rear lens 142b, the front and rear image sensors 122a, and/or the front ISLA 147a and the rear ISLA 147b, such as the relative position and/or orientation therebetween, may change the relative positions, orientations, and/or sizes of the front field of view 146a and the rear field of view 146b, the stitch points 148c, and/or the blind regions 146d. The image capture device 100' may maintain information regarding alignment of the front lens 142a and the rear lens 142b, the front and rear images sensors 122a, and/or the front ISLA 147a and the rear ISLA 147b. Such alignment information may be determined during an alignment process and may subsequently be used to more accurately determine the front field of view 146a, the rear field of view 146b, the overlapping regions 146c, the blind regions 146d, and the stitch points 148c, which may improve the accuracy and/or efficiency of generating the combined images. Incomplete or inaccurate alignment information may decrease the accuracy and efficiency in generating the combined images.

Figure 2A:
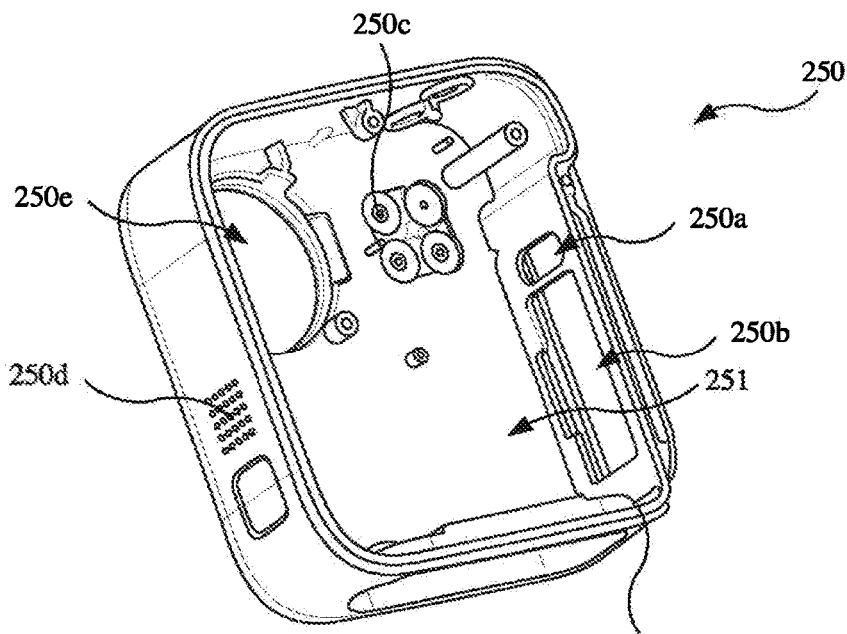
FIG. 2A is a lower, rear, left perspective view of a front housing of the image capture device of FIG. 1D.
Figure 2B:
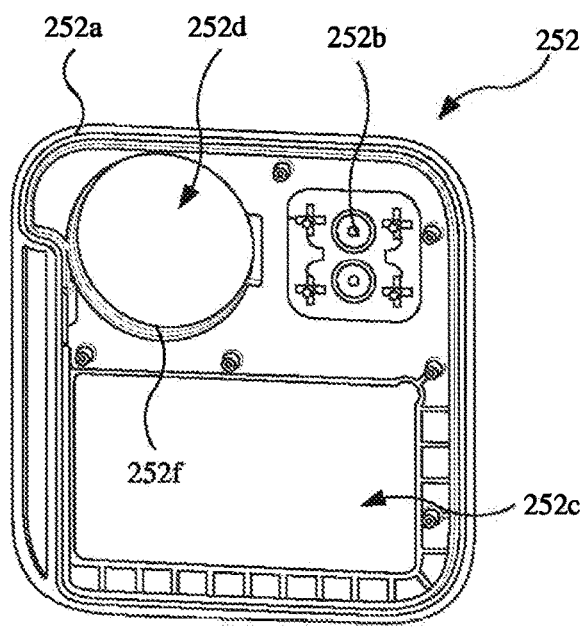
FIG. 2B is an upper, front, left perspective view of a rear housing of the image capture device of FIG. 1D.

Referring to FIGS. 2A and 2B, the body 140 of the image capture device 100' is generally formed by a housing 249 that includes a front housing 250 and rear housing 252 that are coupled to each other and define an internal compartment 251. More particularly, a rear end of the front housing 250 and a forward end of the rear housing 252 may be coupled to each other with an adhesive (e.g., an epoxy) that also forms a seal therebetween. The body 140 may be considered to further include the rear display screen 134b', as referenced above, or others of the electronic components 120 that form an outer surface of the body 140 and/or seal apertures of the front housing 250 and the rear housing 252. The body 140 may also be considered to include the door 144, which forms an outer surface of the body 140 and may engage other portions of the body 140 to seal one or more apertures thereof. The front housing 250 and the rear housing 252 may also be referred to as housing components. Furthermore, while the terms "front" and "rear" are used to describe and differentiate between different elements, other terms may be used to describe and/or differentiate between various terms including, but not limited to, numerical identifiers. For example, the front housing 250 and the rear housing 252 may instead be referred to as a "first housing component" and a "second housing components," respectively, or vice versa.

The front housing 250 is the primary structure at the front of the body 140 and generally defines the overall shape of the image capture device 100' extending from the front side 140a to proximate the rear side 140d and around the top side 140e, the right side 140c, the bottom side 140f, and the left side 140b of the body 140. For example, the front housing 250 may be considered to have front, top, left side, right side, and bottom walls that correspond to and form the front side 140a, the left side 140b, the right side 140c, the top side 140e, and the bottom side 140f of the body 140. The front housing 250 may also be referred to as a bucket, since the front housing 250 defines the vast majority of the volume of the internal cavity and receives therein various other components (e.g., the electronic components 120 described previously. The rear housing 252 may be considered to include a rear wall that corresponds to and forms the rear side 140d of the body 140.

The front housing 250 includes various apertures that are sealed by other components of the image capture device 100'. More particularly, the front housing 250 defines an I/O opening 250a, a battery opening 250b, microphone openings 250c, speaker openings 250d, a lens opening 250e, and various other openings (e.g., by which an internal chassis and an external mount are coupled to the front housing 250).

Figure 3A:
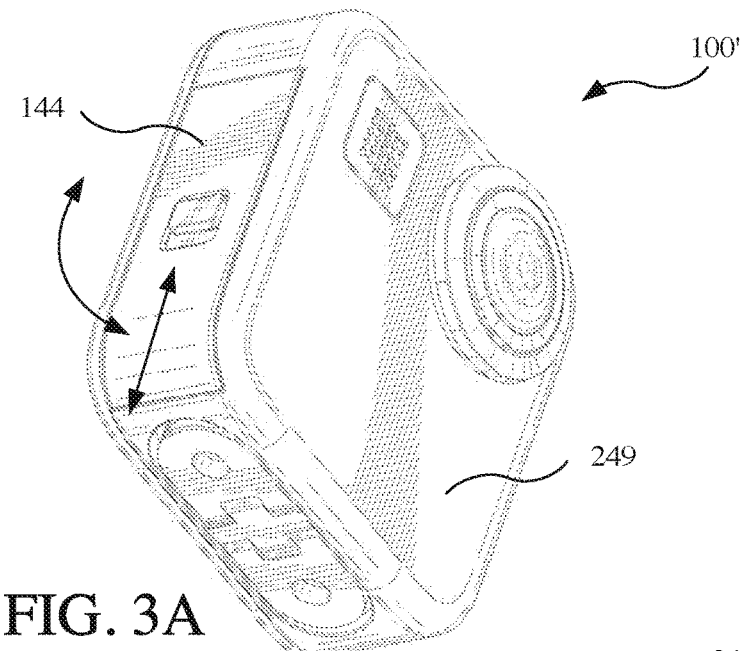
FIG. 3A is a lower, front, left perspective view of the image capture device of FIG. 1D.
Figure 3B:
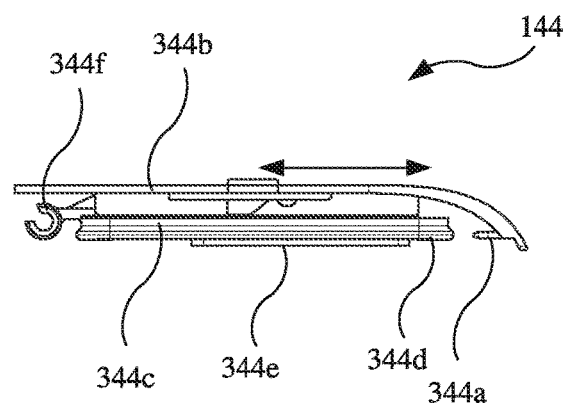
FIG. 3B is a rear view of a door of the image capture device of FIG. 1D.

Referring to FIGS. 3A and 3B, the door 144 is movable relative to the body 140 to provide access to the I/O interface 126a, the storage interface 126c, and the battery 130b, or a subcombination thereof (e.g., one or more thereof). For example, as shown, the door 144 may slide and then rotate to be opened. The door 144 may cover and seal the I/O opening 250a, which provides access to the I/O interface 126a, and the battery opening 250b, through which the battery 130b is received into the internal compartment 251.

The door 144 is provided on one side of the body 140, such as the left side 140b (as shown). One end of the door 144 (e.g., an upper end) is hingedly coupled to the body 140, for example, to the front housing 250. Another end of the door 144 (e.g., a lower end) is releasably coupled to the body 140, for example, with a latch 344a. The latch 344a, as shown in FIG. 3B, may be coupled to an outer portion 344b of the door 144 (e.g., being integrally formed therewith), rotates with the door 144, and releasably engages the body 140 and, in particular, the front housing 250. The door 144, including the latch 344a, spans a majority of the height of the body 140 (e.g., 50%, 75% or more of the height), for example, from the bottom side 140f. The door 144 may also span a majority of a thickness of the body 140 (e.g., 50% or more of the longitudinal dimension of the body 140 between the front side 140a and the rear side 140d).

The door 144 generally includes an outer portion 344b and an inner portion 344c. The inner portion 344c is hingedly coupled at an upper end thereof to the body 140 (e.g., to the front housing 250). The outer portion 344b forms an exterior surface of the door 144 and, thereby, an exterior surface of the body 140 of the image capture device 100'. The outer portion 344b and the latch 344a coupled thereto slide relative to the inner portion 344c for the latch 344a to engage and disengage the body 140 to prevent and permit, respectively, the door 144 to rotate relative to the body 140 to open the door 144.

Opening the door 144 provides access to various interfaces of the image capture device 100', which are located within the internal compartment. For example, the door 144 may provide access to a battery receptacle and the battery interface 130a, the I/O interface 126a, and/or the storage interface 126c (not shown). The body 140 defines the battery receptacle within the internal compartment 251, which extends from the battery opening 250a inward into the internal compartment 251. The battery receptacle is configured to receive the battery 130b therein and includes the battery interface 130a (e.g., conductive contacts; not shown) at an inner end thereof for operatively connecting to the battery 130b for power transfer therebetween. The I/O interface 126a (e.g., a USB type-C receptacle) and the storage interface 126c (e.g., a memory card slot; not shown or labeled) are provided proximate the opening formed by the door 144.

The door 144 forms a seal with the body 140 and, more particularly, the inner portion 344c seals with the front housing 250 to seal the I/O opening 250a and the battery opening 250b. For example, as shown, the inner portion 344c includes a seal 344d on a periphery thereof, which engages the front housing 250 outward of the I/O opening 250a and the battery opening 250b. For example, the front housing 250 includes surfaces that surround and extend outward from the surface defining the I/O opening 250a and the battery opening 250b, which are engaged by and radially compress the seal 344d to form a seal therebetween.

The door 144 may further be configured to engage the battery 130b, for example, to ensure engagement between the battery 130b and the battery interface 130a. In one example, the door 144 includes a battery pad 344e that is arranged radially inward of the seal 344d and is formed of an elastic, compressible material (e.g., foam or rubber) that presses against the battery 130b.

The door 144 may also be removable from the body 140. For example, the body 140 and, more particularly, the front housing 250 may include a hinge pin (not shown) fixedly coupled to an upper end thereof. The upper end of the door 144 includes one or more clips 344f (e.g., C-shaped clips) that removably attach to the hinge pin to form the hinged coupling therebetween.

The front housing 250 may also include one or more microphone openings 250c and/or one or more speaker openings 250d, which allow sound to be transmitted from the environment to the microphones 122b and from the speaker 132a to the environment, respectively. One or more of the microphone openings 250c may, for example, be located on the front side 140a of the front housing 250. The microphone openings 250c may be sealed by the microphone 122b (e.g., a structure thereof) being continuously adhered to an interior surface of the front housing 250 that surrounds and defines the microphone opening 250c, such that the internal compartment 251 is sealed.

Figure 4:
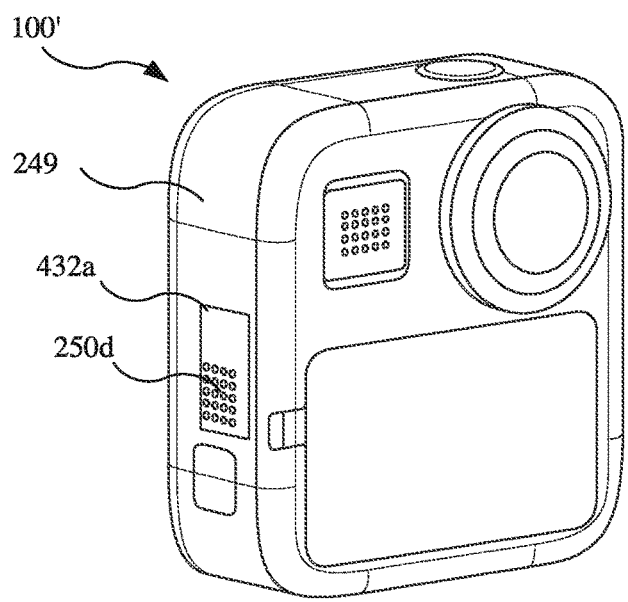
FIG. 4 is an upper, rear, right perspective view of the image capture device of FIG. 1D with various outer components depicted as translucent.

Referring to FIG. 4, the one or more speaker openings 250d may, for example, be located on a side of the body 140 image capture device 100' opposite the door 144 (e.g., on the left side 140b). The speaker opening 250d may be sealed by the speaker 132a, such as a seal 432a thereof, being continuously adhered to an interior surface of the front housing 250 that surrounds and defines the speaker openings 250d.

The front housing 250 also includes the lens opening 250e, which may also be referred to as the front lens opening. The lens opening 250e is sealed with the front ISLA 147a with a seal 550f (e.g., an O-ring) arranged therebetween, as discussed below.

Referring to FIG. 2A and FIGS. 5A-5E, each of the front ISLA 147a and the rear ISLA 147b includes the lens 142 (e.g., the front lens 142a or the rear lens 142b), the image sensor 122a (e.g., the front or rear image sensors 122a), a trim ring 547c, and a lens mount 547d. The lens mount 547d may be further considered to include a lens barrel (shown; not labeled) positioned therein. The lens 142 and the image sensor 122a are coupled to each other by the lens mount 547d in fixed alignment. For example, the image sensor 122a and the lens 142 may be aligned and affixed using a precision alignment process, such as active alignment, by which the lens 142 and the image sensor 122a are precisely aligned and affixed (e.g., adhered) in a precise spatial relation to each other, which may be referred to as precisely fixed alignment. The lens 142 is sealed to the lens mount 547d, for example, being adhered continuously around a rear surface thereof to the lens mount barrel that is in turn continuously adhered therearound to an outer flange 547e of the lens mount 547d, which may have a planar surface. The trim ring 547c is positioned around the lens 142 and is coupled to the lens barrel and/or the lens mount 547d (e.g., being adhered thereto continuously around the lens 142). The trim ring 547c may be sealed, for example, to the lens barrel.

The lens opening 250e is defined by a tubular flange 550e of the front housing 250, which, as shown, may protrude forward from a primary surface of the front side 140a of the body 140. The front ISLA 147a extends at least partly through the tubular flange 550e with the seal 550f arranged radially between the inner peripheral surface of the tubular flange 550e and an outer peripheral surface of the trim ring 547c, thereby sealing the front ISLA 147a to the front housing 250.

A lens bezel 550i is coupled to the front side of the front housing 250, such as to a tubular flange 550e that defines the lens opening 250e. The lens bezel 550i is spaced apart from the front surface of the front housing 250 to define a circumferential channel 550j therebetween, which extends generally around the lens opening 250e. As discussed below, the circumferential channel 550j may facilitate coupling various protective covers and/or filters over the front lens 142a. The lens bezel 550i may be formed of a glass-filled polycarbonate material.

The front housing 250 is a singular structure. For example, the front housing 250 may be an injection molded thermoplastic (e.g., polycarbonate) that is overmolded with a thermoplastic elastomer (TPE). For example, the thermoplastic elastomer may form outer surfaces of the image capture device 100', such as the physical input interfaces 138 (e.g., buttons).

Coupling of the front ISLA 147a and the rear ISLA 147b to the front housing 250 is discussed in further detail below.

Figure 2C:
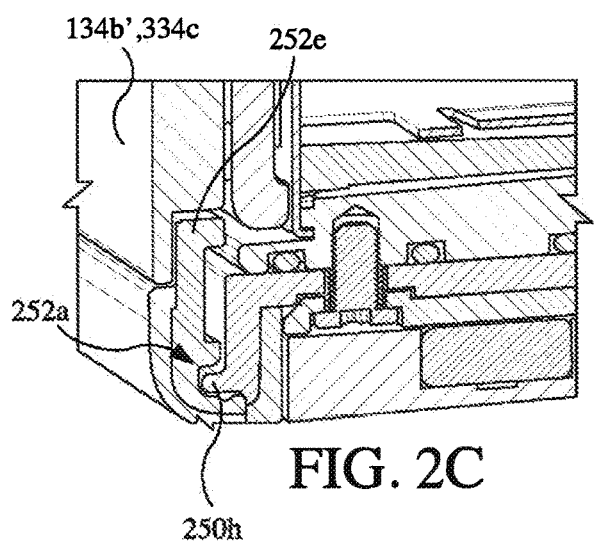
FIG. 2C is a partial cross-sectional view of the image capture device of FIG. 1D.

Referring again to FIGS. 2A-2C and as referenced above, the rear housing 252 is coupled to the rear end of the front housing 250 to form a seal therebetween. The rear housing 252 includes an adhesive channel 252a that extends around a forward periphery of the rear housing 252 and receives an adhesive (e.g., epoxy; not shown) and the rear end (e.g., a rear flange 250h) of the front housing 250 therein.

The rear housing 252 includes various apertures that are sealed by other components of the image capture device 100'. The rear housing 252 may include one or more microphone openings 252b, a display opening 252c, and a rear lens opening 252d.

The one or more microphone opening 252b may be located on the rear side 140d of the rear housing 252. The microphone openings 252b may be sealed as described above for the microphone opening 250c of the front housing 250, for example, with the microphone 122b (e.g., a structure thereof) being continuously adhered to an interior surface of the rear housing 252 that surrounds and defines the microphone openings 252b such that the internal compartment 251 is sealed.

The display opening 252c is sealed by one of the displays 134b and, in particular, a rear display screen 134b'. The rear housing 252 forms a display bezel 252e that defines the display opening 252c and is configured as a flange that protrudes inward from the top side 140e, the right side 140c, the bottom side 140f, and the left side 140b of the body 140 (e.g., as formed by the rear housing 252). The display bezel 252e includes an outer portion and an inner portion, which define a recess in which is received a display cover 134c of the rear display screen 134b'. The outer portion of the display bezel 252e forms an exterior surface of the body 140, and the inner portion is inset relative to the exterior surface to form the recess. The outer portion may, for example, be formed of a thermoplastic elastomer, while the inner portion is formed of polycarbonate. The display cover 134c of the rear display screen 134b' is a transparent protective layer of suitable material (e.g., glass or polycarbonate) that forms an exterior surface of the rear display screen 134b'. An outer periphery of an inward-facing surface of the display cover 134c is continuously coupled (e.g., adhered) to the exterior-facing surface of the inner portion of the display bezel 252e, thereby forming a seal between the rear housing 252 and the rear display screen 134b'. The exterior surface of the display bezel 252e and the exterior surface of the display cover 134b' cooperatively form the exterior surface of the rear side 140d (e.g., a rear surface) of the body 140 of the image capture device 100'.

The rear housing 252 also includes the rear lens opening 252d, which may be referred to as the rear lens opening. The rear lens opening 252d is sealed with the rear ISLA 147b generally as described above with respect to the lens opening 250e of the front housing 250 being sealed with the front ISLA 147a. The rear lens opening 252d of the rear housing 252 may be configured generally as described above for the lens opening 250e of the front housing 250. The rear lens opening 252d is defined by a tubular flange 252f that, as shown, may protrude rearward from a primary surface of the rear side 140d of the body 140 (e.g., as formed by the rear housing 252). The rear ISLA 147b extends at least partly through the tubular flange 252f with a seal (e.g., an O-ring; see seal 552g in FIG. 5D) arranged radially between the inner peripheral surface of the tubular flange 252f and the outer peripheral surface of the trim ring 547c of the rear ISLA 147b, thereby sealing the rear ISLA 147b to the rear housing 252.

Figure 10A:
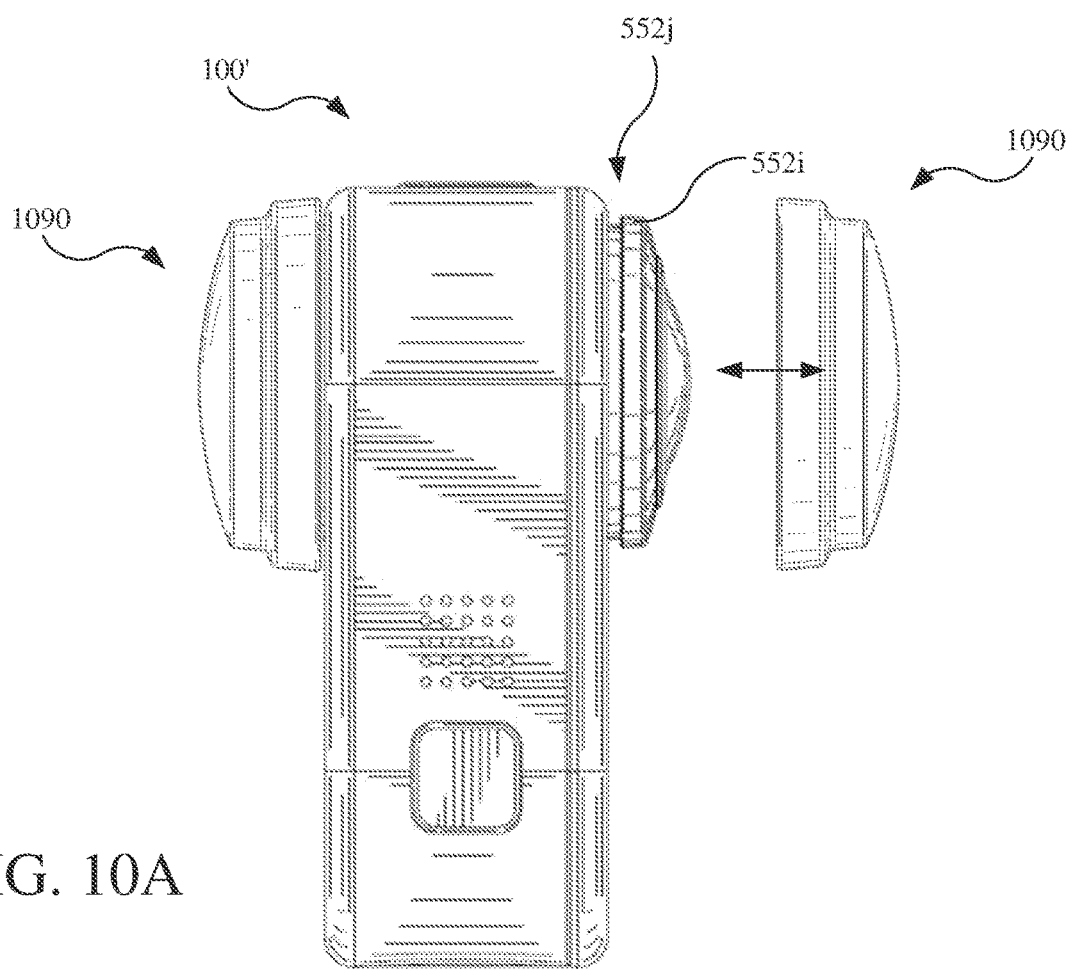
FIG. 10A is a right view of the image capture device of FIG. 1D with lens covers in both connected and disconnected states.

Another lens bezel 552*i* (see FIG. 10A) is coupled to the rear side thereof of the rear housing 252, such as to the tubular flange 252*f* that defines the rear lens opening 252*d*. As with the lens bezel 552*i* on the front housing 250, the lens bezel 552*i* is spaced apart from the rear surface of the rear housing 252 to define a circumferential channel 552*j* therebetween and extending generally around the rear lens opening 252*d*. As with the circumferential channel 550*j*, the circumferential channel 552*j* may facilitate coupling various protective covers and/or filters over the rear lens 142*b*.

The rear housing 252 is a singular structure. For example, as with the front housing 250, the rear housing 252 may be an injection molded thermoplastic (e.g., polycarbonate) that is overmolded with a thermoplastic elastomer (TPE). For example, the thermoplastic elastomer may form outer surfaces, such as the physical input interfaces 138 (e.g., buttons).

Referring to FIGS. 5B, 5C, and 6A-6C, the front ISLA 147*a* and the rear ISLA 147*b* are coupled to the housing 249. For example, as discussed in further detail below, the front ISLA 147*a* may be positively statically connected to the housing 249 (e.g., the front housing 250 thereof), while the rear ISLA 147*b* is affixed to the front ISLA 147*a* and, thereby, indirectly coupled to the housing 249 but not positively statically connected to the housing 249.

Figure 5A:
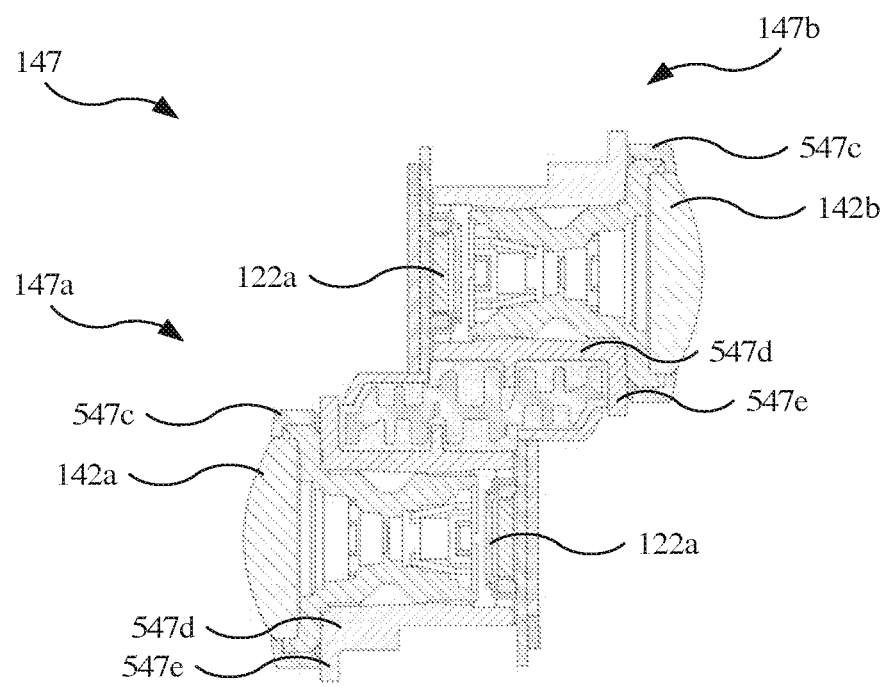
FIG. 5A is a cross-sectional view of the ISLA of FIG. 1G.
Figure 6A:
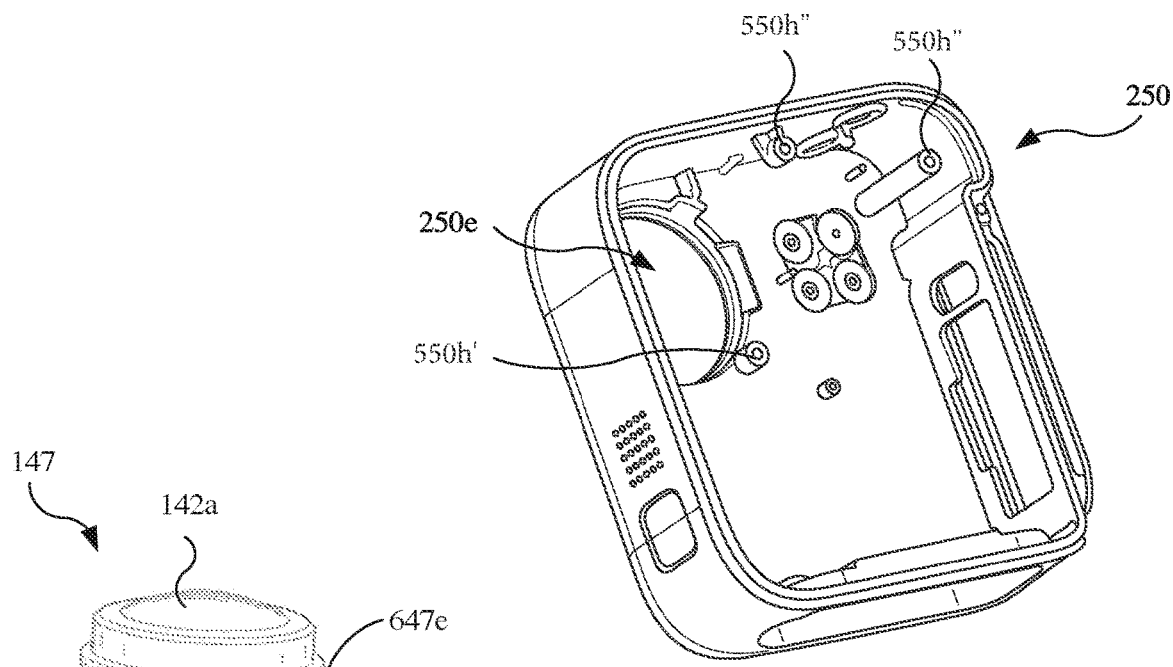
FIG. 6A is a lower, rear, right perspective view of the front housing of FIG. 2A.
Figure 6B:
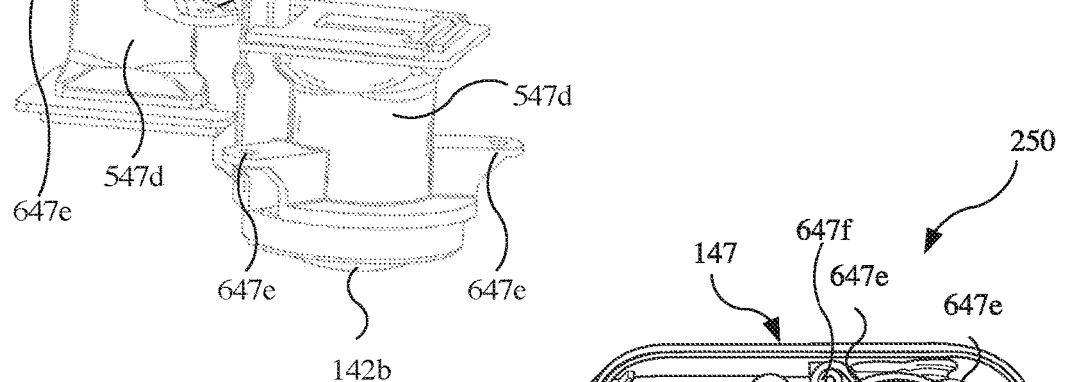
FIG. 6B is an upper, front, left view of the ISLA of FIG. 1G.

As discussed previously with respect to FIG. 1G, and as shown in FIG. 5A and further shown in FIGS. 6A and 6B, the front ISLA 147*a* and the rear ISLA 147*b* are coupled to each other and provided as the dual-ISLA assembly 147. For example, while the lens 142 and the image sensor 122*a* of each of the front ISLA 147*a* and the rear ISLA 147*b* are precisely aligned and affixed to each other (e.g., using an active alignment process), the front ISLA 147*a* and the rear ISLA 147*b* may be aligned and affixed to each other (e.g., using another active alignment process), for example, such that the optical axes thereof are substantially parallel to each other). For example, with the front ISLA 147*a* and the rear ISLA 147*b* being aligned and affixed using a precision alignment process, the front ISLA 147*a* and the rear ISLA 147*b* may be considered to be in precisely fixed alignment.

The dual-ISLA assembly 147 is positioned and mechanically connected to the housing 249, such as to the front housing 250. More particularly, the front housing 250 includes mechanical features that engage corresponding mechanical features of the dual-ISLA assembly 147 to control the position of the dual-ISLA assembly 147 to the front housing in three dimensions, which include a lateral direction that is horizontal and perpendicular to optical axes of the front ISLA 147*a* and the rear ISLA 147*b* (referred to as the X-direction), a vertical direction that is perpendicular to the optical axes of the front ISLA 147*a* and the rear ISLA 147*b* (referred to as the Y-direction), and a longitudinal direction that is horizontal and parallel with the optical axes of the front ISLA 147*a* and the rear ISLA 147*b* (referred to as the Z-direction).

Figure 5B:
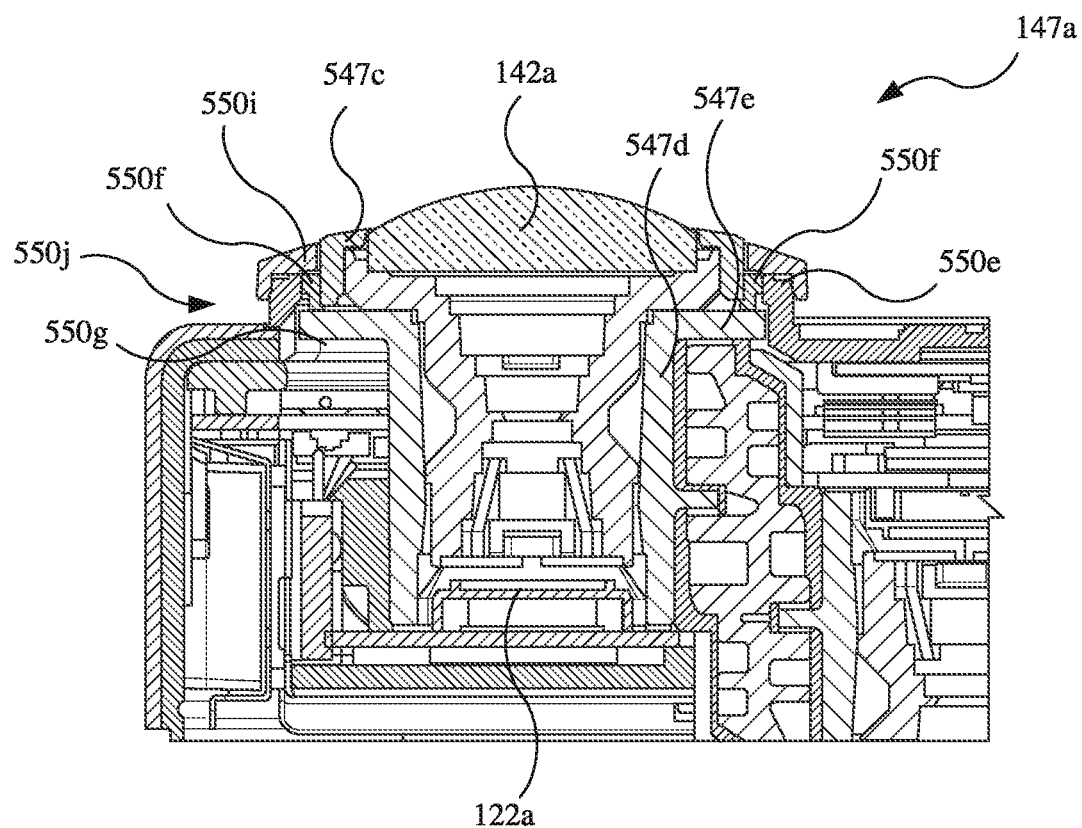
FIG. 5B is a partial cross-sectional view of the image capture device of FIG. 1D.
Figure 5C:
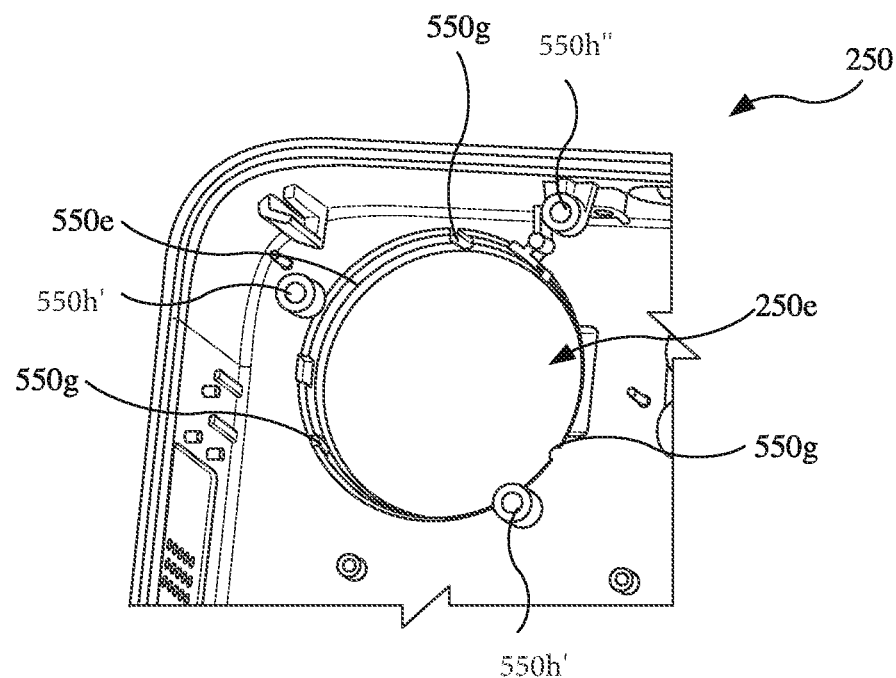
FIG. 5C is a lower, front, right partial perspective view of the rear housing of the FIG. 2B.
Figure 5D:
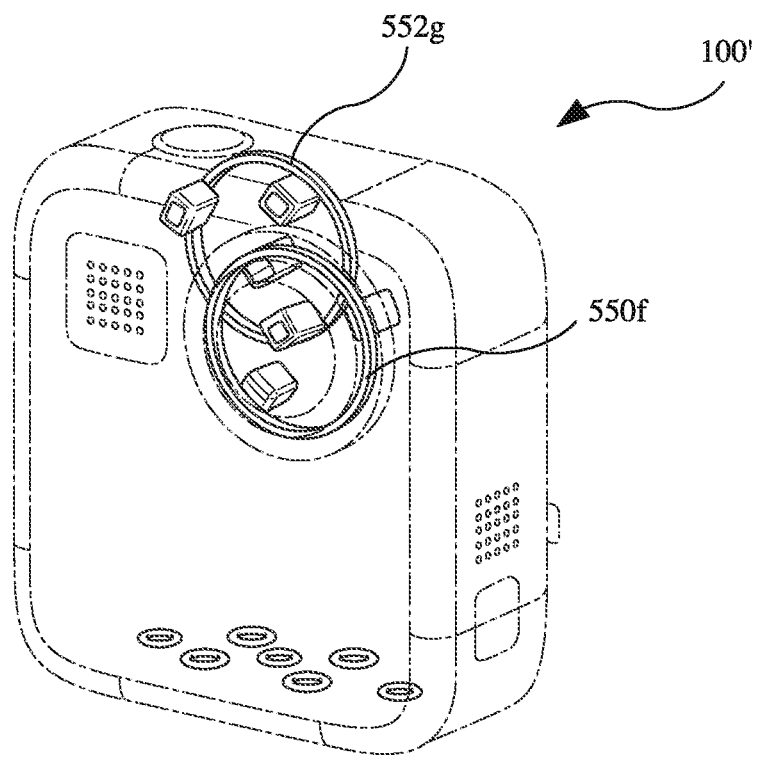
FIG. 5D is an upper, front, right perspective view of the image capture device of FIG. 1D with various outer components depicted as translucent and various internal components omitted.

Referring to FIGS. 5B and 5C, to control the position of the dual-ISLA assembly 147 laterally and vertically (i.e., perpendicular to the optical axes in the X- and Y-directions), the tubular flange 550*e* of the front housing 250 includes three protrusions 550*g* that extend radially inward from the inner peripheral surface of the tubular flange 550*e*. The three protrusions 550*g* engage an outer surface of the front ISLA 147*a*, such as an outer circumferential edge of the outer flange 547*e* of the lens mount 547*d* of the front ISLA 147*a*. Contact between the three protrusions 550*g* and the lens mount 547*d*, which may be referred to as three-point contact, ensures the that dual-ISLA assembly 147 is properly positioned in the lateral and vertical directions (i.e., X- and Y-directions, or perpendicular to the optical axes). The tubular flange 252*f* that defines the rear lens opening 252*d* may not include similar protrusions that might otherwise dictate the position of the rear ISLA 147*b* therein; rather, a small gap may be designed between the tubular flange 252*f* and the rear ISLA 147*b* to account for variability in the relative positions of the front ISLA 147*a* and the rear ISLA 147*b* in the precise fixed alignment of the dual-ISLA assembly.

As shown in FIGS. 5C and 6A-6C, to control the position of the dual-ISLA assembly 147 longitudinally (i.e., in the Z-direction), the front housing 250 includes screw bosses 550*h* (e.g., four as shown; labeled as 550*h'* and 550*h"* in FIGS. 5C and 6A). The screw bosses 550*h* extend rearward from interior surfaces of the front housing 250 to engage forward-facing surfaces of the lens mounts 547*d* of the front ISLA 147*a* and the rear ISLA 147*b*. More particularly, each of the lens mounts 547*d* include protrusions 647*e* (e.g., flanges) that protrude radially outward relative to the optical axis thereof. Forward surfaces of the protrusions 647*e* (i.e., facing in the forward direction of the image capture device 100', or toward the front side 140*a*) engage rearward surfaces of the screw bosses 550*h* to position the dual-ISLA assembly 147 in the longitudinal direction (i.e., the Z-direction). Threaded fasteners 647*f* extend through the protrusions 647*e* and are threadably received by the screw bosses 550*h* to positively statically connect the dual-ISLA assembly 147 to the front housing 250. As shown, the lens mount 547*d* of the front ISLA 147*a* includes three of the protrusions 647*e*, while only two of the protrusions 647*e* thereof are coupled to the screw bosses 550*h*. The lens mount 547*d* of the rear ISLA 147*b* also includes three of the protrusions 647*e*, while two of the protrusions 647*e* thereof are coupled to the screw bosses 550*h*. Those screw bosses 550*h* coupled to the front ISLA 147*a*, which may be referred to as front screw bosses 550*h'*, extend rearward (i.e., toward the rear housing 252) a shorter distance than do the screw bosses 550*h* that are coupled to the rear ISLA 147*b*, which may be referred to as rear screw bosses 550*h"*.

As used herein, the terms "positively static connect" or "positive static connection" refer to components or assemblies that are coupled to each other with and engaged by one or more fastening means (e.g., adhesive or mechanical connectors) that have a primary purpose of attaching components or assemblies to each other and that prevent movement between the component or assemblies. For example, two members may be positively connected to each other with an adhesive therebetween, with a screw extending into the two members, or with a bolt, nut, and two washers whereby the bolt and nut compress the two members between and engaged by the two washers. Two components may be positively statically connected without contacting each other; for example in the bolt scenario, a third member may be arranged between and space the two members. Two components may engage, interface, or transfer force between each other but not be positively statically connected; for example in the bolt scenario, if the third member is not engaged by the bolt, then the third member is not positively statically connected to the first two members on either side thereof; instead, the third member may be considered indirectly coupled to but directly engaging the first two members.

As referenced above, while the dual-ISLA assembly 147 is positively statically connected to the front housing 250 (i.e., with the threaded fasteners 647*f*), the dual-ISLA assembly 147 may be indirectly coupled to the rear housing 252 via the front housing 250, but not positively statically connected to the rear housing 252.

Due to manufacturing variability associated with aligning each of the front ISLA 147a, the rear ISLA 147b, and the dual-ISLA assembly 147, the relative positions of the components of the front ISLA 147a and the rear ISLA 147b may vary between different ones of the dual-ISLA assemblies 147 of different ones of the image capture devices 100' (e.g., between the front lens 142a and the rear lens 142b). If instead the dual-ISLA assembly 147 were positively statically connected to both the front housing 250 and the rear housing 252, such as with the front ISLA 147a and the rear ISLA 147b positively statically connected independently of each other to the front housing 250 and the rear housing 252, respectively, such positive static connections could apply forces between the front ISLA 147a and the rear ISLA 147b that might cause deformation and misalignment therebetween. Advantageously, the dual-ISLA assembly 147 may, as described, engage the rear housing 252 with the seal 552g (e.g., the O-ring), which provides compliance between the rear ISLA 147b and the rear housing 252 to account for the manufacturing variability of the dual-ISLA assembly 147.

Figure 7A:
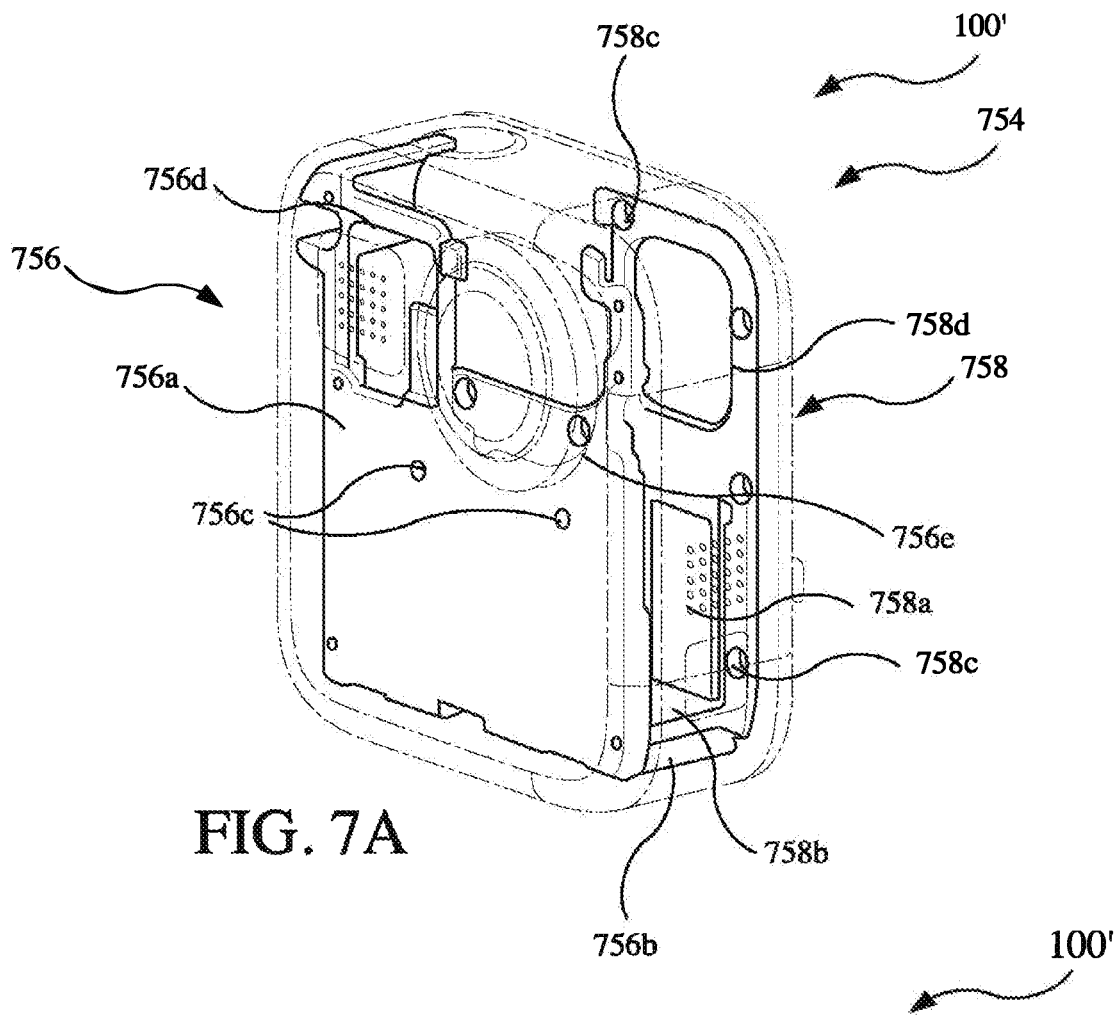
FIG. 7A is an upper, front, right perspective view of the image capture device of FIG. 1D with various outer components depicted as translucent and various internal components omitted.
Figure 7B:
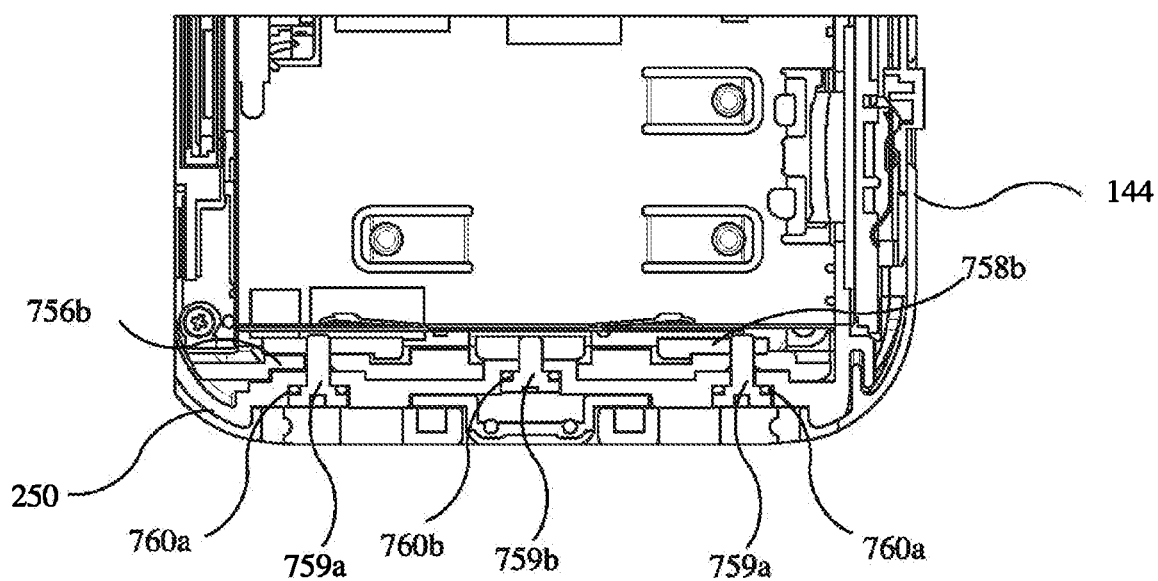
FIG. 7B is a partial cross-sectional view of the image capture device of FIG. 1D.
Figure 7C:
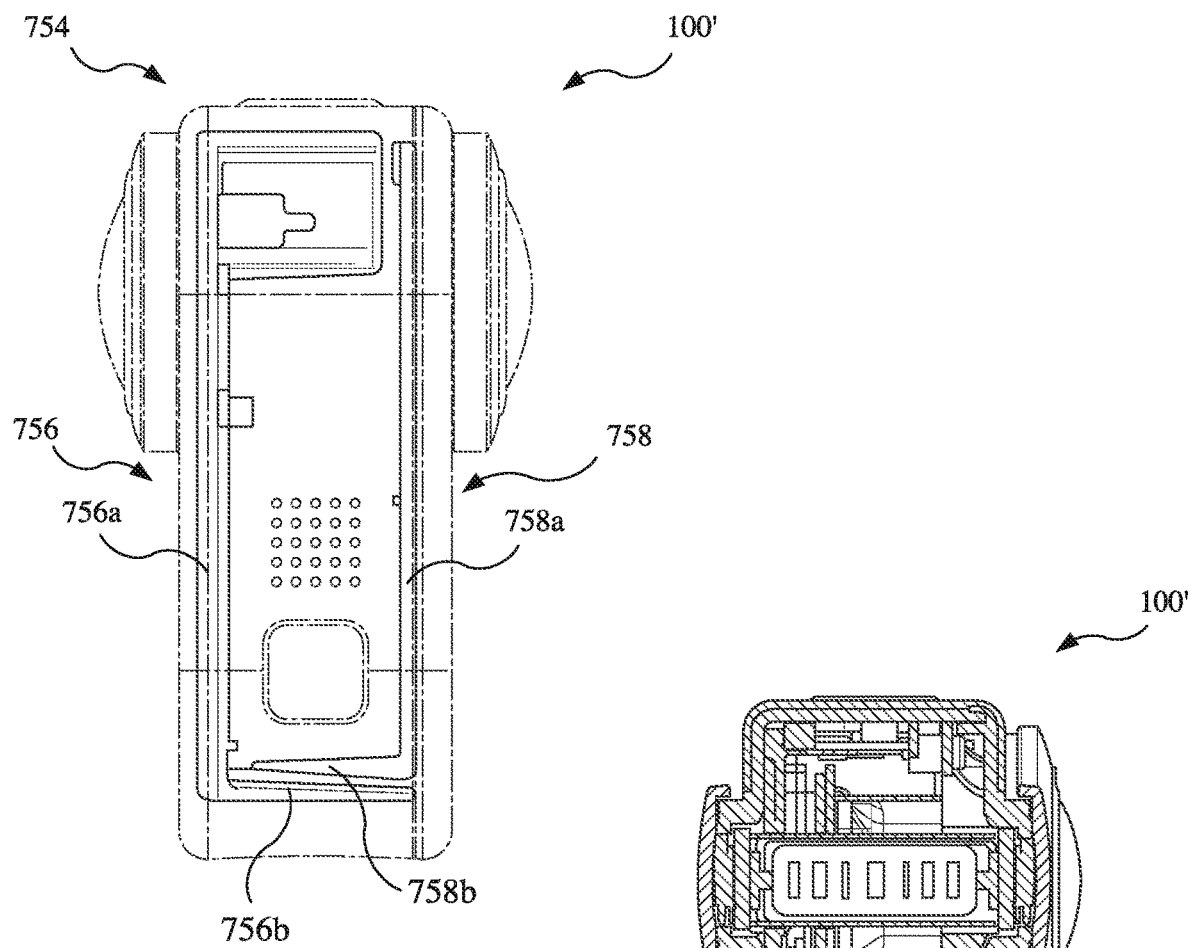
FIG. 7C is a right view of the image capture device of FIG. 1D with various outer components depicted as translucent and various internal components omitted.
Figure 7D:
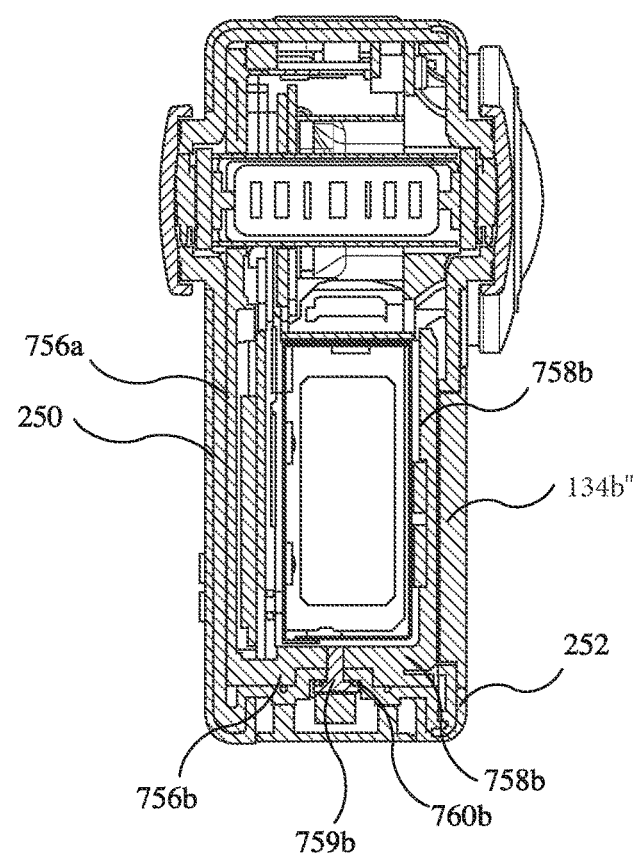
FIG. 7D is a cross-sectional view of the image capture device of FIG. 1D.
Figure 8A:
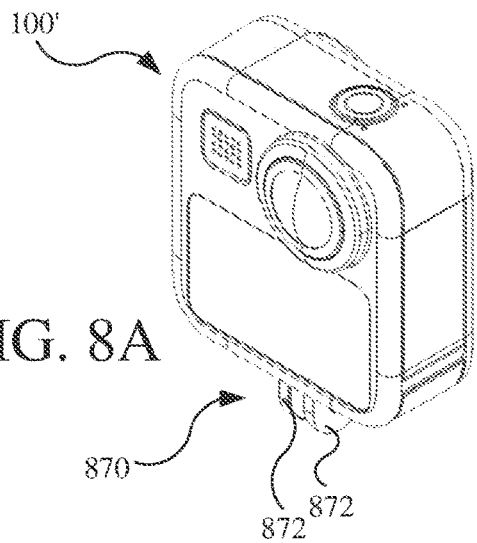
FIGS. 8A-8C are perspective, rear, and right views of the image capture device of FIG. 1D with a mount in a deployed state.
Figure 8D:
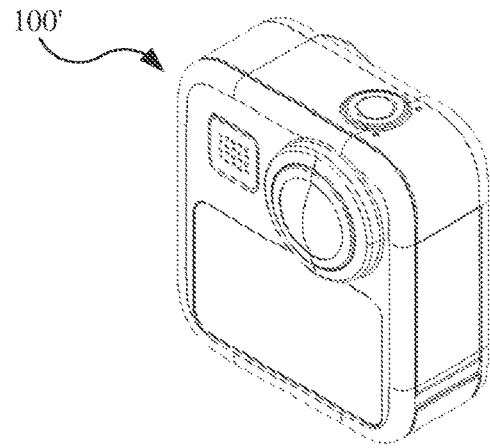
FIGS. 8D-8F are perspective, rear, and right views of the image capture device of FIG. 1D with the mount in a stowed state.
Figure 8B:
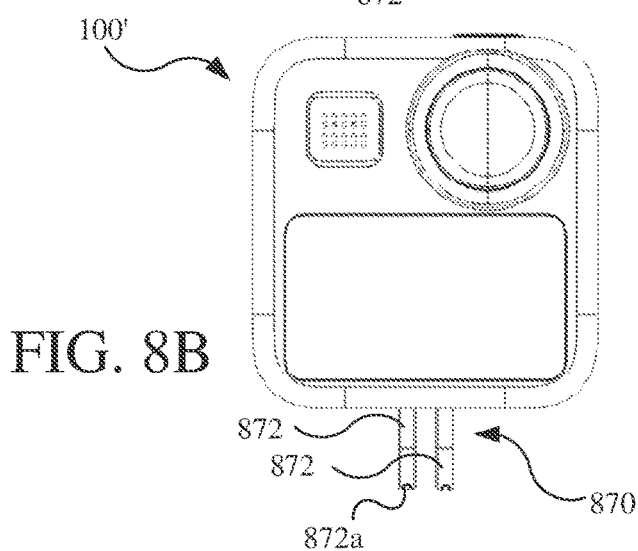
Figure 8E:
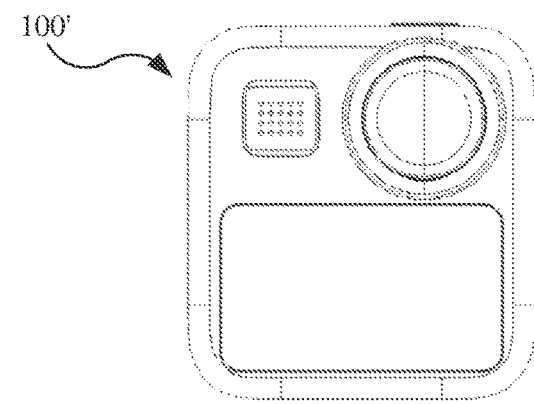
Figure 8C:
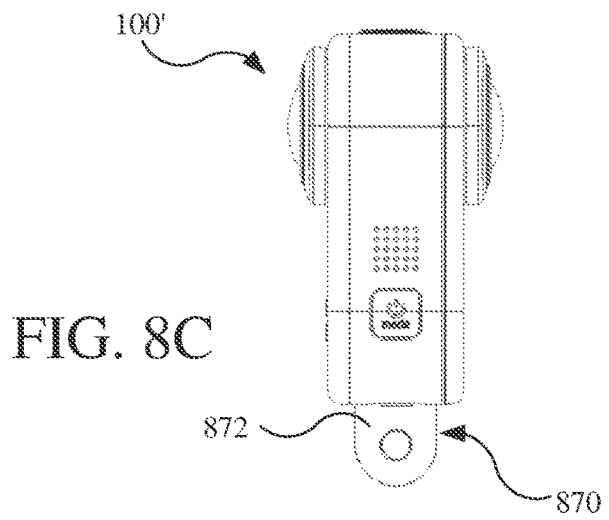
Figure 8F:
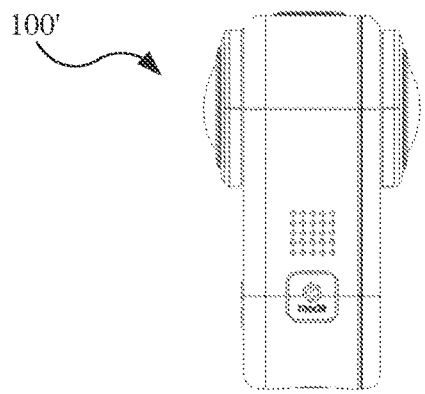

Referring to FIGS. 7A-7D, the image capture device 100' includes a chassis 754, which may also be referred to as a heat sink. The chassis 754 is positioned within the internal compartment 251 of the image capture device 100' and supports several of the electronic components 120 (e.g., the processing apparatus 124) therein and also functions as a heat sink to dissipate heat from the electronic components 120. In FIGS. 7A and 7C, outer surfaces of the image capture device 100' (e.g., the front housing 250, the rear housing 252, the door 144, the front ISLA 147a, and the rear ISLA 147b) are illustrated in a translucent manner and not labeled and internal components are hidden, so as to illustrate the chassis 754 thereunder. FIGS. 7B and 7D are cross-sectional views of the image capture device 100'.

The chassis 754 is generally U-shaped. The chassis 754 extends upward along the front side 140a and the rear side 140d and longitudinally therebetween along the bottom side 140f of the body 140. For example, as shown, the chassis 754 includes a front chassis 756 and a rear chassis 758 that may also be referred to as chassis components (e.g., first and second or front and rear chassis components). The front chassis 756 generally is generally L-shaped and includes a front portion 756a and a bottom portion 756b. The rear chassis 758 is also generally L-shaped includes a rear portion 758a and a bottom portion 758b. The rear portion 758a of the rear chassis 758 is spaced apart from the front portion 756a of the front chassis 756, while the bottom portion 758b of the rear chassis 758 overlaps and engages the bottom portion 756b of the front chassis 756. As a result, the front chassis 756 and the rear chassis 758 cooperatively from the U-shape of the chassis 754. The chassis 754 is more rigid than the housing 249, for example, with the front chassis 756 and the rear chassis 758 being formed of material (e.g., cast aluminum) that is stiffer than material forming the front housing 250 and the rear housing 252 (e.g., polycarbonate and/or thermoplastic elastomer). Each of the front chassis 756 and the rear chassis 758 are discussed in further detail below.

Figure 6C:
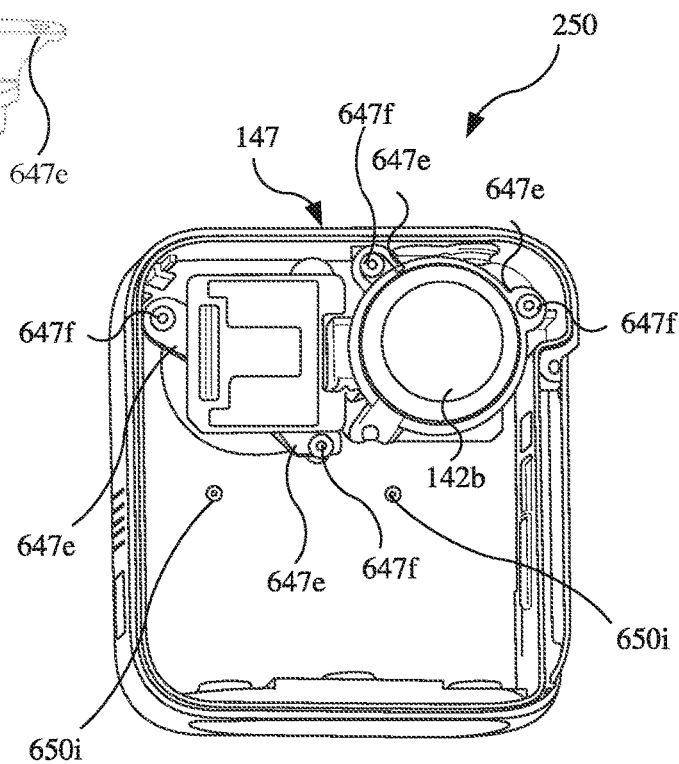
FIG. 6C is a lower, rear, right perspective view of the front housing of FIG. 2A with the ISLA of FIG. 1G coupled thereto.

The front portion 756a of the front chassis 756 is generally planar and extends upward along the front side 140a of the image capture device 100' and may also be referred to as an upright portion. A forward surface of the front chassis 756 is positioned adjacent, and may further engage, a rearward (i.e., inner) surface of the front housing 250. The front housing 250 and the front chassis 756 may further include mating features that engage each other for alignment of the front housing 250 and the front chassis 756 during and after assembly. For example, as is shown in FIGS. 6C and 7A, the front housing 250 includes alignment bosses 650i and the front chassis 756 includes alignment apertures 756c that receive the alignment bosses 650i therein and, thereby, align the front chassis 756 to the front housing 250 and prevent relative movement therebetween.

The front portion 756a may span a substantial majority of a height of the internal compartment 251 of the image capture device 100' (i.e., between the bottom side 140f and the top side 140e), such as 70%, 80%, or more thereof. The front portion 756a may also a substantial majority of a width of the internal compartment 251 of the image capture device 100' (i.e., between the left side 140b and the right side 140c), such as 70%, 80%, or more thereof. The front portion 756a may be substantially continuous in a lower region thereof (e.g., a lower approximate half) by having few and/or small voids of material (e.g., few and/or small apertures or cutouts), such as by having material in a substantial majority of the lower region (e.g. 75%, 85%, 90% or more). The front portion 756a may be discontinuous in an upper region thereof (e.g., an upper approximate half) by having several and/or large voids of material, such as by having material in less than a majority of the upper region (e.g., 50%, 40%, or less). For example, as shown, the front portion 756a includes a microphone opening 756d and a lens opening 756e that may be configured as a an open-sided cutout. A majority of the electronic components 120 may be coupled to the front portion 756a of the front chassis 756, for example, with printed circuit board (not shown).

The bottom portion 756b of the front chassis 756 is generally planar and extends rearward from the front portion 756a along the bottom side 140f of the image capture device 100' and may also be referred to as a lateral portion or a rearwardly extending portion. The bottom portion 756b spans a majority of a thickness of the internal compartment 251 (i.e., in a longitudinal direction between the front side 140a and the rear side 140d), such as 50% or more, or substantial majority of the thickness (e.g., 75%, 85%, 90%, or more). The bottom portion 756b spans a substantial majority of the width of the internal compartment 251 of the image capture device 100' (e.g., 75%, 85%, 90%, or more). The bottom portion 756b may be substantially continuous, such as by having material in a substantial majority in the thickness and width dimensions thereof (e.g. 75%, 85%, 90% or more). The bottom portion 756b may be integrally formed with the front portion 756a, for example, with the front chassis 756 being a unitary component (e.g., cast aluminum).

The rear chassis 758, including the rear portion 758a, the bottom portion 758b, and the interaction with the rear housing 252, may be configured similar to the front chassis 756, including the front portion 756a, the bottom portion 756b, and the interaction with the front housing 250, respectively. The rear portion 758a of the rear chassis 758 is generally planar and extends upward along the rear side 140d of the image capture device 100' and may also be referred to as an upright portion. A rearward surface of the rear chassis 758 is positioned adjacent, and may further engage, a forward (i.e., inner) surface of the rear housing 252. The rear housing 252 and the rear chassis 758 may further include mating features that engage each other for alignment of the rear housing 252 and the rear chassis 758 during and after assembly. For example, as is shown in FIGS. 2B and 7A, the rear housing 252 includes alignment bosses 252i and the rear chassis 758 includes alignment apertures 758c that receive the alignment bosses 252i therein and, thereby, align the rear chassis 758 to the rear housing 252 and prevent relative movement therebetween.

The rear portion 758a may span the lateral, longitudinal, and vertical dimensions similar to the front portion 756a and may include various openings, such as a microphone opening 758d and a lens opening (not shown; configured similar to the lens opening 756e of the front chassis 756).

The bottom portion 758b of the rear chassis 758 overlaps and engages the bottom portion 756b of the front chassis 756. For example, as shown, a lower surface of the bottom portion 758b of the rear chassis 758 may be positioned above and engage an upper surface of the bottom portion 756b of the front chassis 756. The front chassis 756 and the rear chassis 758 may be coupled to each other with one or more threaded fasteners 759a. As shown in FIG. 7B, two of the threaded fasteners 759a are arranged at outer positions and extend through the bottom side of the front housing 250, through the bottom portion 756b of the front chassis 756, and are threaded into the bottom portion 758b of the rear chassis 758. A seal 760a is arranged between the head of the threaded fastener 759a and the front housing 250 to seal the fastener apertures of the front housing 250, the front chassis 756, and the rear chassis 758 and, thereby, the internal compartment 251. Accordingly, the bottom portion 756b of the front chassis 756, the bottom side of the front housing 250, and the seal 760a are compressed between the bottom portion 758b and the head of the threaded fastener 759a (i.e., the rear chassis 758 is positively statically connected to the front housing 250 via the threaded fastener 759a).

The front chassis 756 and/or the rear chassis 758 may also be coupled to the front housing 250 independent of the other. For example, as is also shown in FIGS. 7B and 7D, a threaded fastener 759b extends through the bottom side of the front housing 250 and is threaded into the bottom portion 758b of the rear chassis 758 without also extending through the front chassis 756 for compression thereby. Another seal 760b (e.g., an O-ring) is arranged between a head of the threaded fastener 759b and the bottom side of the front housing 250. The front housing 250 and the rear chassis 758 may thus be considered positively statically connected by the fastener 759b. As discussed in further detail below, the front chassis 756 may also be coupled to the front housing 250 with other threaded fasteners 959c independent of the rear chassis 758.

Referring to FIGS. 8A-9G, the image capture device 100' may also include a mount 870. The mount 870 functions to removably couple the image capture device 100' to another device, such as a tripod or other support device 980 (see FIGS. 9A-9B). As shown, the mount 870 includes two finger members 872 that pivot relative to the body 140 between stowed positions (as shown in FIGS. 1A and 8D-8F) and deployed positions (as shown in FIGS. 8A-8C, 9A, and 9B). When in the deployed positions, the two finger members 872 extend away from the body 140 in parallel and are insertable between complementary finger members 982 of the support device 980. The mount 870 may additionally include a base 874 to which the two finger members 872 are pivotably coupled and which is in turn coupled to the body 140 of the image capture device 100'. As discussed in further detail below, the mount 870 (e.g., the base 874 thereof) may be positively statically connected to the chassis 754.

Each of the finger members 872 is a generally planar member (e.g., having parallel planar surfaces) that extends between a proximal end and a distal end thereof. The proximal end is positioned proximate the image capture device 100' and hingedly coupled to the base 874, for example, with a hinge pin that defines a pivot axis about which the finger member 872 rotates. The proximal end may be rounded about the pivot axis. The proximal end of the finger member 872 may also be referred to as a pivot end.

The distal end is positioned distally from the proximal and from the pivot axis. The distal end is movable relative to the body 140 and, accordingly, may be referred to as a free end. The finger members 872 may each include a recess 872a in the distal end between the parallel planar surfaces, which forms a finger pick that may be engaged by the finger (e.g., finger nail) of the user to facilitate rotating the finger member 872 from the stowed to the deployed position.

Each of the finger members 872 further includes an aperture 872b positioned between the proximal end and the distal end, which extends between the planar surfaces thereof (e.g., perpendicular thereto). When the two finger members 872 are in the deployed positions, the apertures 872b thereof are aligned with each other so as to receive a shaft of a thumbscrew 984 of the support device 980 therethrough, which also extends through apertures of the complementary finger members of the support device for coupling the mount 870 to the support device 980. The distal end of each of the finger members 872 may be rounded about the apertures 872b (e.g., a center axis thereof), so as to permit the finger members 872 to pivot relative to the support device 980.

The mount 870 may be configured to retain the finger members 872 in the stowed and/or deployed positions. For example, the finger members 872 may be retained in the stowed and/or deployed positions magnetically and/or frictionally. As shown, the finger members 872 may be retained magnetically in the stowed positions. The finger members 872 each include a magnet 872c, which is arranged between the pivot axis and the aperture 872b thereof. The magnet 872c magnetically couples to the base 874, or other magnetic portion of the image capture device 100', to retain the finger member 872 in the stowed position. The finger members 872 may be retained frictionally in the deployed positions. The finger members 872 are each fixedly coupled to the hinge pin (not labeled), which is in turn frictionally engaged with the body 140, for example, with an elastomeric friction pad pressing the hinge pin to resist rotation thereof.

The mount 870 is positioned at the bottom side 140f of the body 140 of the image capture device 100'. For example, as shown, the mount 870 is positioned within a mount receptacle 940g formed in the bottom side 140f of the body 140 and below the internal compartment 251. As shown, the mount receptacle 940g is recessed relative to a bottommost surface of the body 140 (e.g., of the front housing 250). For example, the mount receptacle 940g is defined by a recessed (e.g., concave) portion of the body 140, which as shown may be defined by the bottom wall of the front housing 250. The recessed portion generally includes a peripheral wall 940i that extends upward from the bottommost surface of the body 140 and defines the horizontal shape and bounds (e.g., length and width) of the mount receptacle 940g, as well as a top wall 940h that extends across the peripheral wall 940i and defines the vertical shape and bounds (e.g., the depth) of the mount receptacle 940g. The top wall 940h and the peripheral wall 940i of the mount receptacle 940g may be part of the front housing 250 (e.g., being formed by the bottom wall).

The shape and dimension of the mount receptacle 940g may permit the mount 870 (e.g., the finger members 872) to be contained entirely therein when the finger members 872 are in the stowed positions. For example, the depth of the mount receptacle 940g at locations corresponding to the finger members 872 may be the same or greater than the thickness of the finger members 872, such that the finger members 872 are flush or recessed relative to the bottom-most surface of the body 140 when in the stowed positions. As a result, the image capture device 100' may rest stably on a flat support surface, such as a table. The horizontal shape and dimensions of the mount receptacle 940g permit access to the distal ends of the finger members 872 (e.g., to the recesses 872a thereof), thereby allowing the user to engage and pull the finger members 872 from the stowed position to the deployed position. The horizontal shape of the mount receptacle 940g, which is visible at the bottom side 140f of the body 140, may correspond to that of the finger members 872, such that a generally uniform gap is formed laterally between the recessed portion of the body 140 (e.g., the peripheral wall 140i defining the mount receptacle 940g) and the finger members 872. For example, as shown, the mount receptacle 940g includes ends that are rounded (e.g., forming semicircles at left and right sides thereof) and correspond to the distal ends of the finger members 872 which are also rounded.

As discussed below, the portion of the body 140 defining the mount receptacle 940g is sealed, such that the internal compartment 251 is also sealed.

Figure 9A:
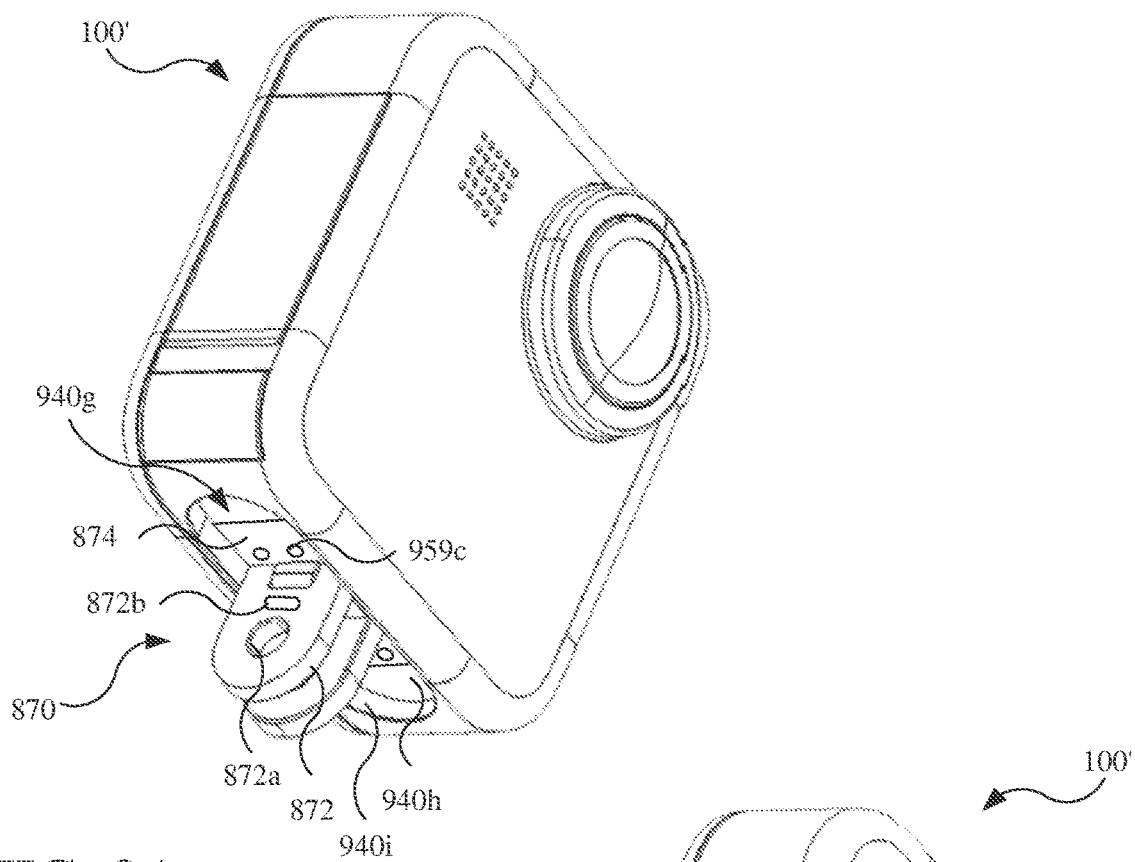
FIG. 9A is a lower, front, left perspective view of the image capture device of FIG. 1D with the mount of FIGS. 8A-8F in the deployed state.
Figure 9B:
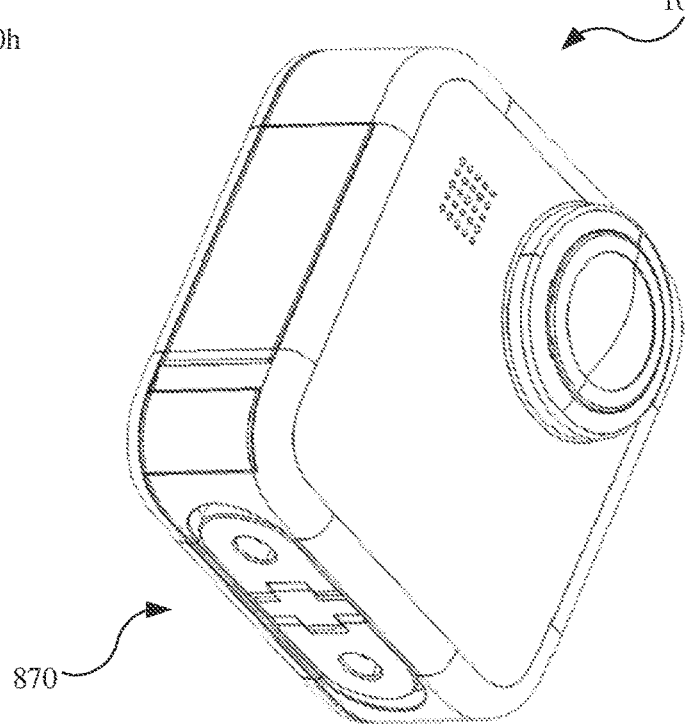
FIG. 9B is a lower, front, left perspective view of the image capture device of FIG. 1D with the mounter of FIGS. 8A-8F in the stowed state.
Figure 9E:
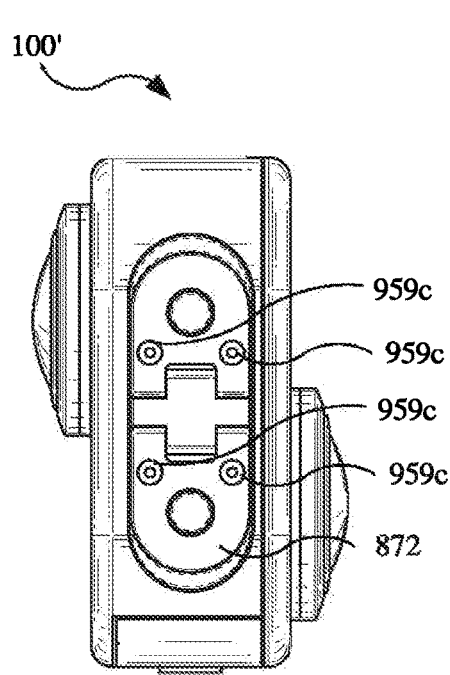
FIG. 9E is a bottom view of the image capture device of FIG. 1D with various outer components depicted as translucent and various internal components omitted.
Figure 9F:
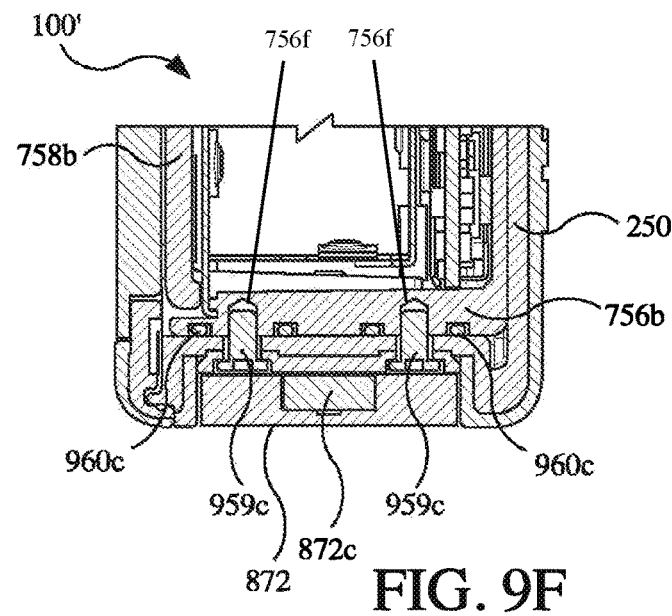
FIG. 9F is a partial cross-sectional view of the image capture device of FIG. 1D.
Figure 9G:
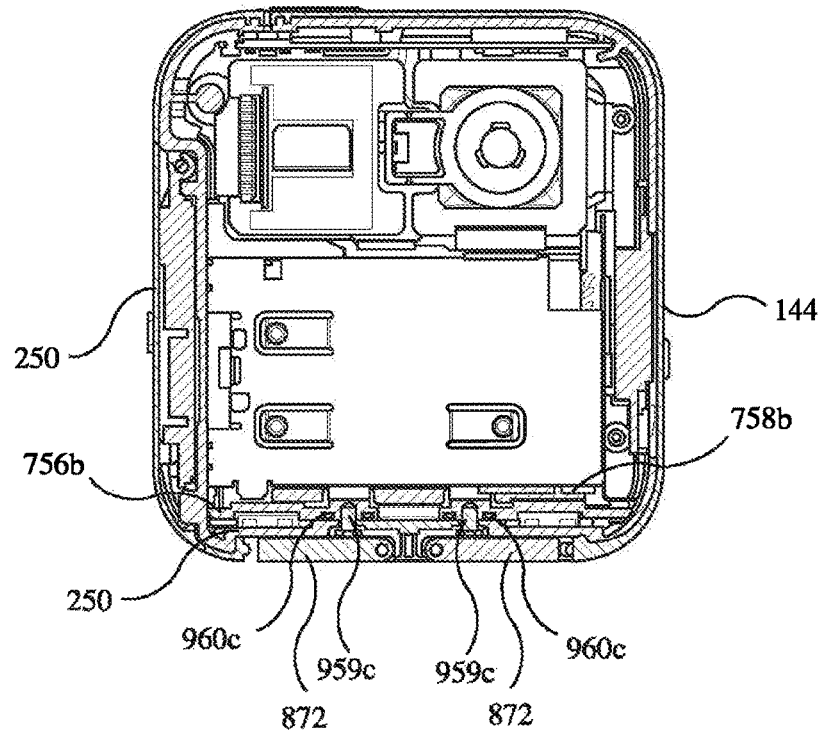
FIG. 9G is a cross-sectional view of the image capture device of FIG. 1D.

The mount 870 is coupled to the body 140 and, in particular, to the chassis 754, such as with threaded fasteners 959c (e.g., four as shown). The threaded fasteners 959c are covered and exposed by the finger members 872 when in the stowed and deployed positions, respectively. The locations of the threaded fasteners 959c are illustrated in FIG. 9E with the finger members 872 being illustrated as transparent. By being positively statically connected to the chassis 754 by the threaded fasteners 959c, the mount 870 may be considered indirectly coupled to other components of the image capture device 100', such as the front housing 250, the rear housing 252, and the electronic components 120. The mount 870 may form a stronger connection to the image capture device 100' by being coupled to the chassis 754 as opposed to other components of the body 140 (e.g., the rear housing 252 and the front housing cover 150), because the chassis 754 is formed from material having higher stiffness and/or yield strength as described above (e.g., cast aluminum instead of plastic, such as polycarbonate).

In particular, the mount 870 is coupled to the bottom portion 756b of the front chassis 756. The threaded fasteners 959c extend through holes in the base 874 and the front housing 250 (i.e., through the bottom wall and, in particular, the top wall 940h of the mount receptacle 940g) and into threaded holes 756f of the front chassis 756. The mount 870 and the chassis 754 are considered positively statically connected by the threaded fasteners 959c The threaded holes 756f of the front chassis 756 are blind holes that are capped or otherwise sealed, such that the threaded holes 756f do not provide a leak path for water to enter into the internal compartment 251 along the threaded fastener 959c. A seal 960c (e.g., gasket or O-ring) is positioned around each of the threaded fasteners 959c and between the front housing 250 (i.e., thereabove) and below the front chassis 756 (i.e., therebelow) to prevent water leaking therebetween and into the internal compartment 251.

As a result, the front housing 250, the base 874 of the mount 870, and the seal 960c are compressed between the chassis 754 (e.g., the front chassis 756) and the head of the threaded fastener 959c. Further, in the locations of the threaded fasteners 959c, which do not extend through or into the rear chassis 758, the front chassis 756 may be considered coupled to the front housing 250 independent of the rear chassis 758.

Referring to FIGS. 10A-11B, the image capture device 100' is configured to couple different lens covers that protect the front lens 142a and the rear lens 142b, such as an opaque lens cover 1090 for when the image capture device 100' is not in use and a transparent lens cover 1190 for when the image capture device 100' is in use. As described previously, the housing 249 defines the circumferential channel 550j on the front side 140a around the front lens 142a (see FIG. 5B) and the circumferential channel 552j on the rear side 140d around the rear lens 142b (see FIGS. 10A and 11A). The circumferential channels 550j, 552j are configured to receive and retain therein a corresponding coupling feature, such as a coupling flange 1094a, of the respective opaque lens cover 1090 or the transparent lens cover 1190.

Figure 10B:
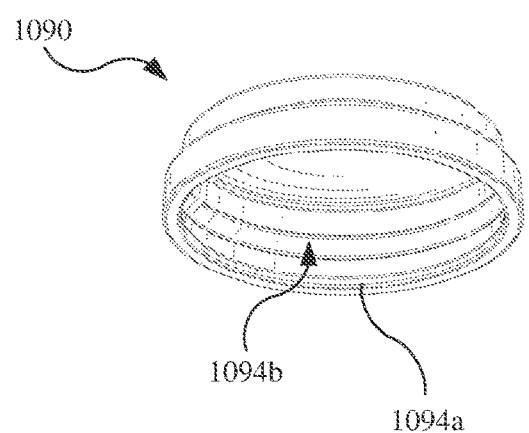
FIG. 10B is a lower perspective view of the lens cover of FIG. 10A.
Figure 11A:
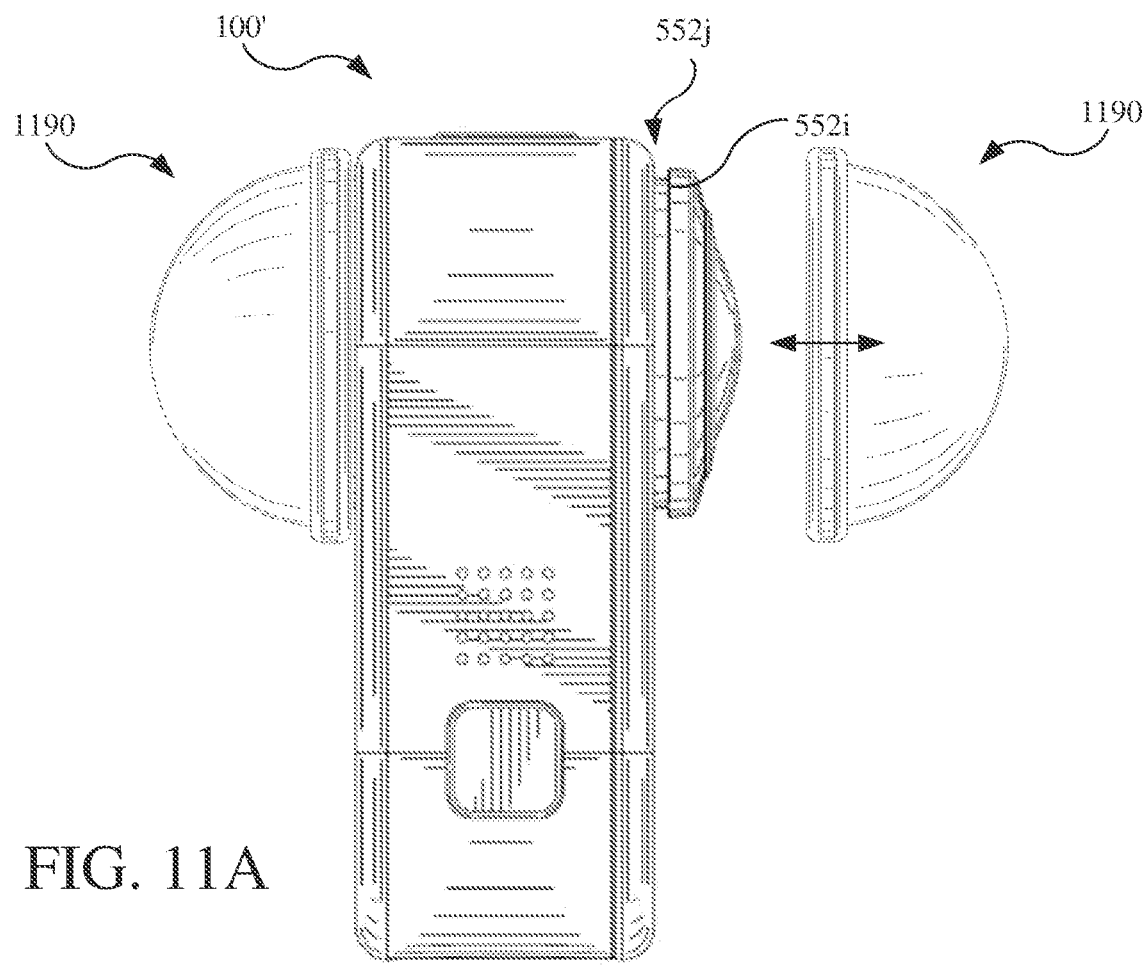
FIG. 11A is a right view of the image capture device of FIG. 1D with second lens covers in both connected and disconnected states.
Figure 11B:
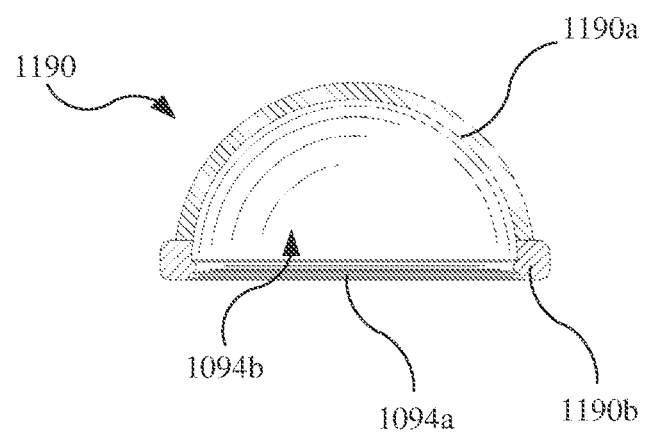
FIG. 11B is a cross-sectional view of the lens cover of FIG. 11A.
Figure 12A:
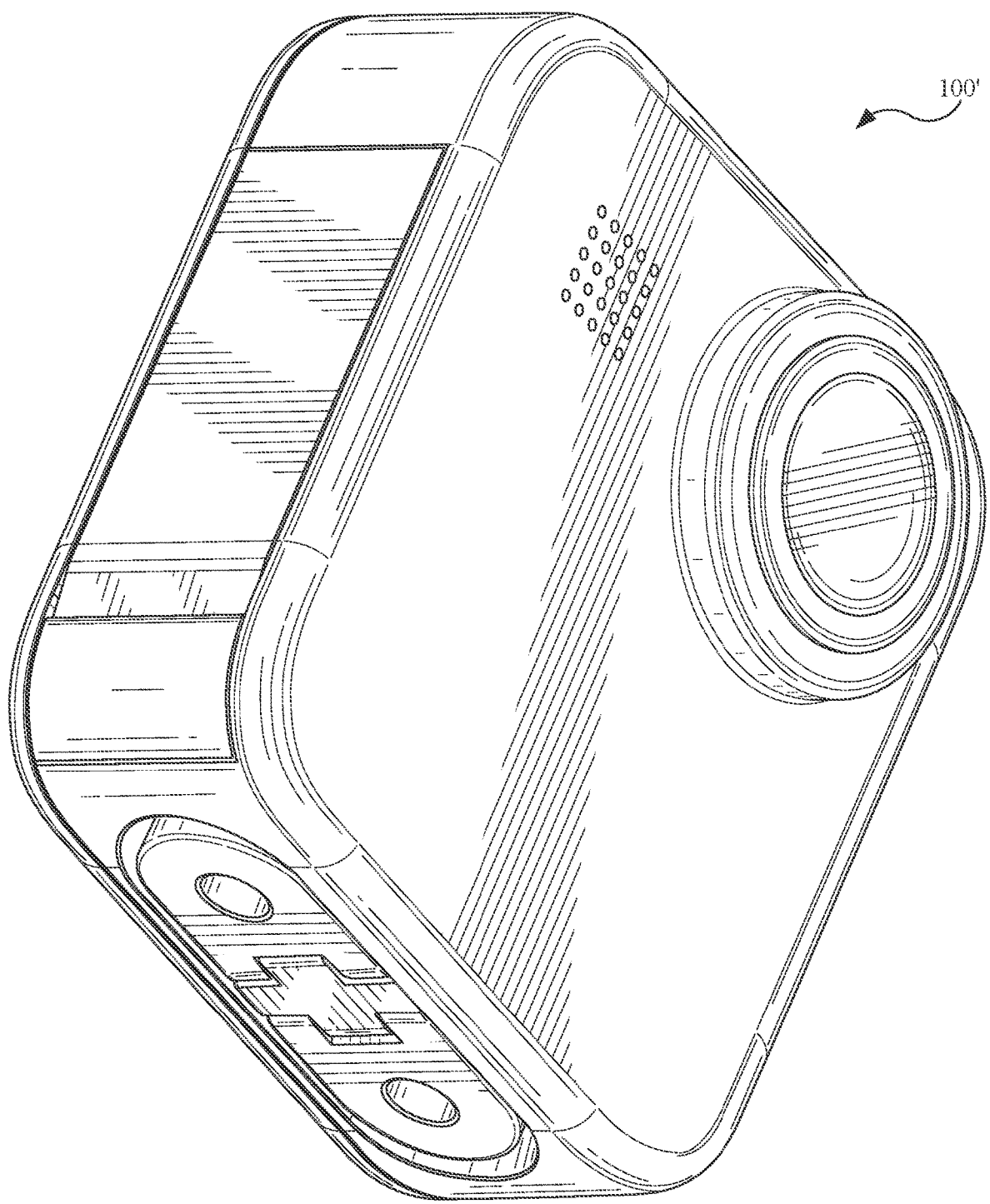
FIGS. 12A-12H are views of a variation of the image capture device of FIG. 1D.
Figure 12B:
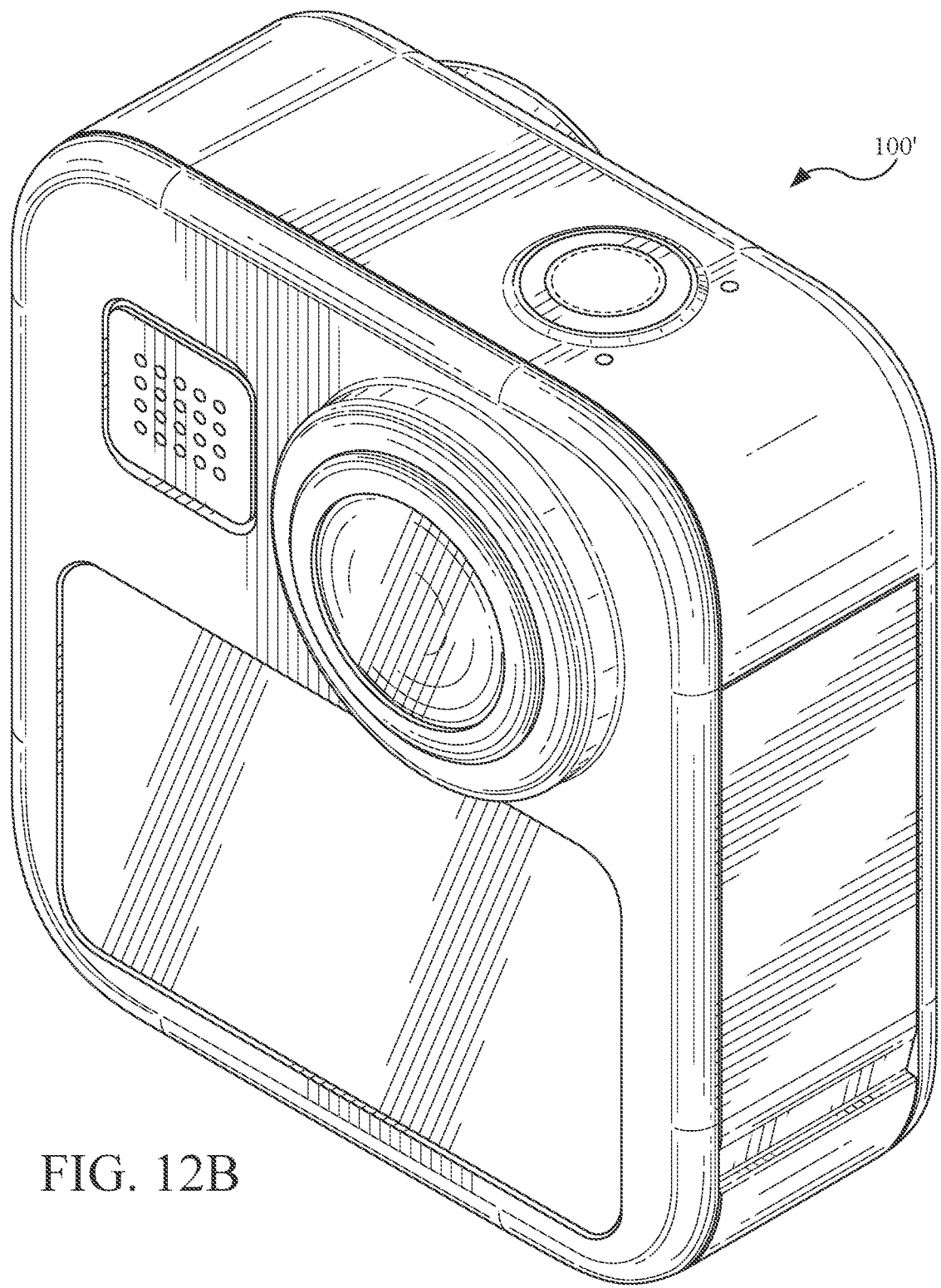
Figure 12C:
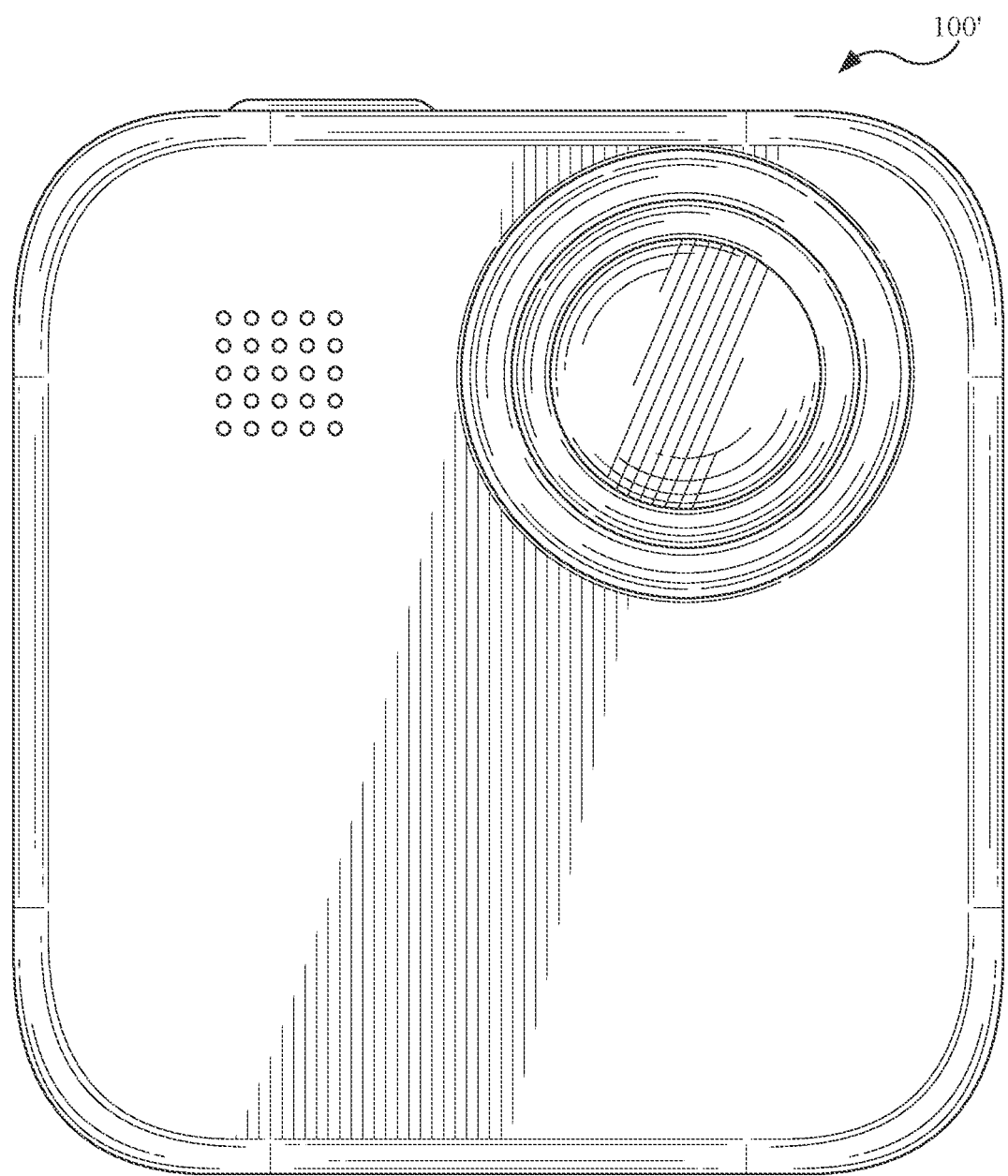
Figure 12D:
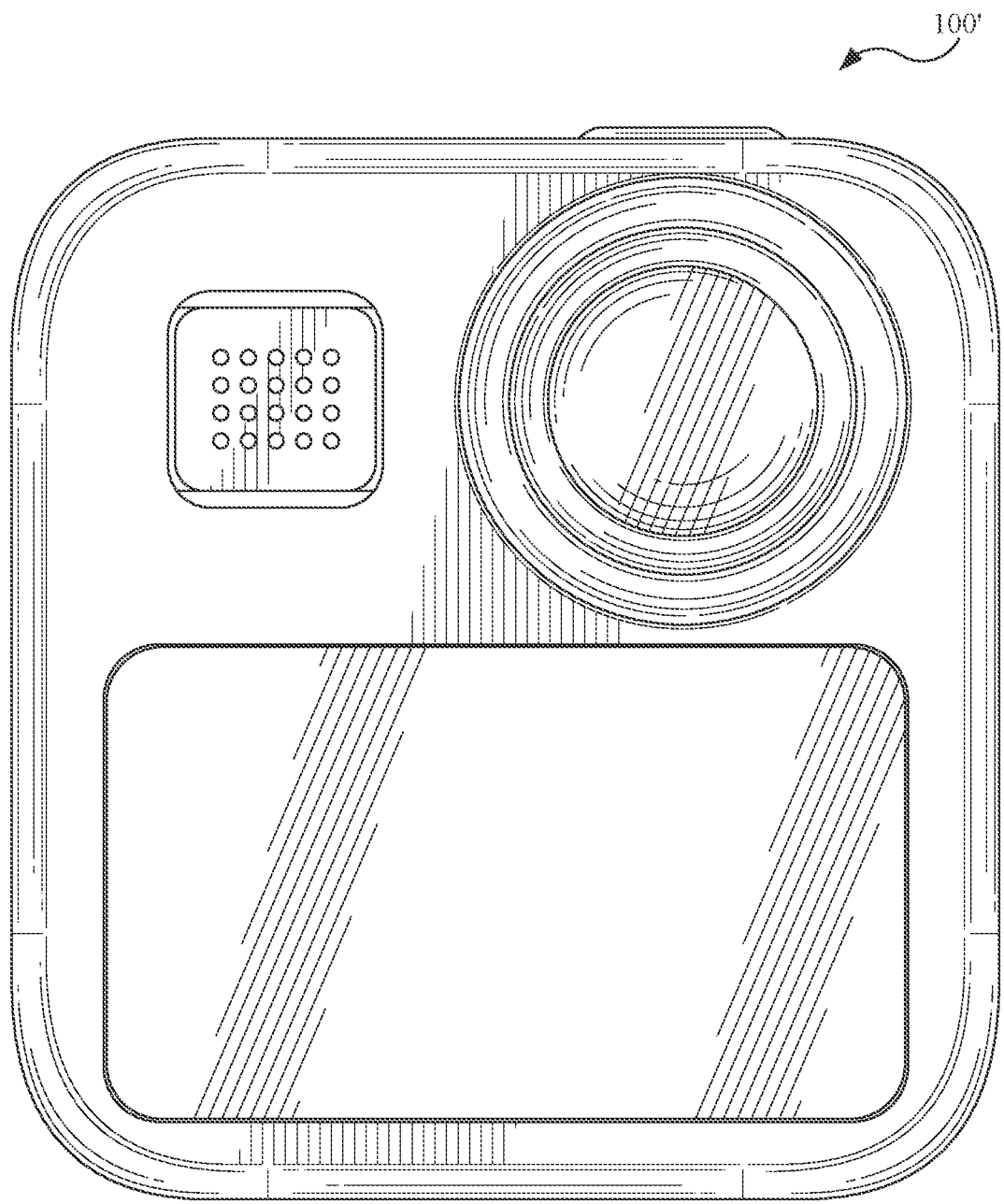
Figure 12E:
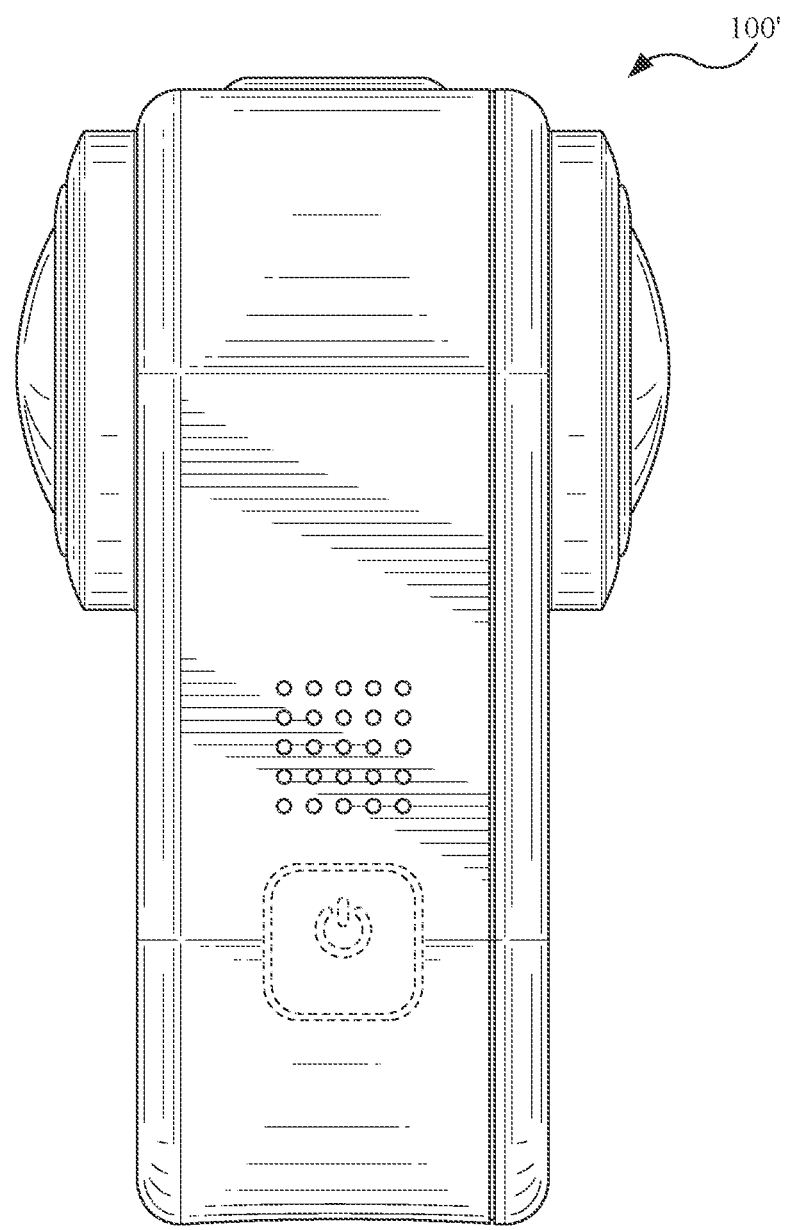
Figure 12F:
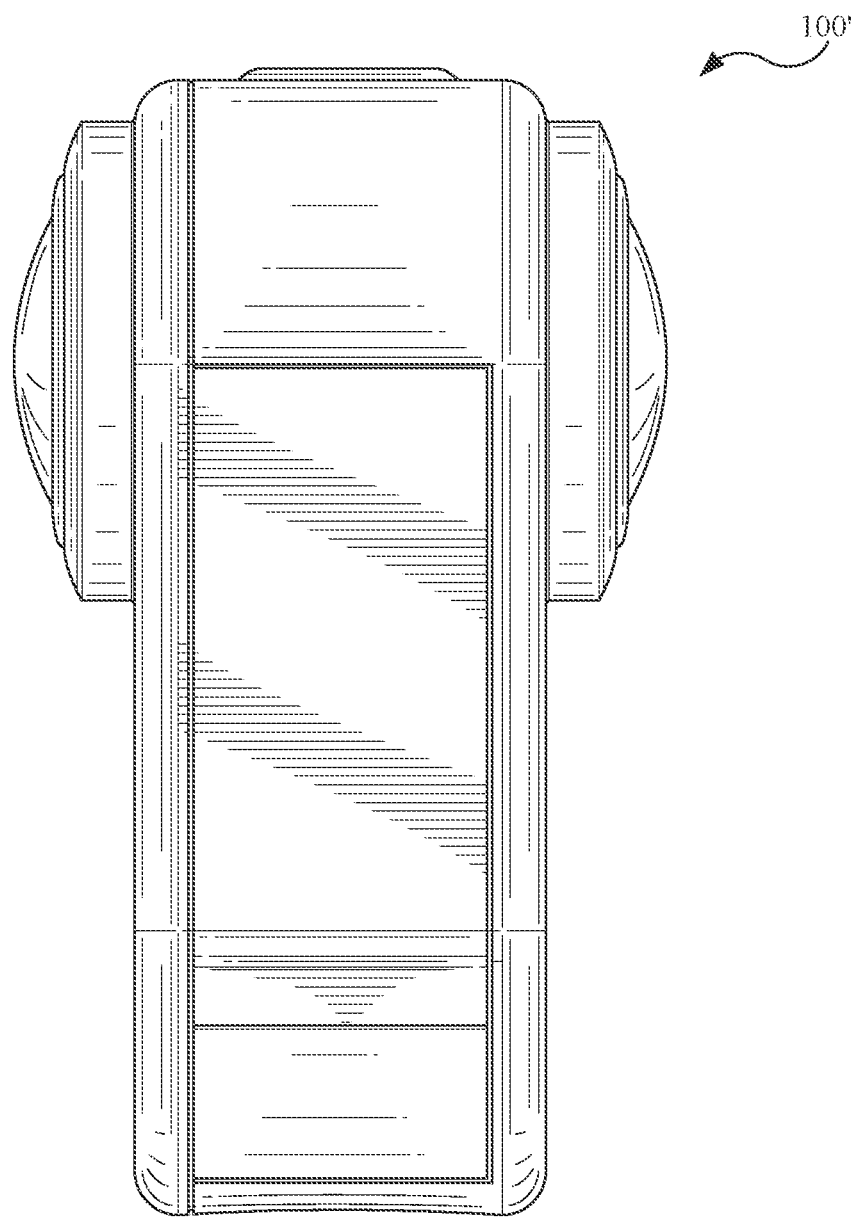
Figure 12G:
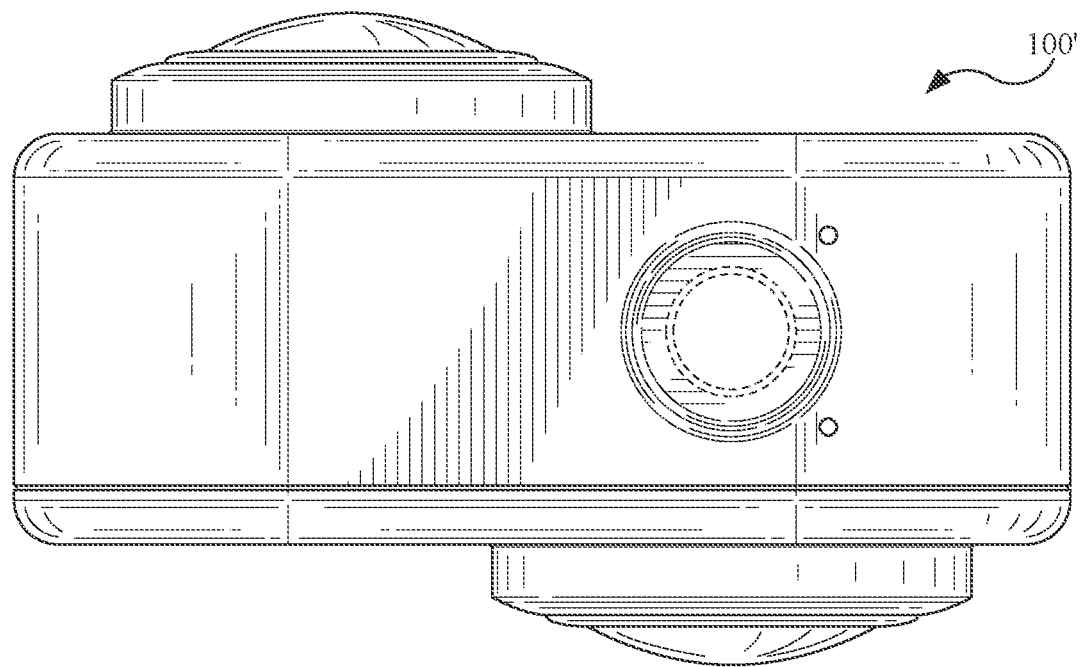
Figure 12H:
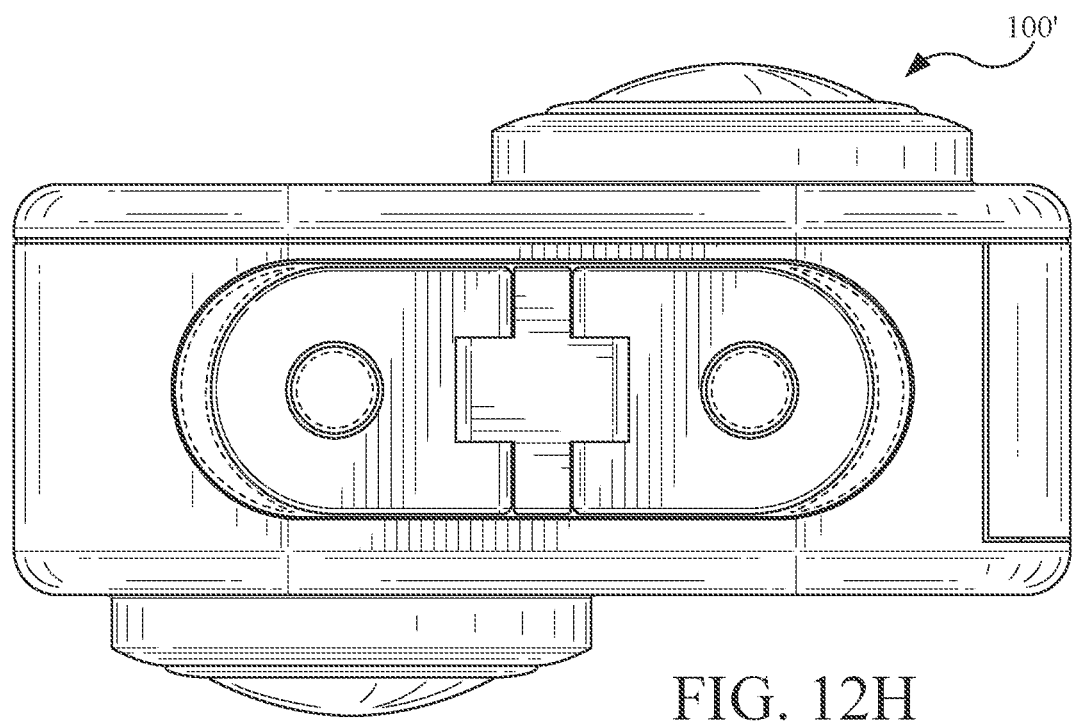
Figure 12I:
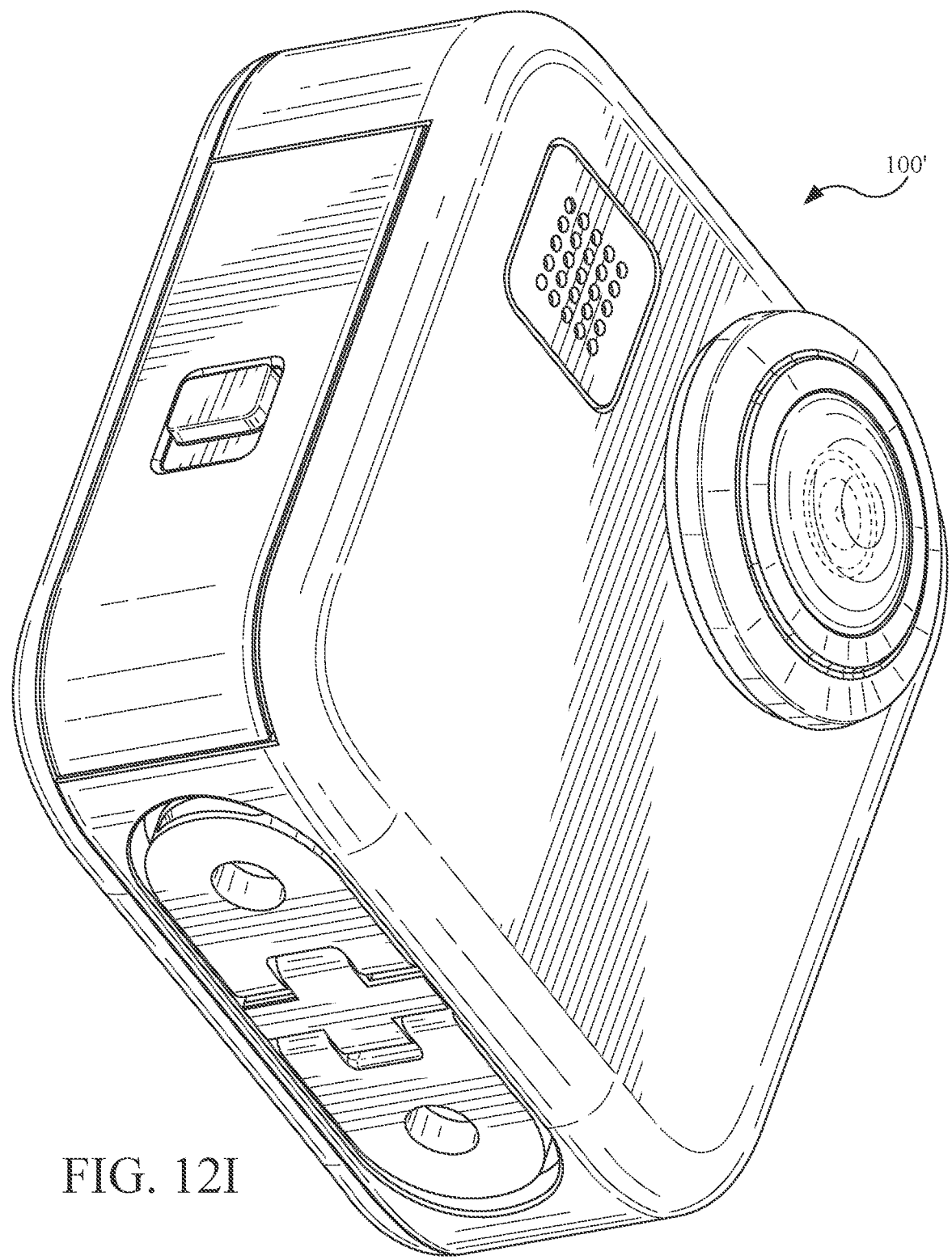
FIGS. 12I-12P are alternative views of the image capture device of FIG. 1D.
Figure 12J:
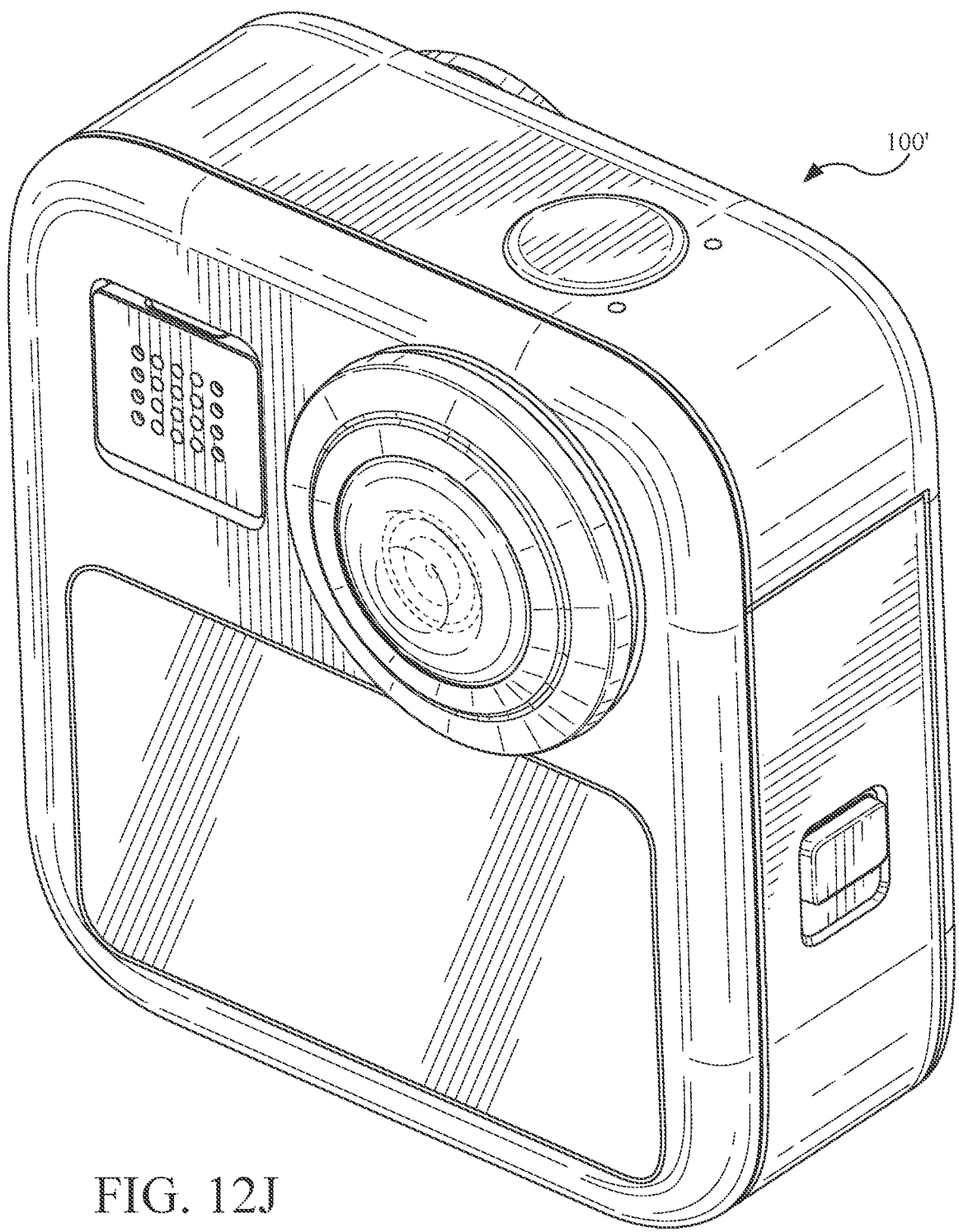
Figure 12K:
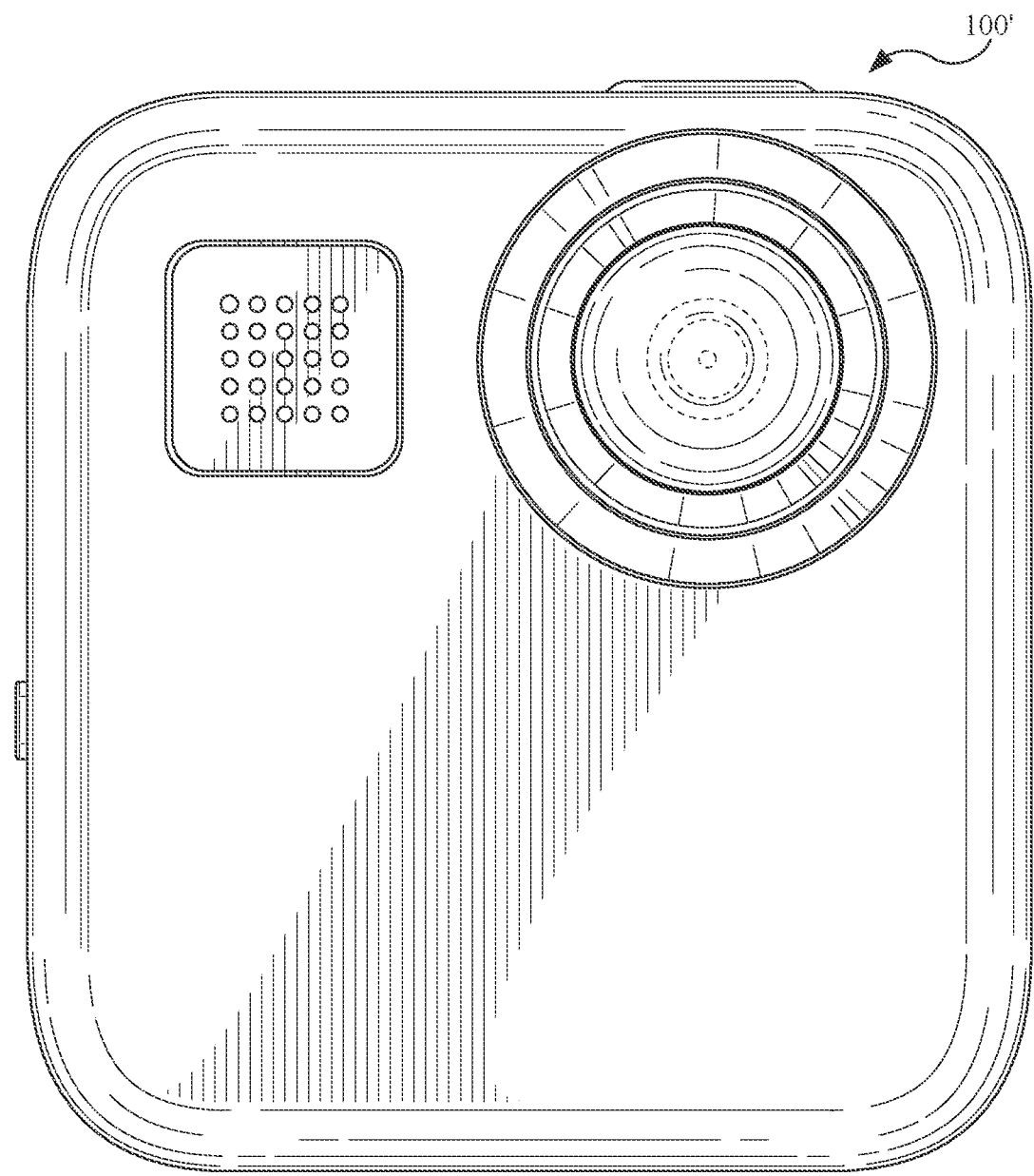
Figure 12L:
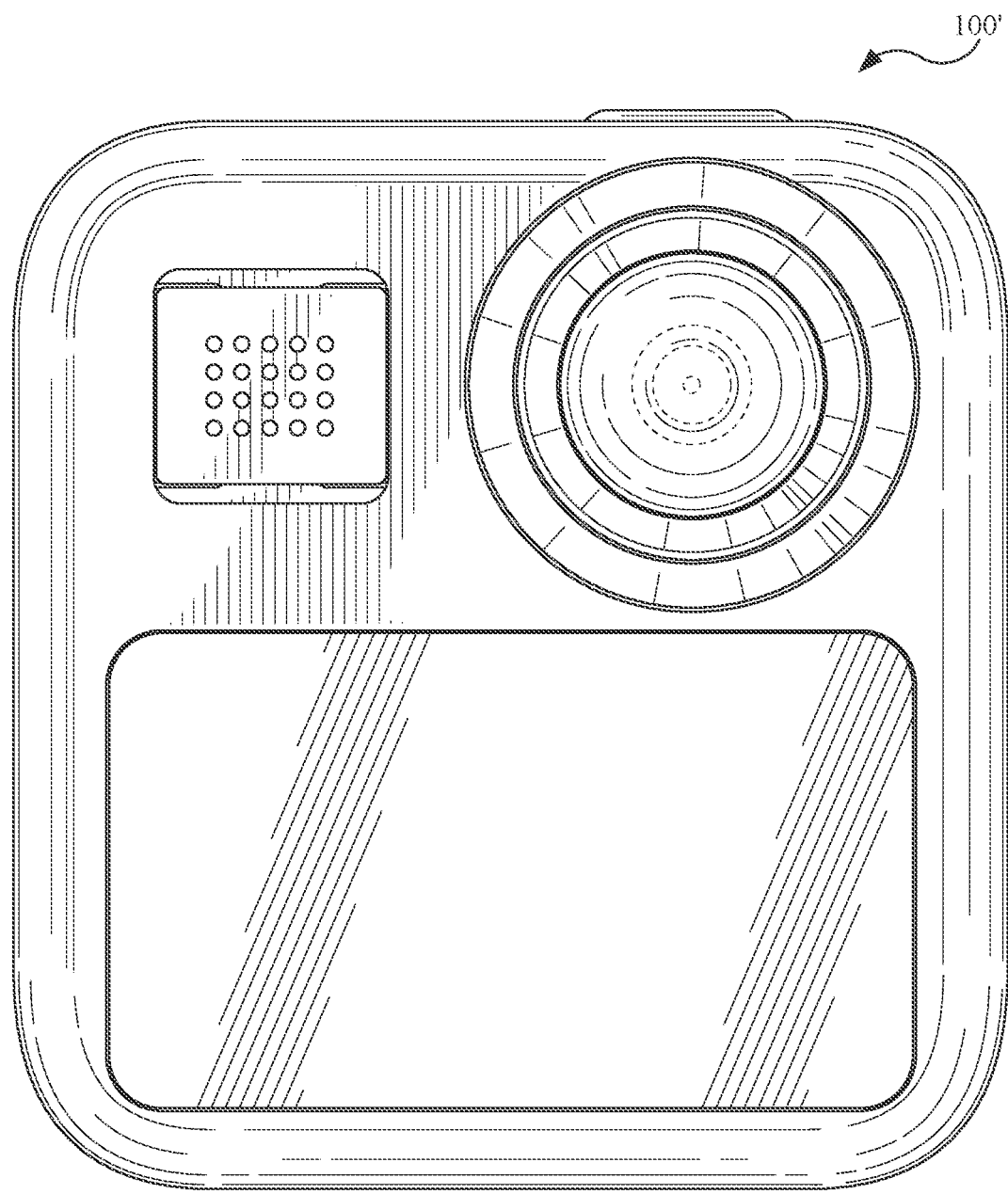
Figure 12M:
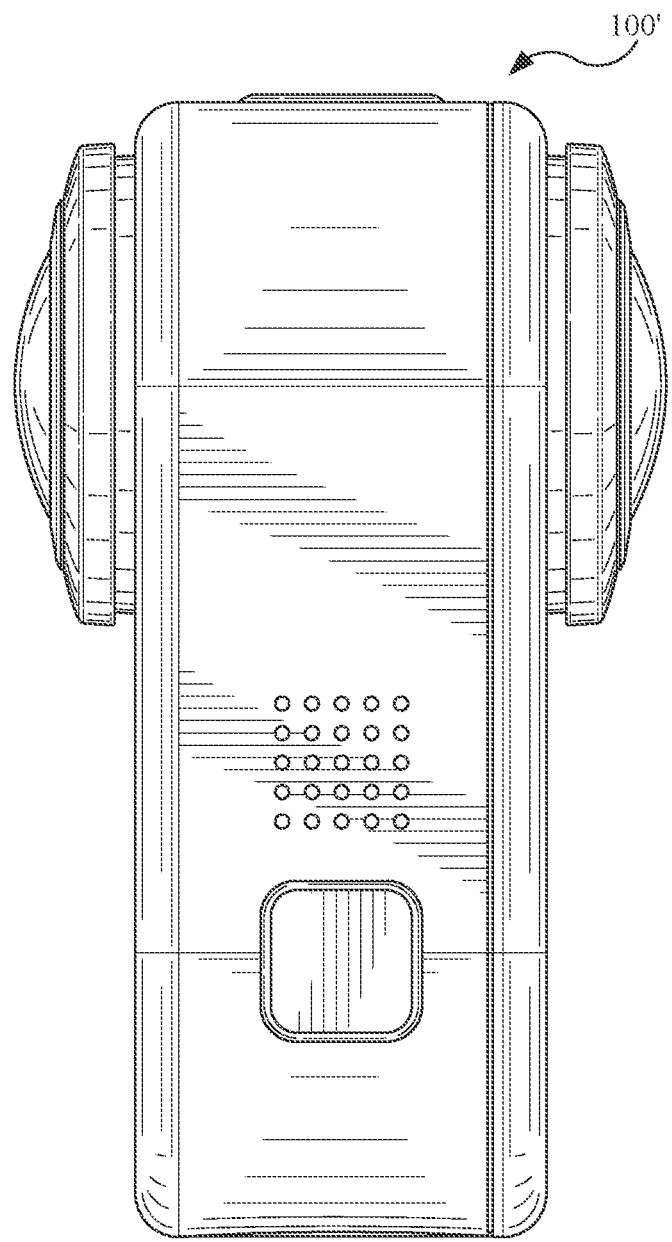
Figure 12N:
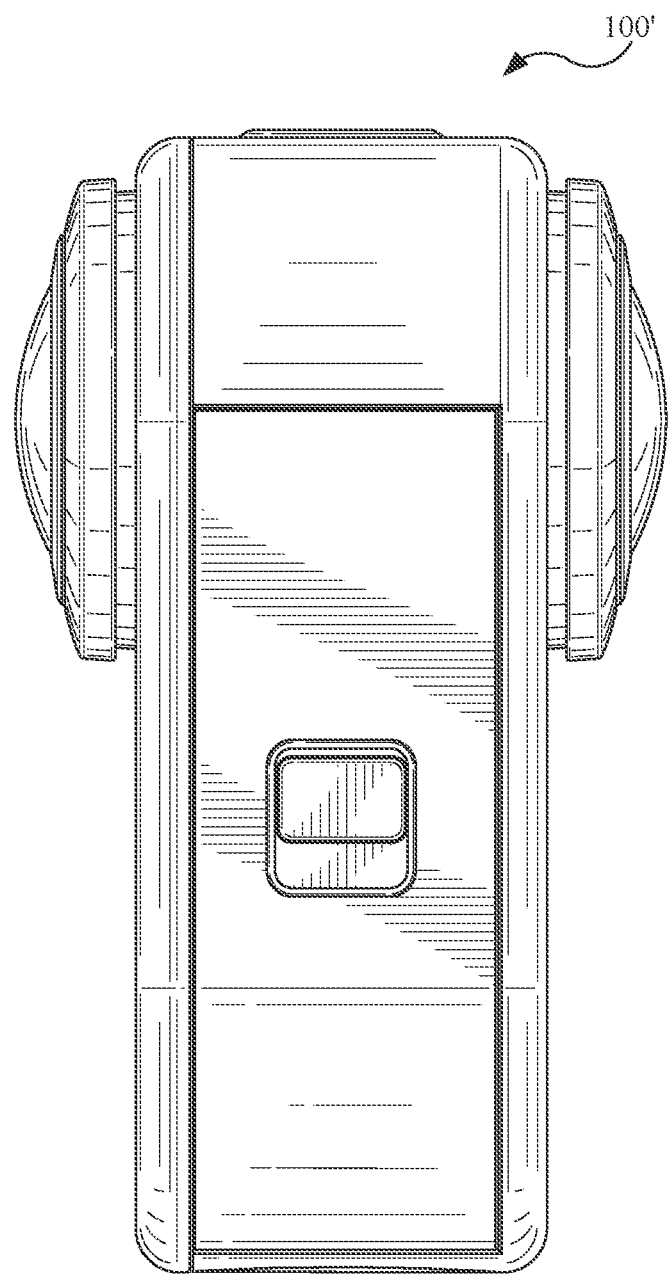
Figure 12O:
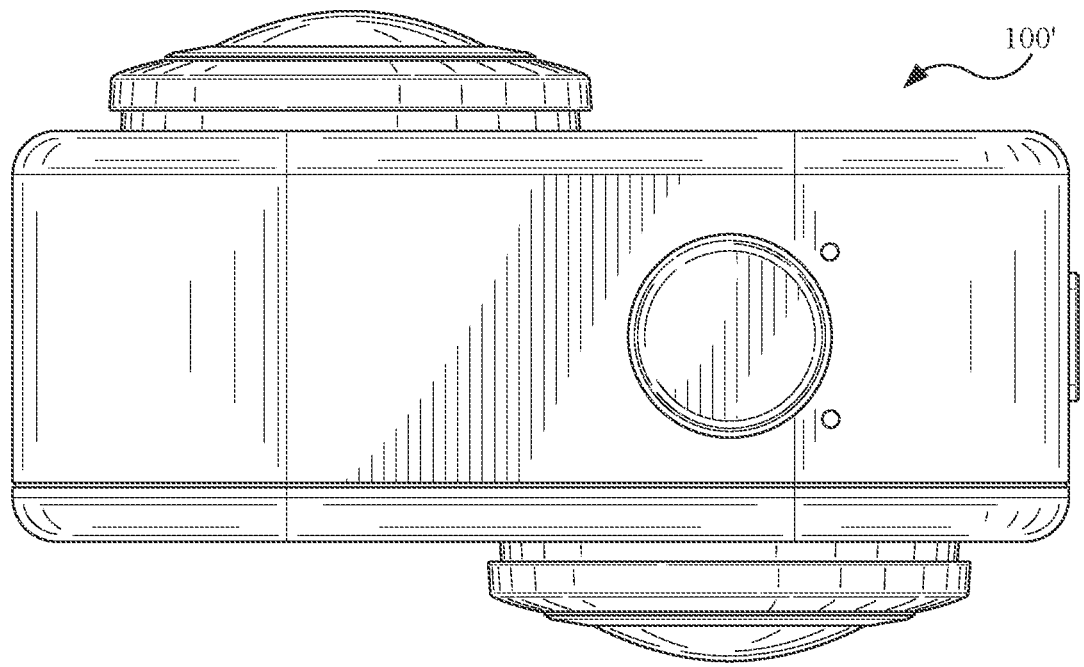
Figure 12P:
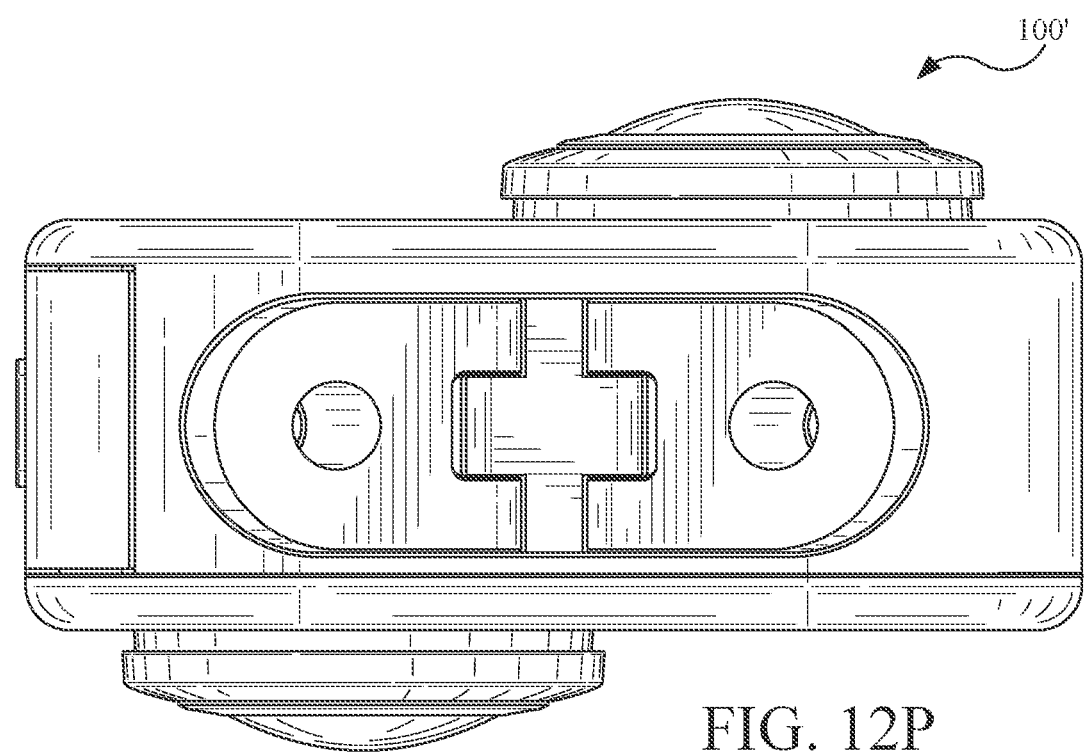
Figure 12Q:
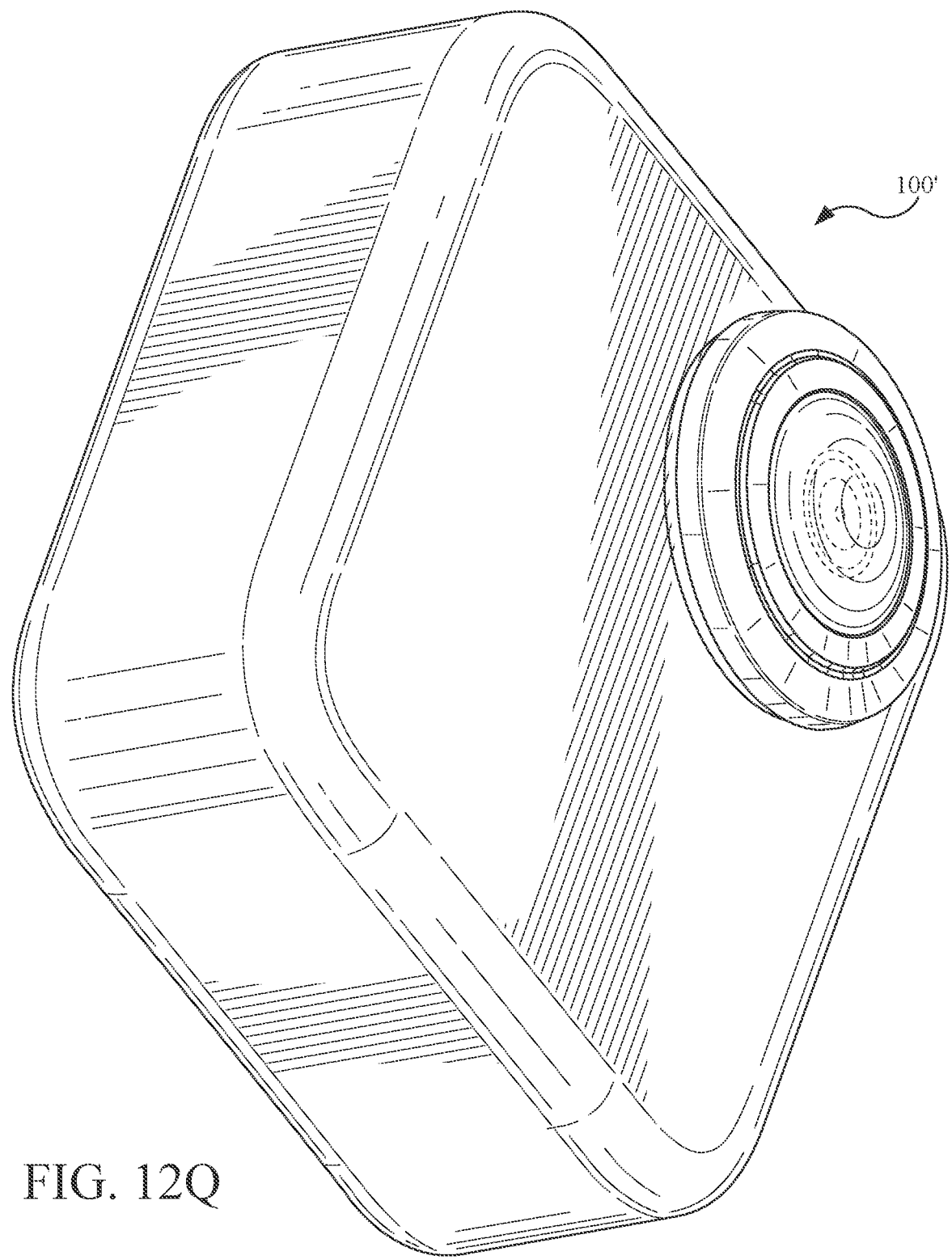
FIGS. 12Q-12X are view of another variation of the image capture device of FIG. 1D.
Figure 12R:
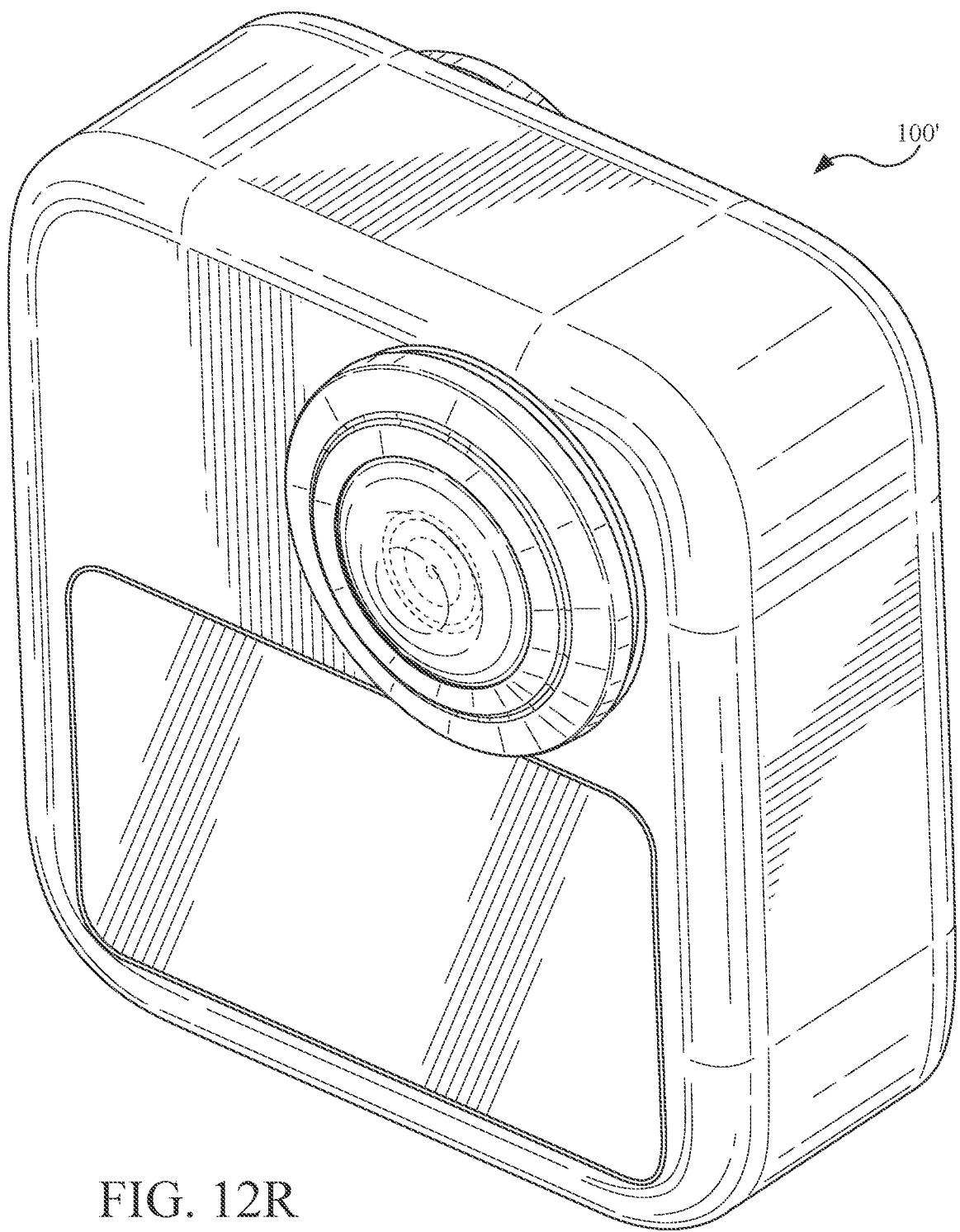
Figure 12S:
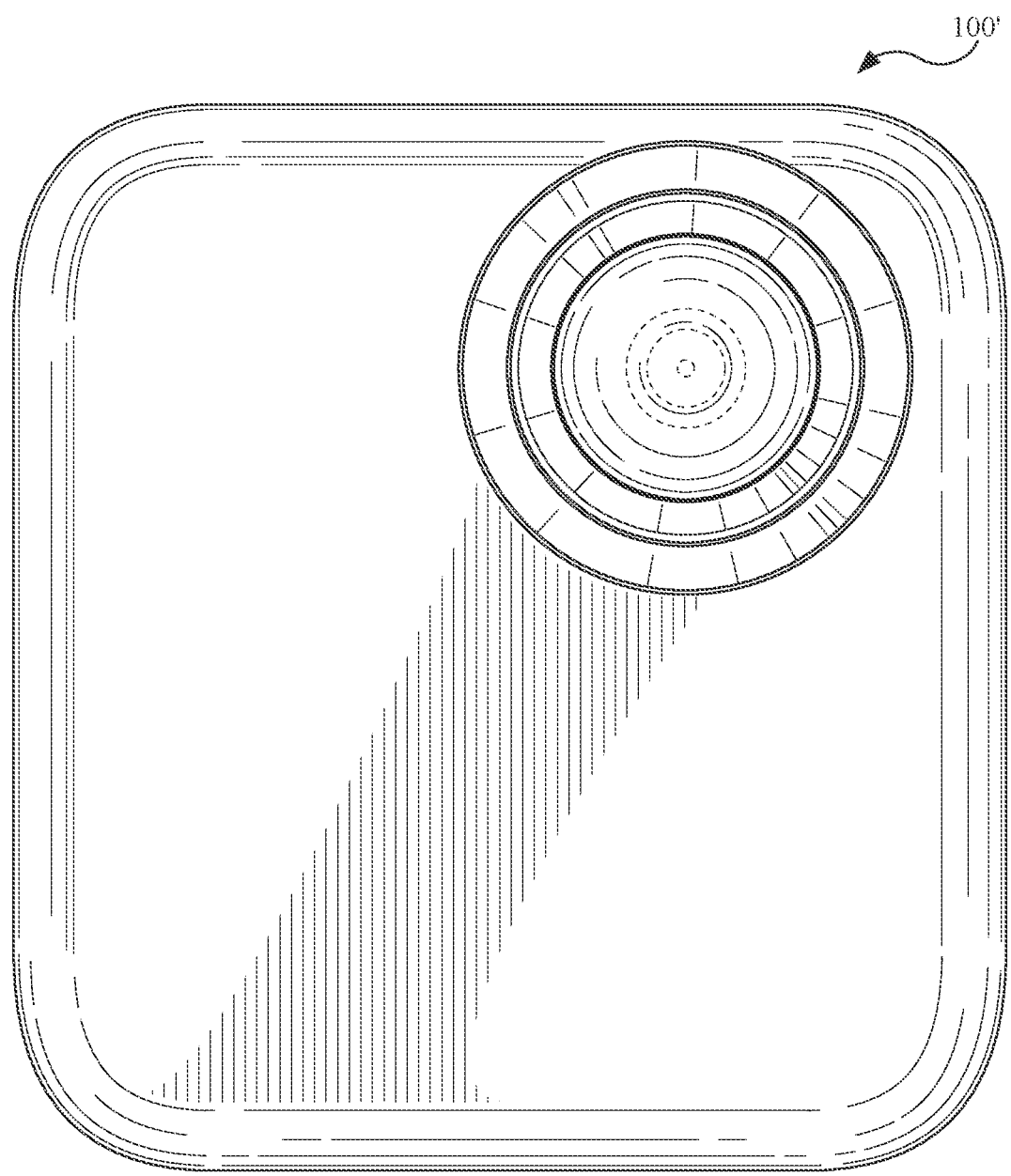
Figure 12T:
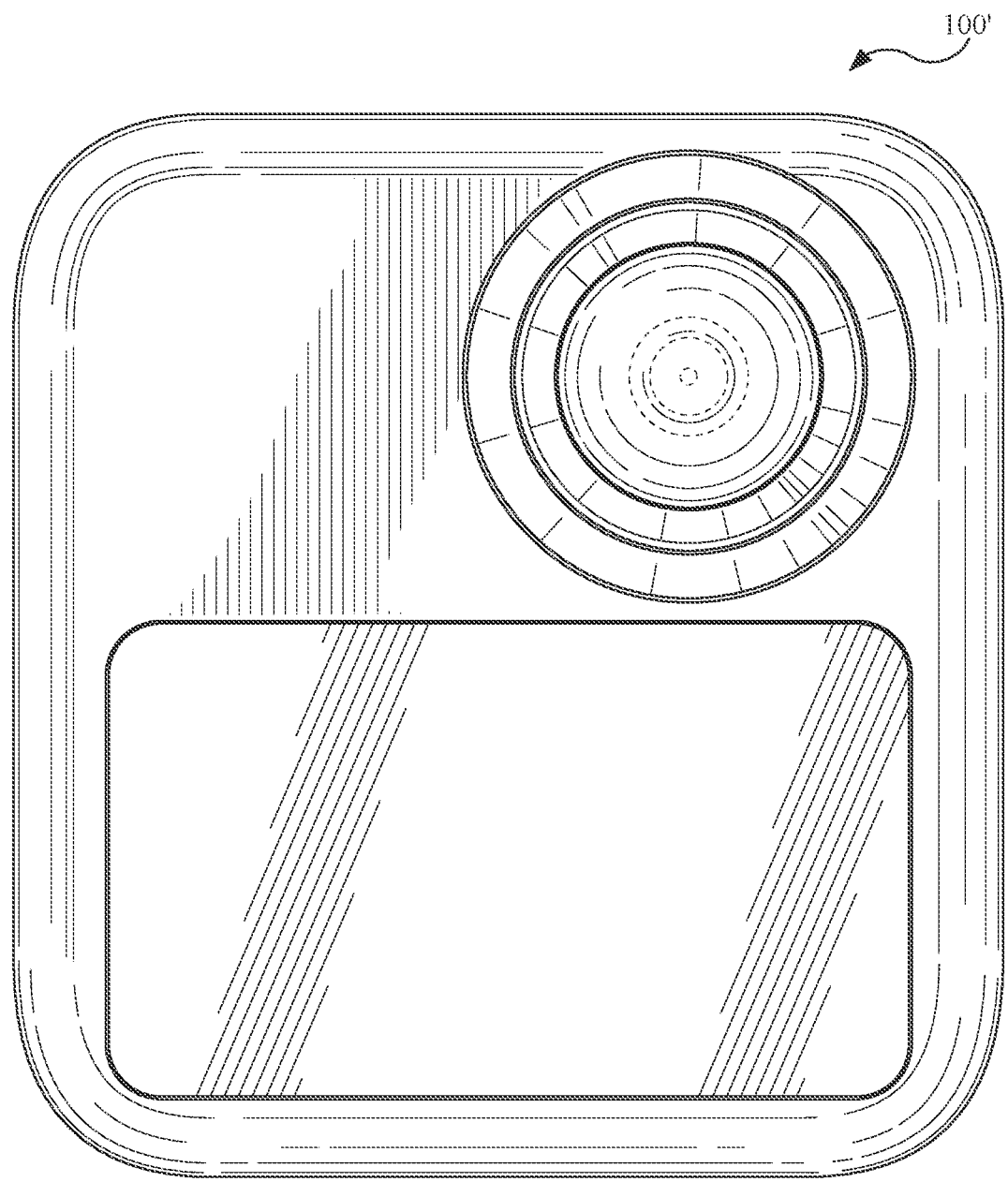
Figure 12U:
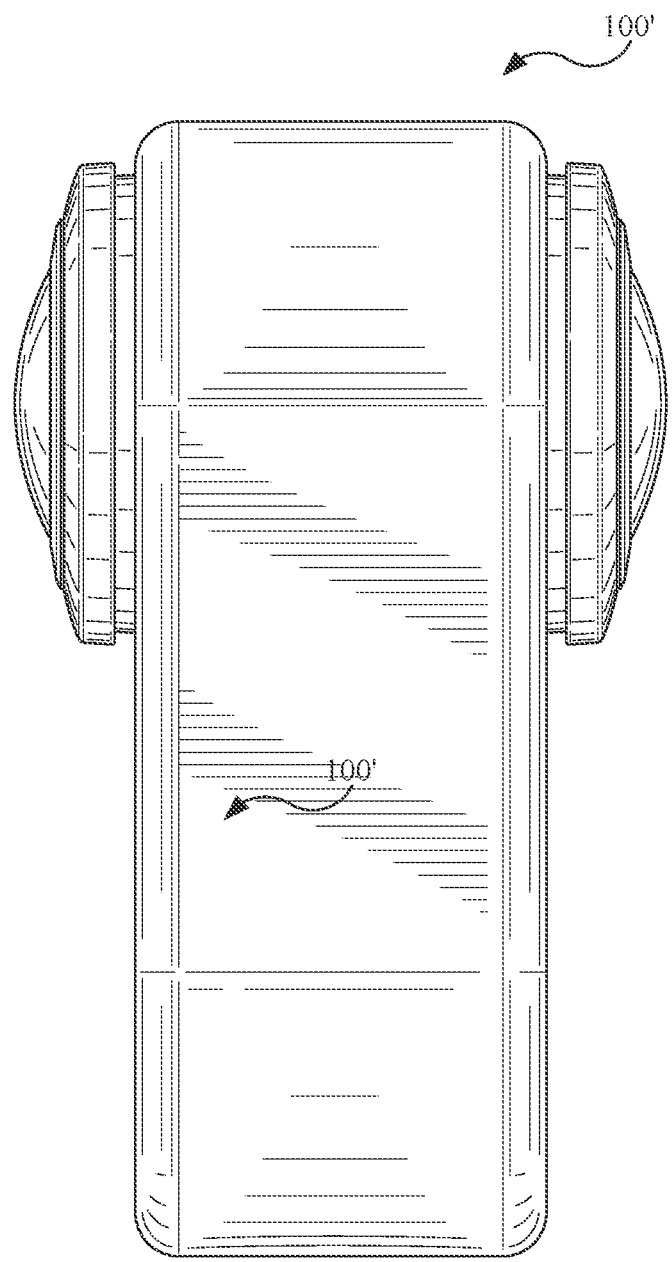
Figure 12V:
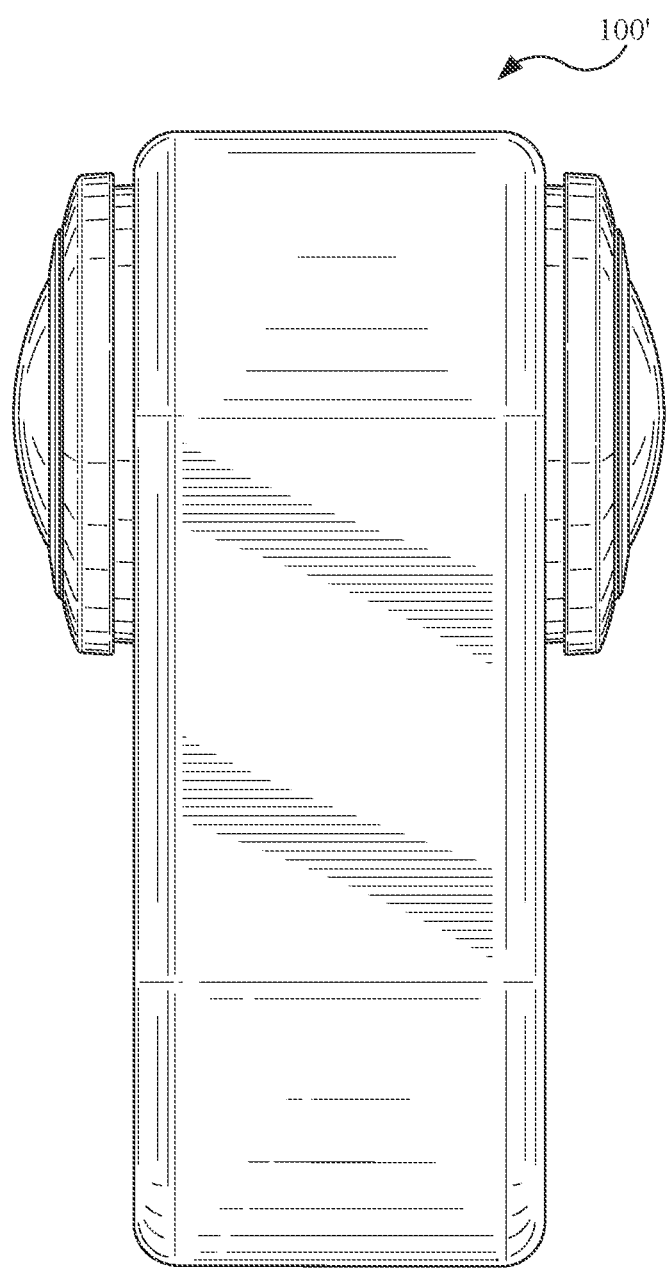
Figure 12W:
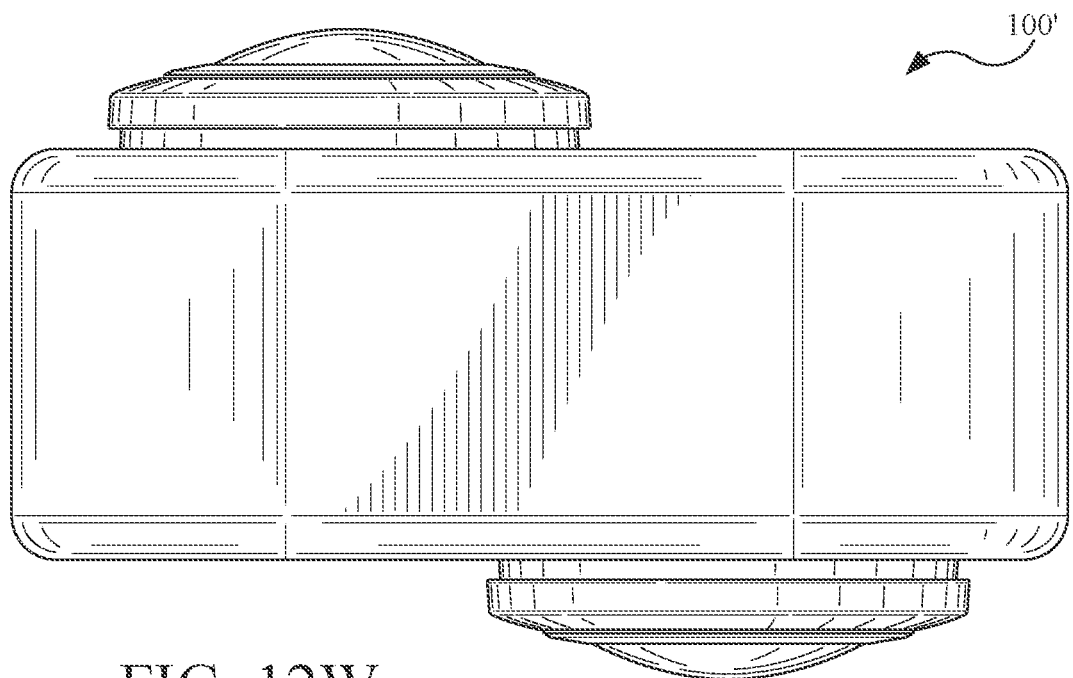
Figure 12X:
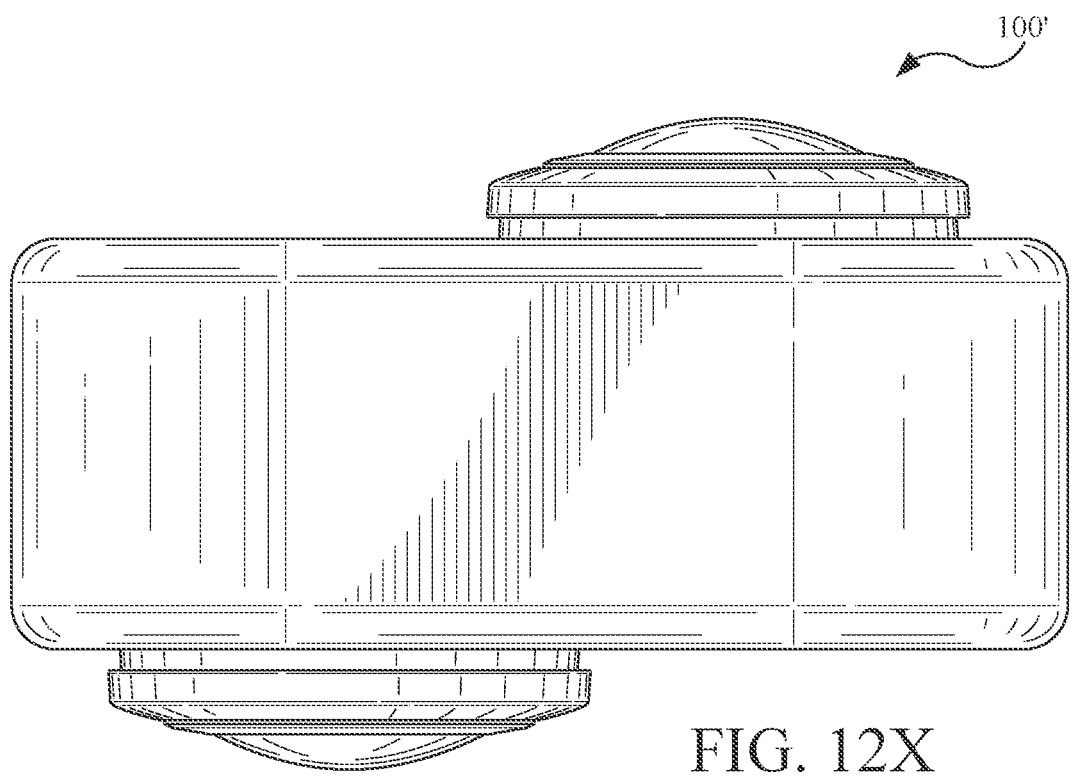
Figure 13A:
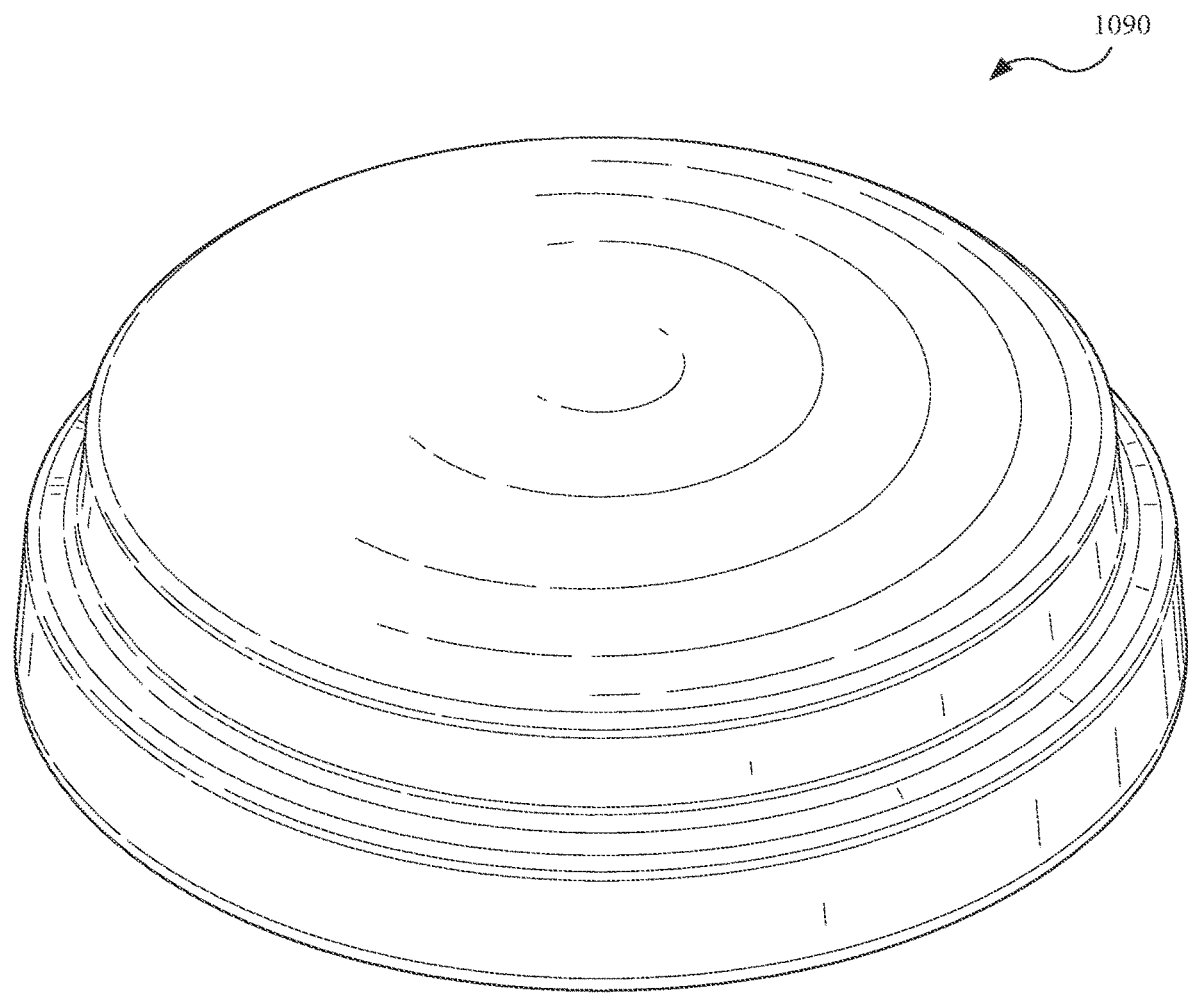
FIGS. 13A-13P are alternative views of the lens cover of FIG. 10A.
Figure 13B:
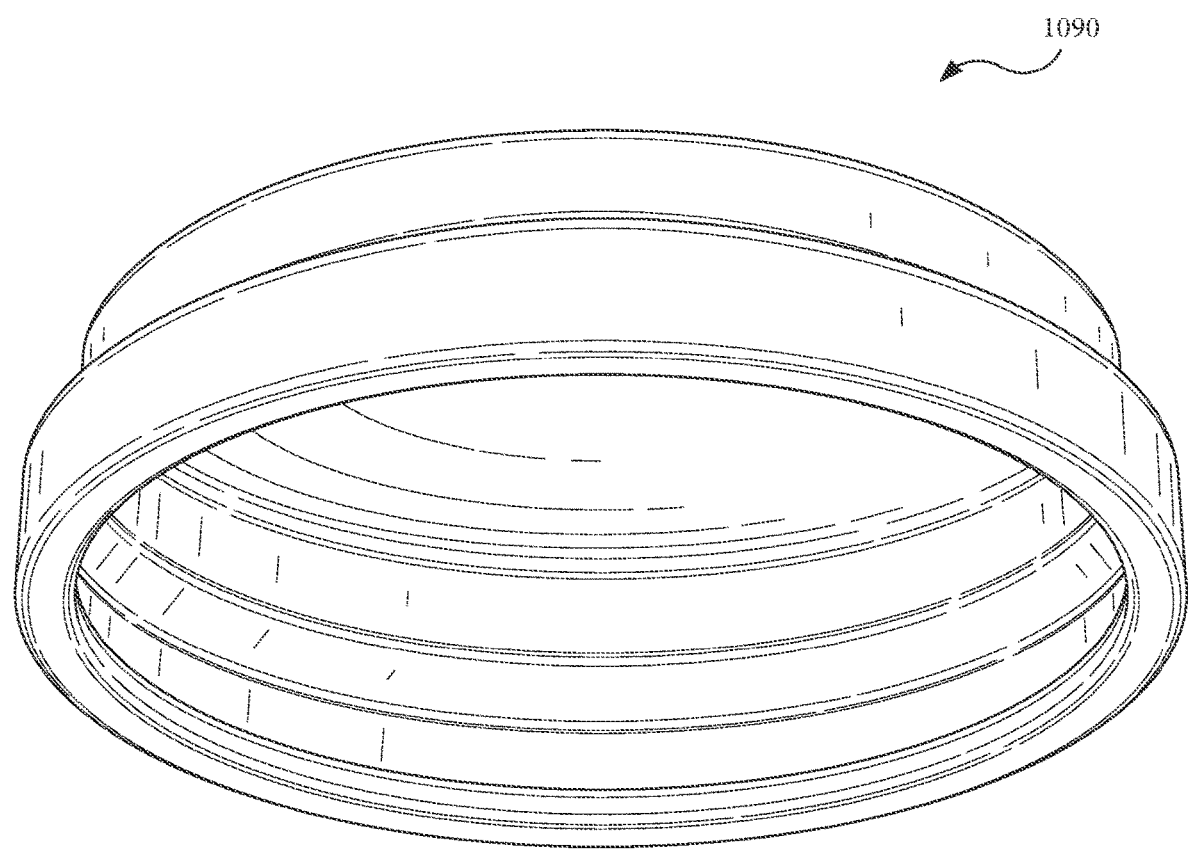
Figure 13C:
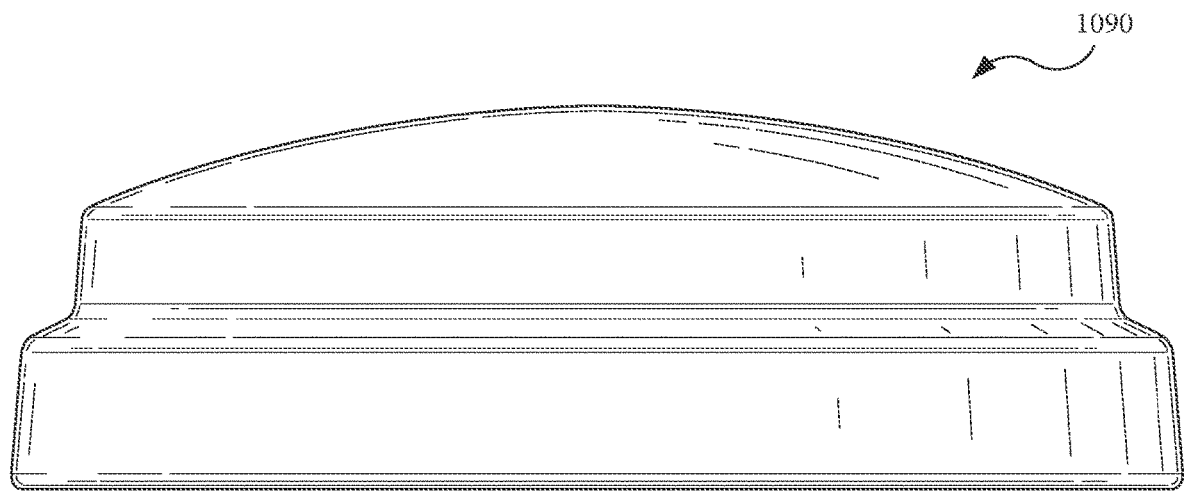
Figure 13D:
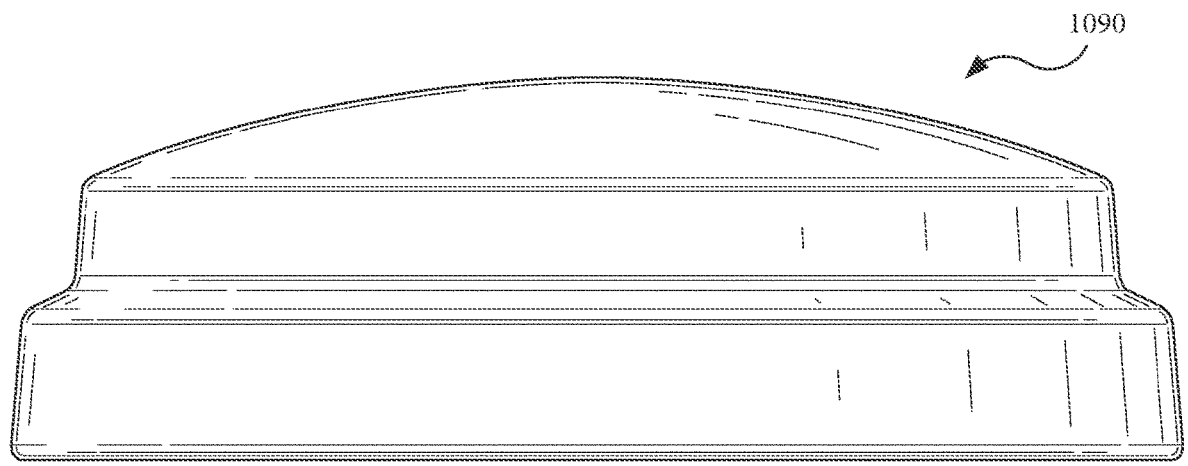
Figure 13E:
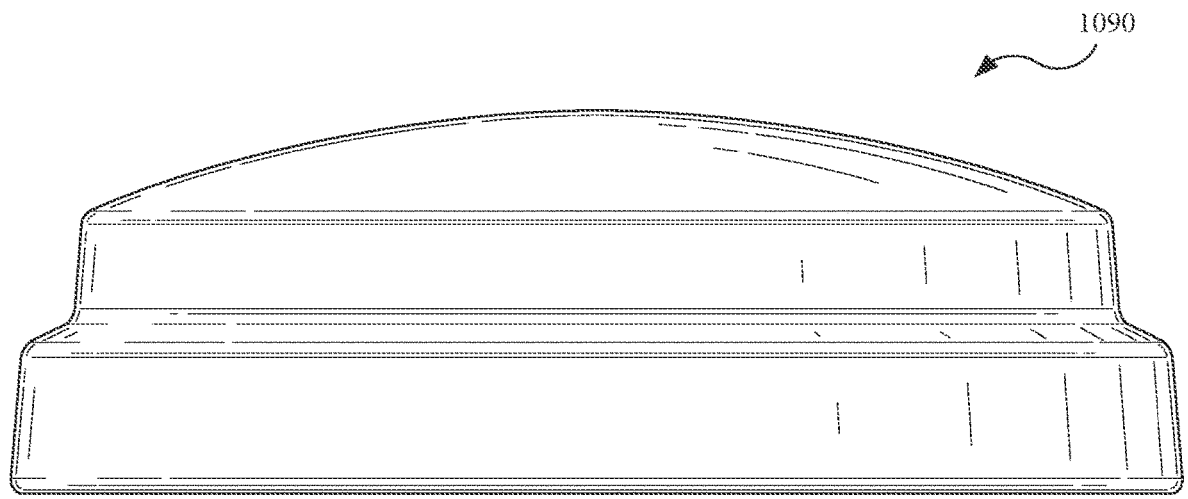
Figure 13F:
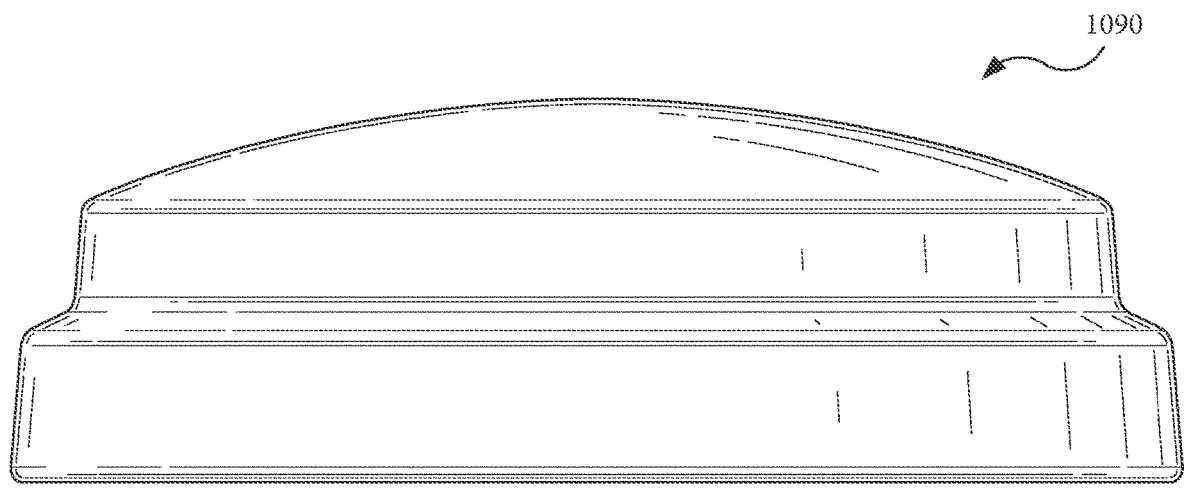
Figure 13G:
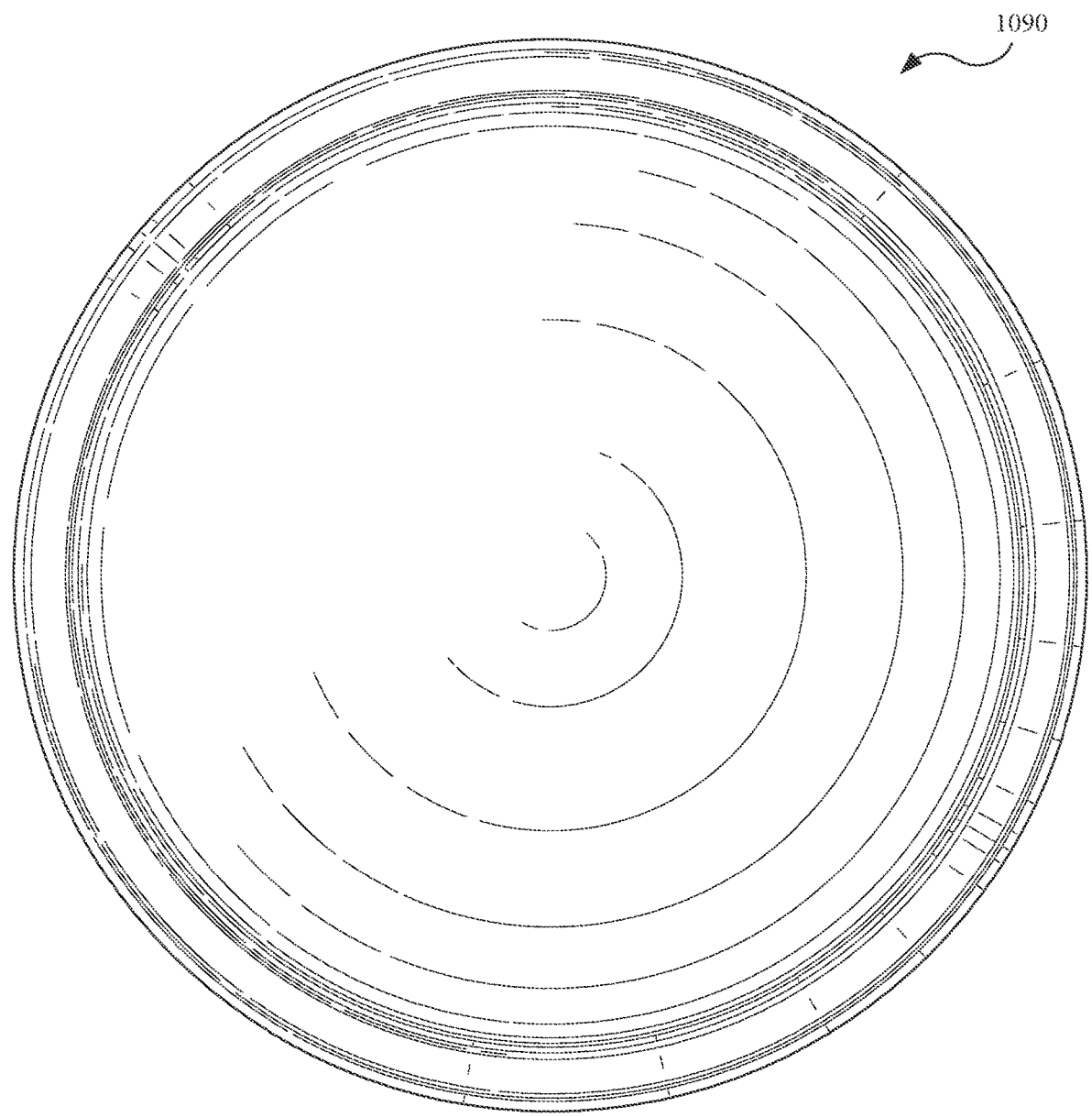
Figure 13H:
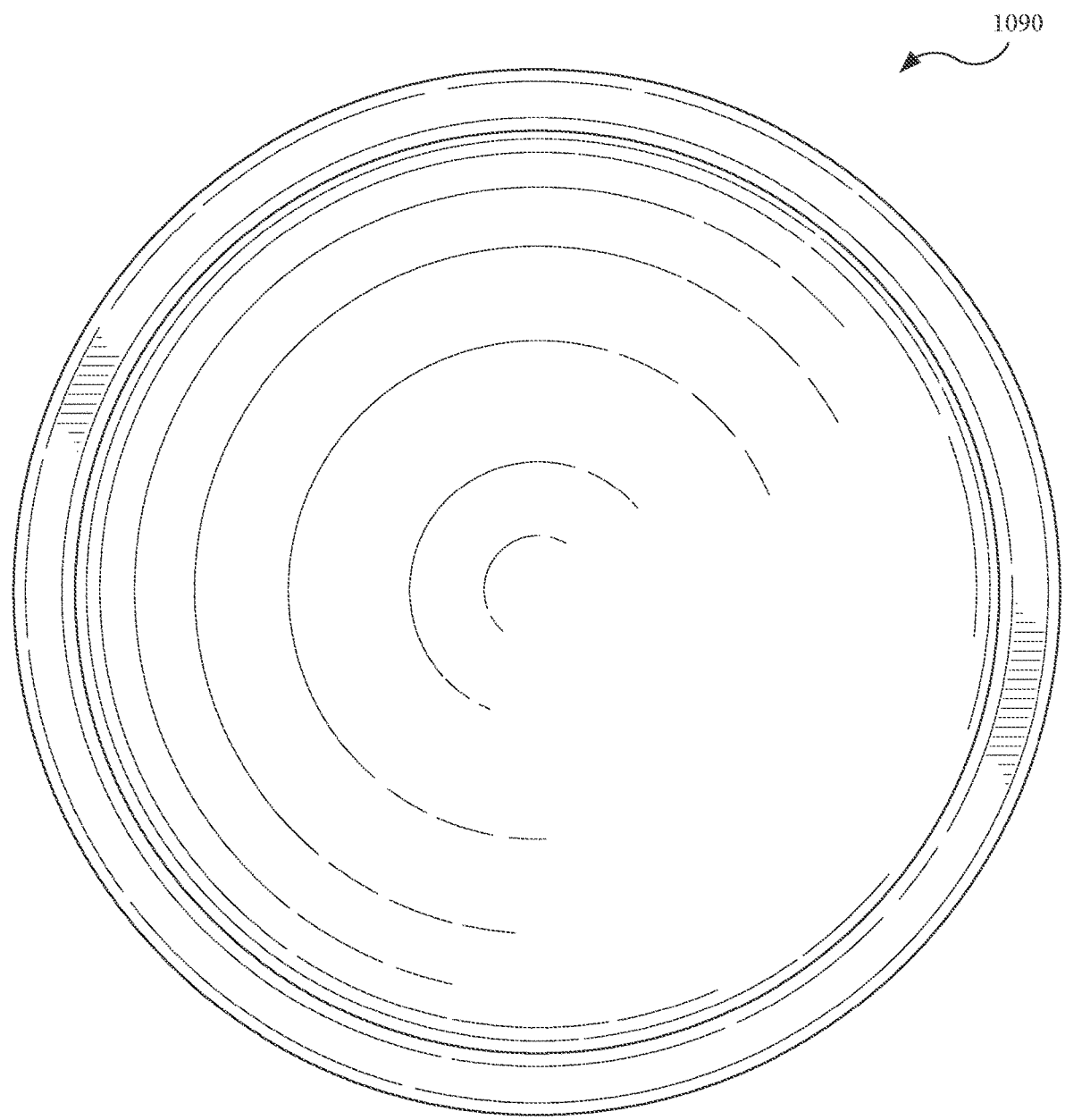
Figure 13I:
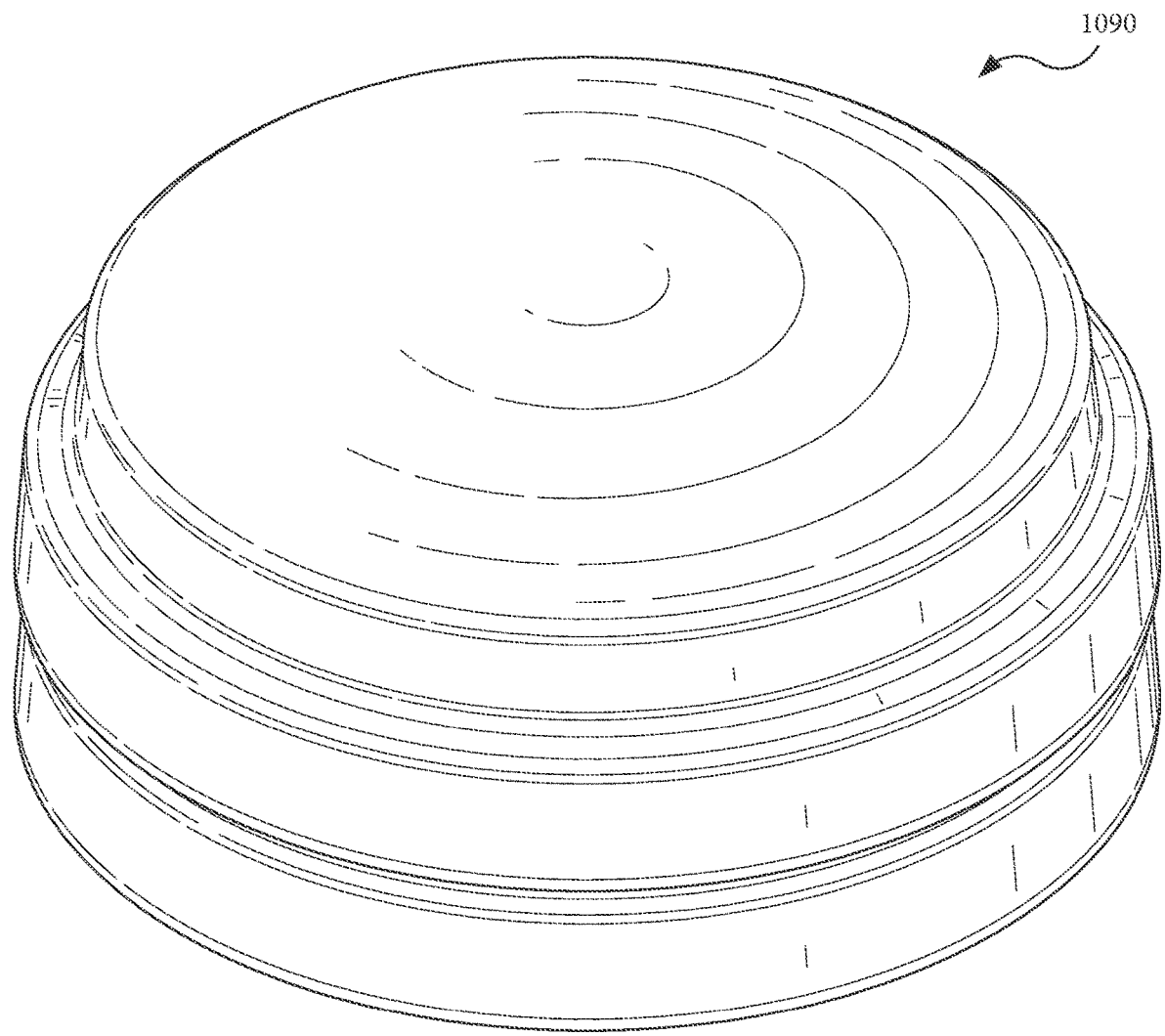
Figure 13J:
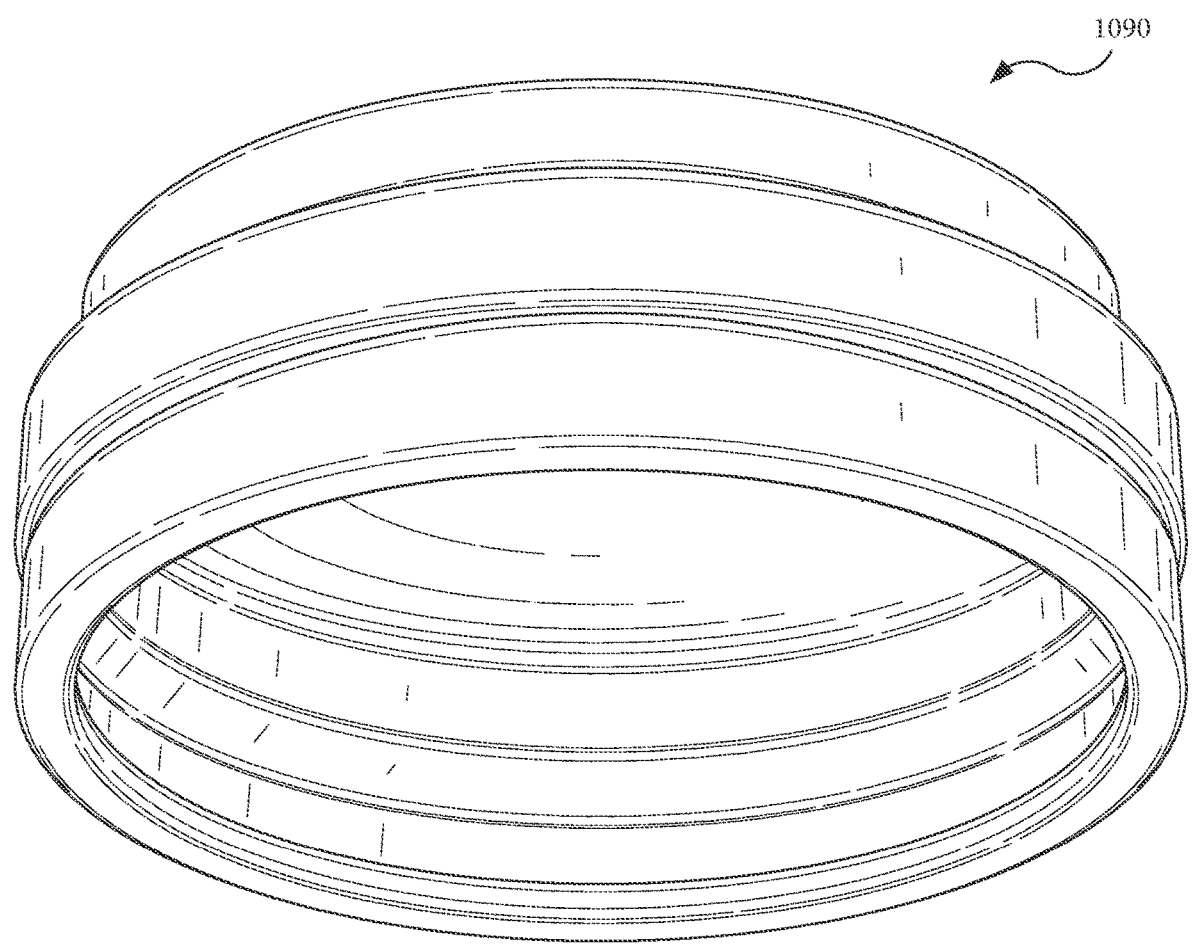
Figure 13K:
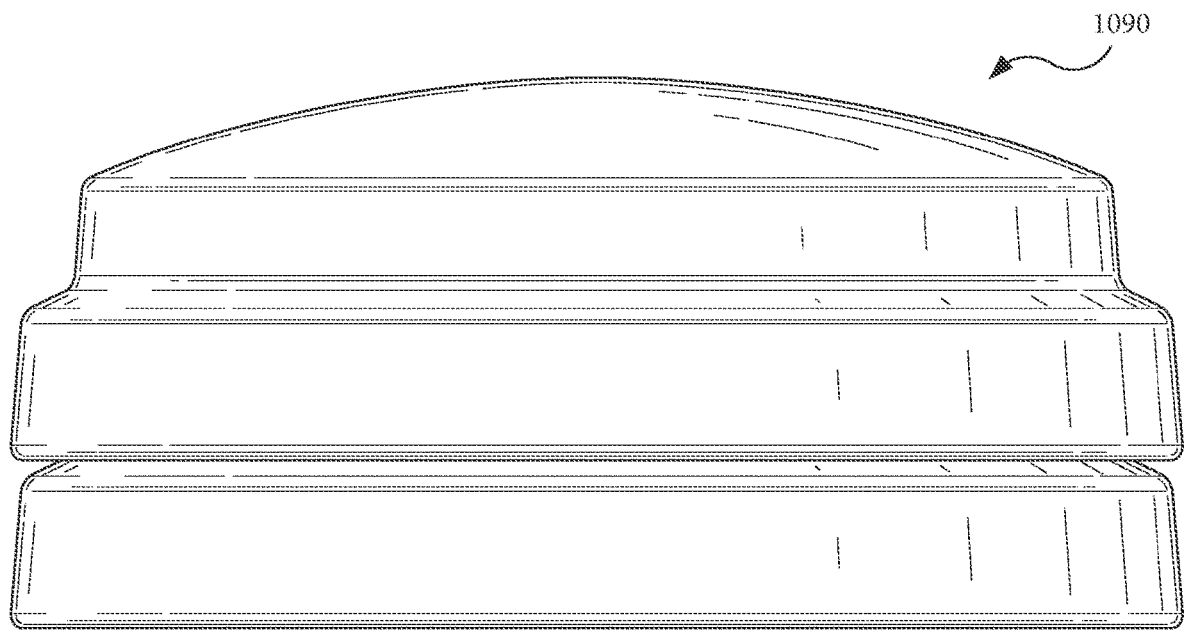
Figure 13L:
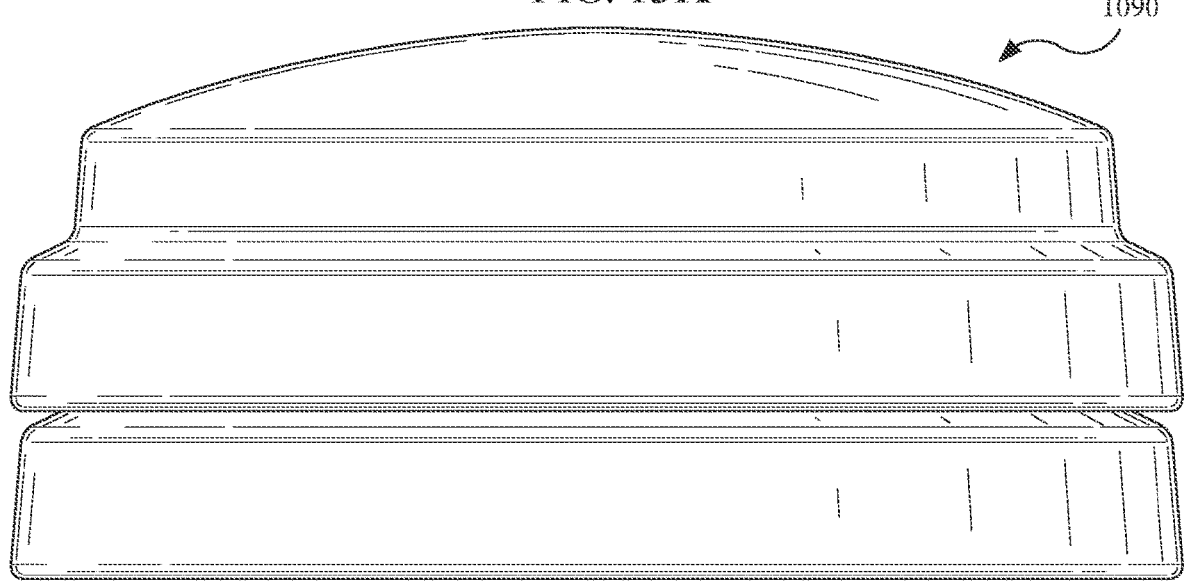
Figure 13M:
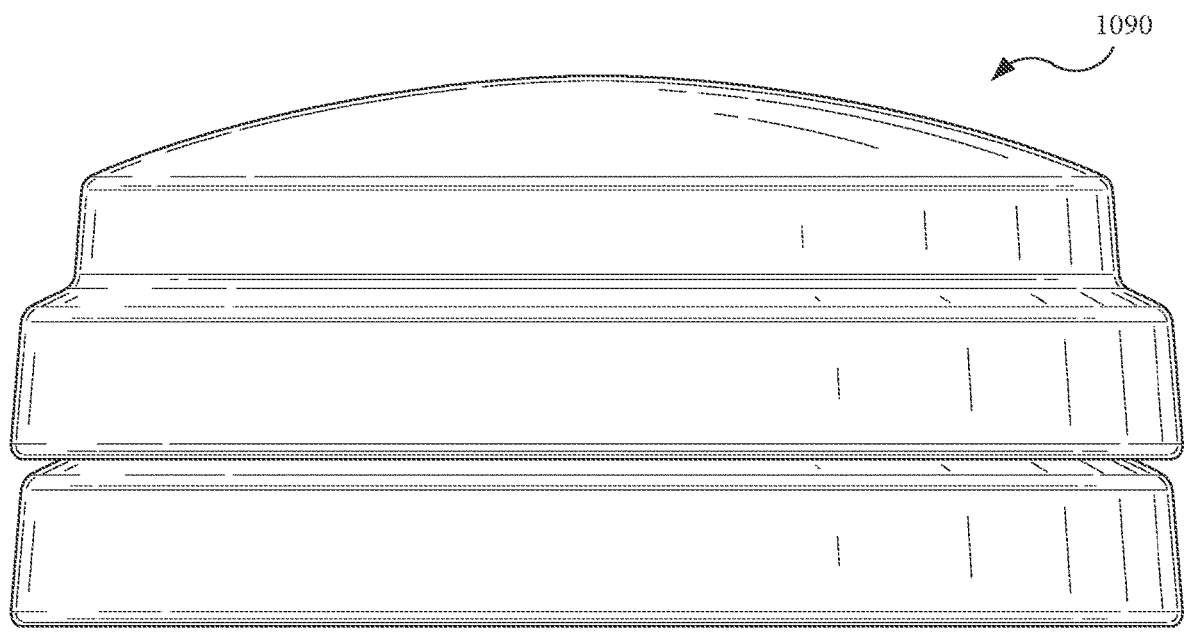
Figure 13N:
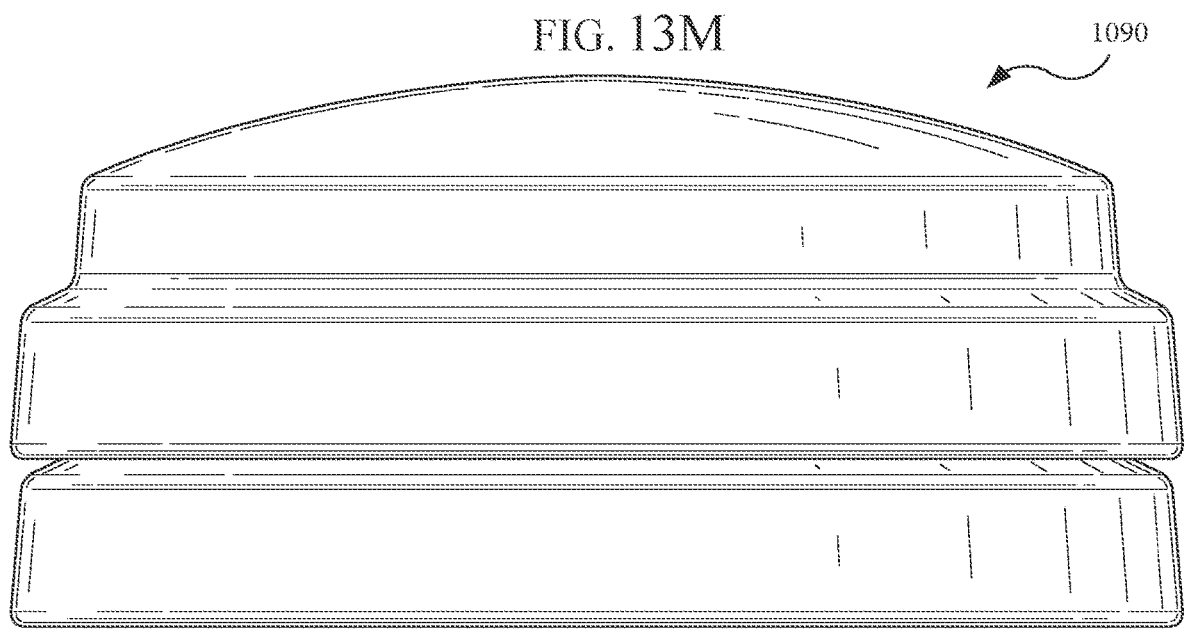
Figure 13O:
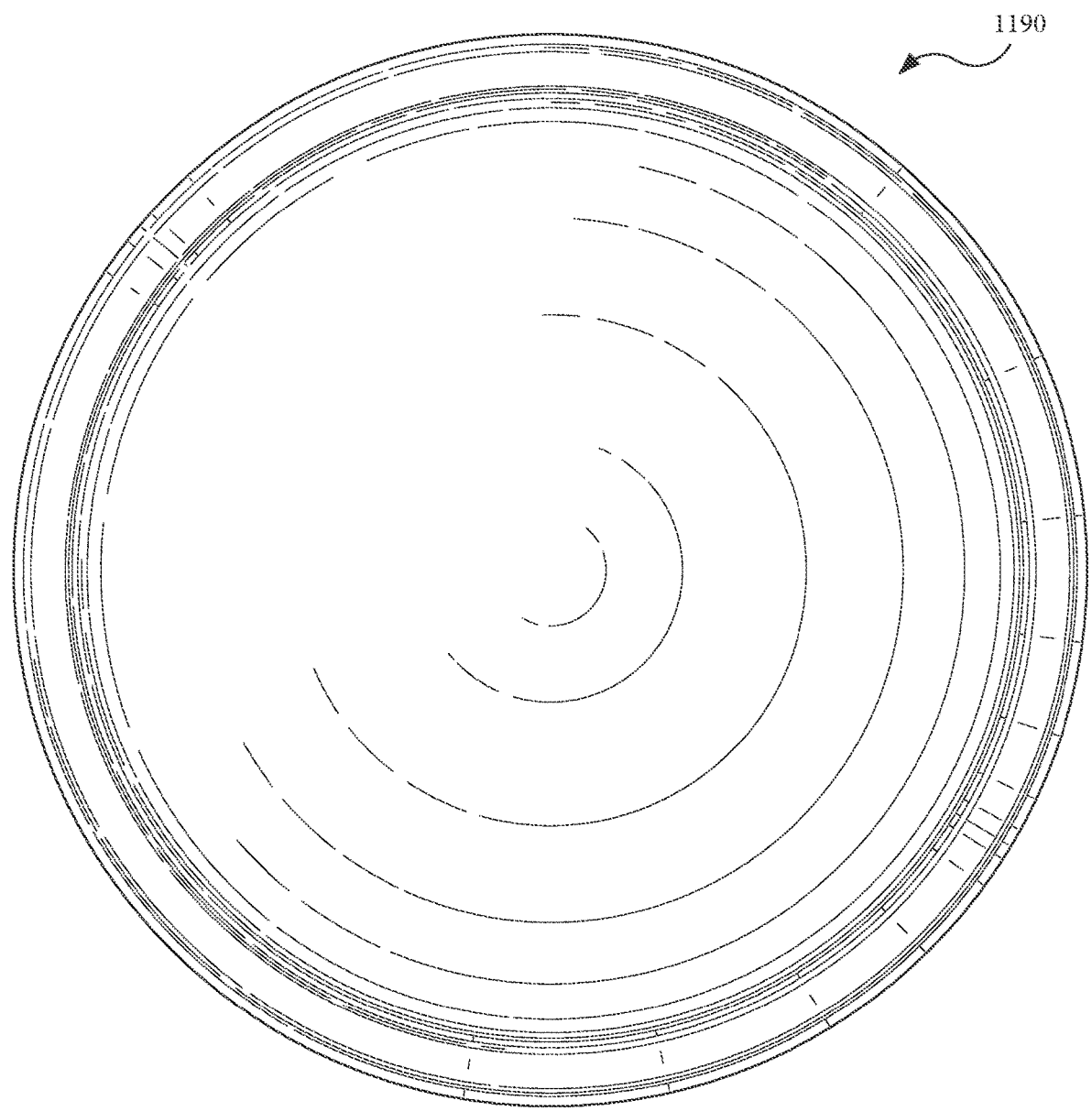
Figure 13P:
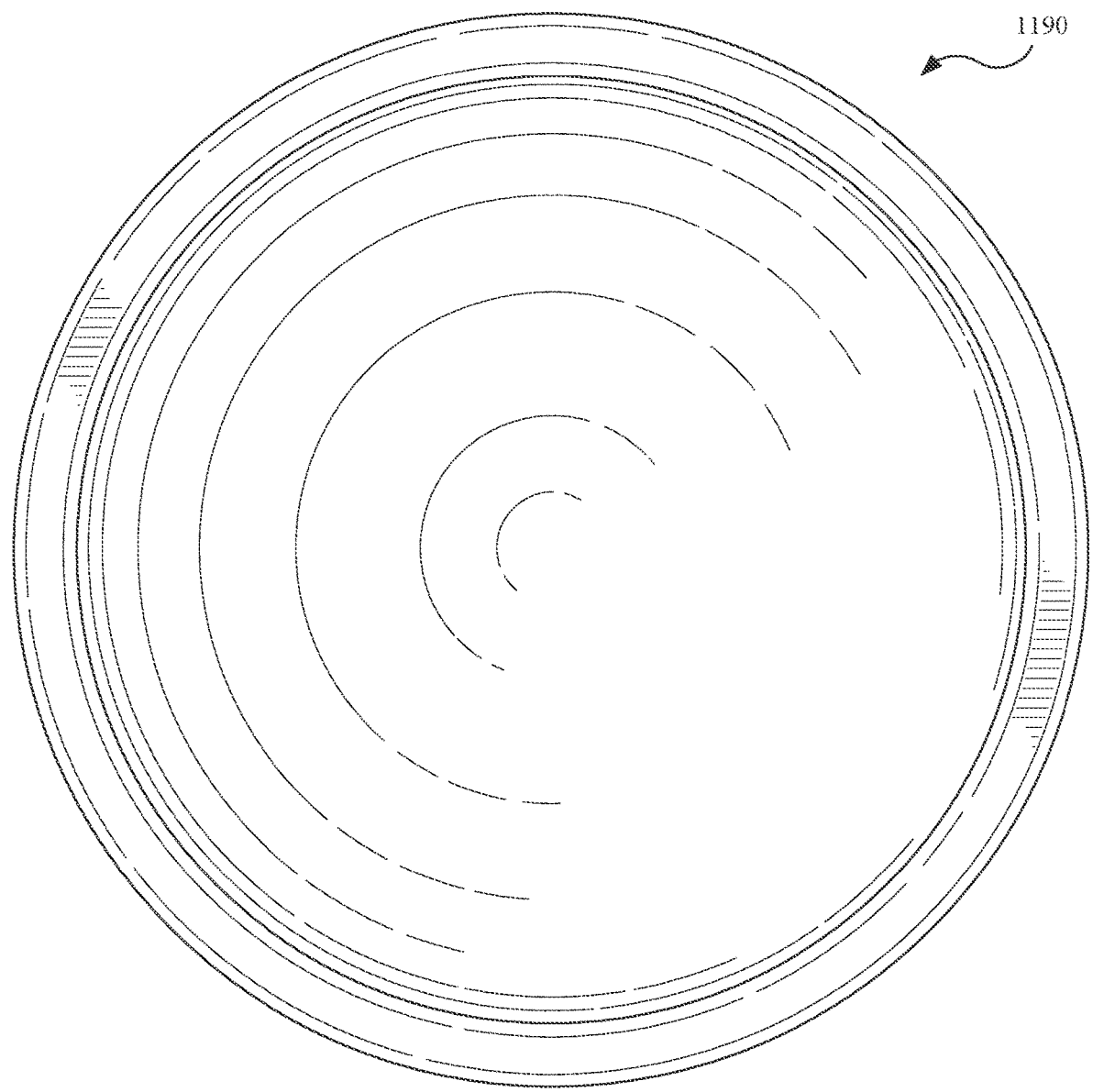
Figure 14A:
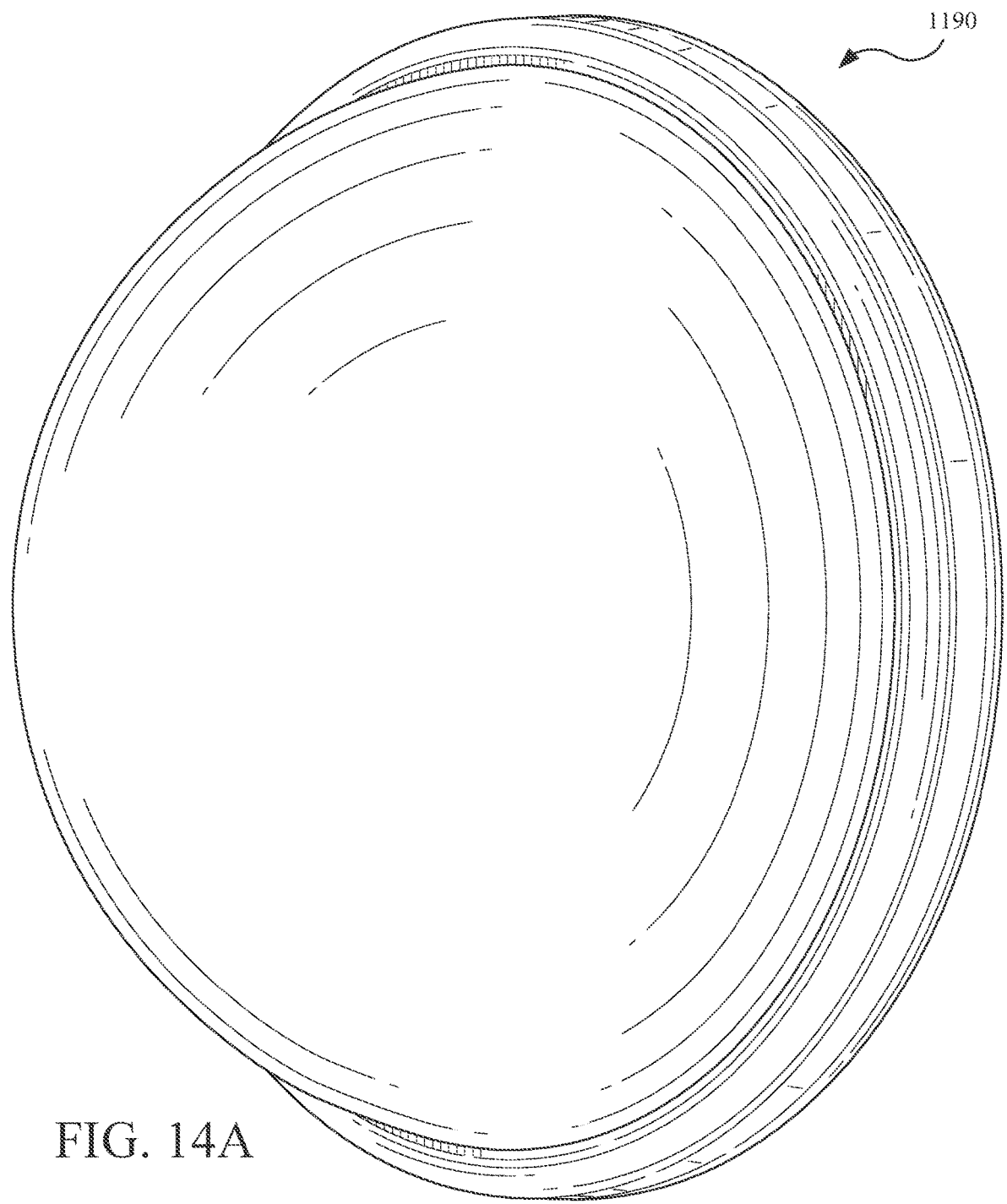
FIGS. 14A-14J are alternative views of the lens cover of FIG. 11A of which FIG. 14J includes the image capture device.
Figure 14B:
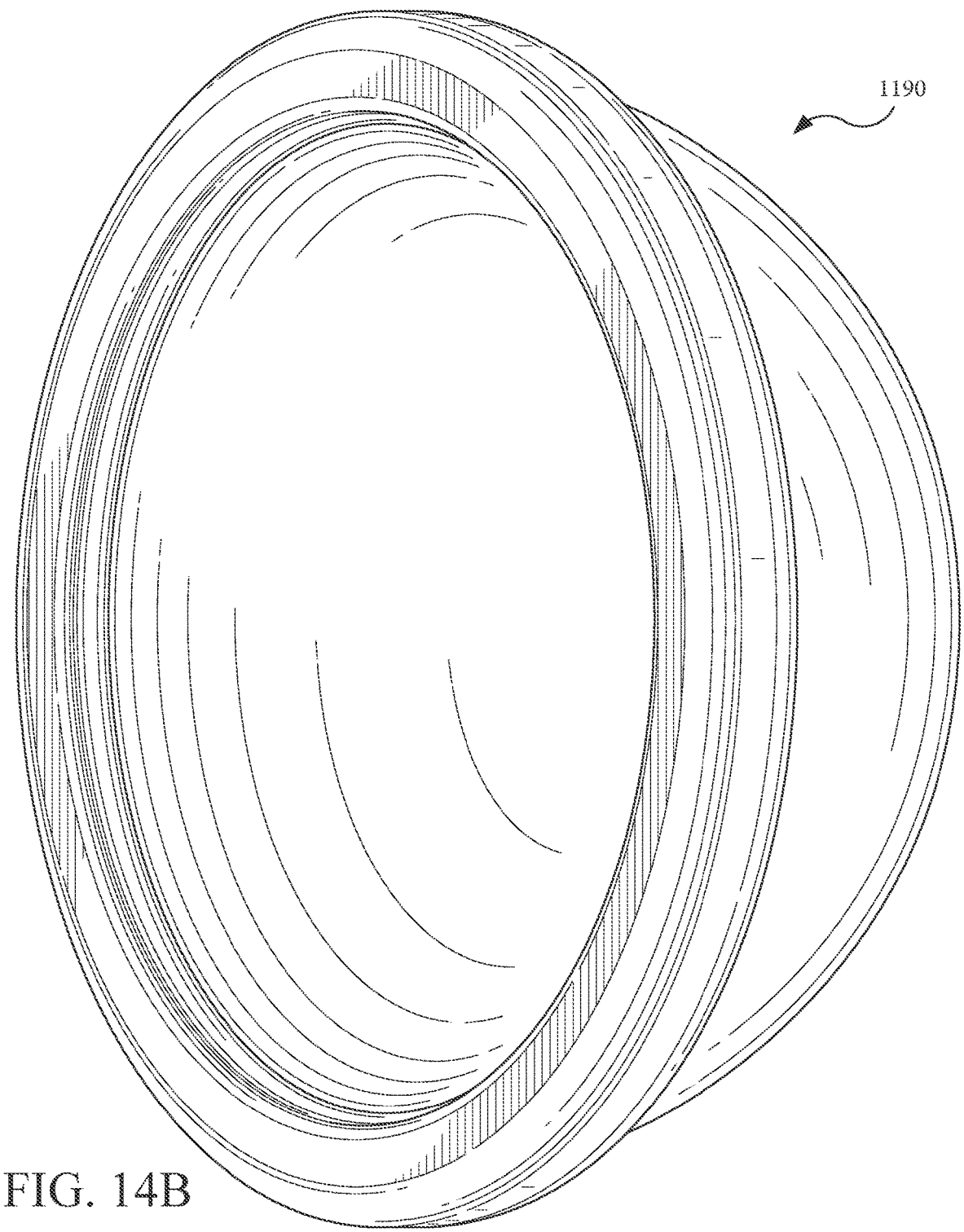
Figure 14C:
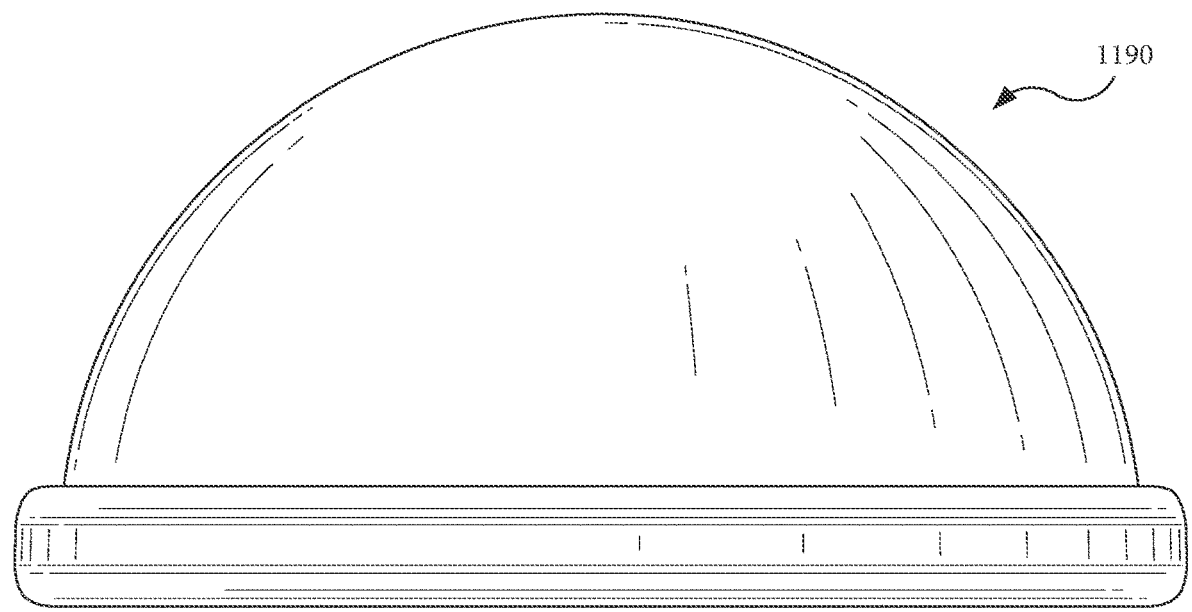
Figure 14D:
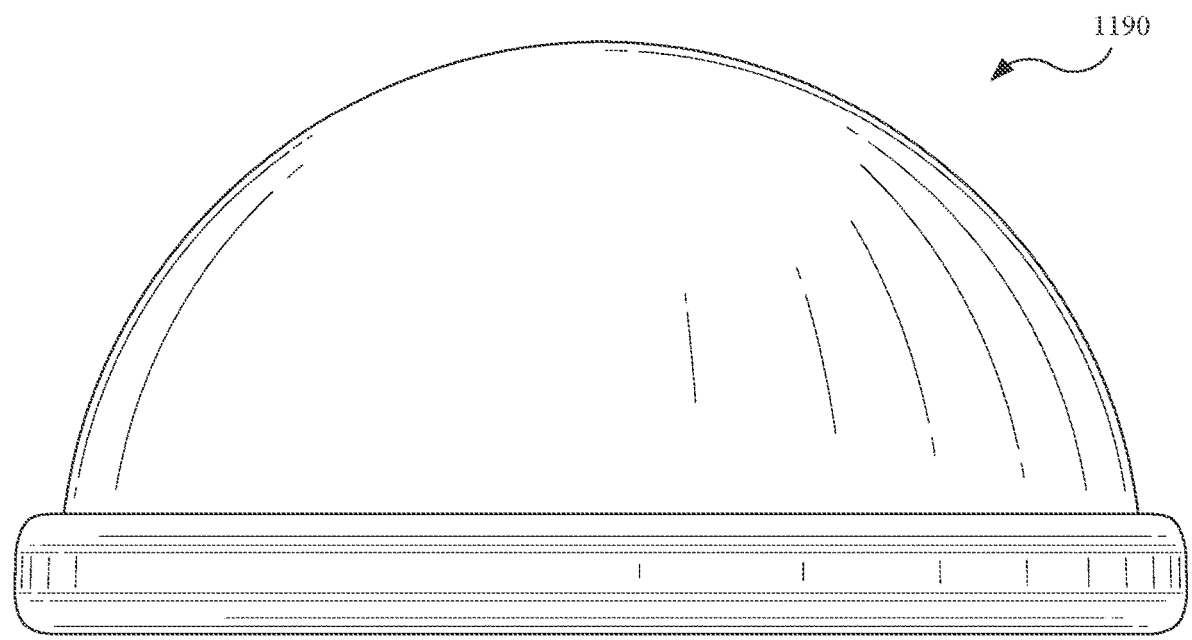
Figure 14E:
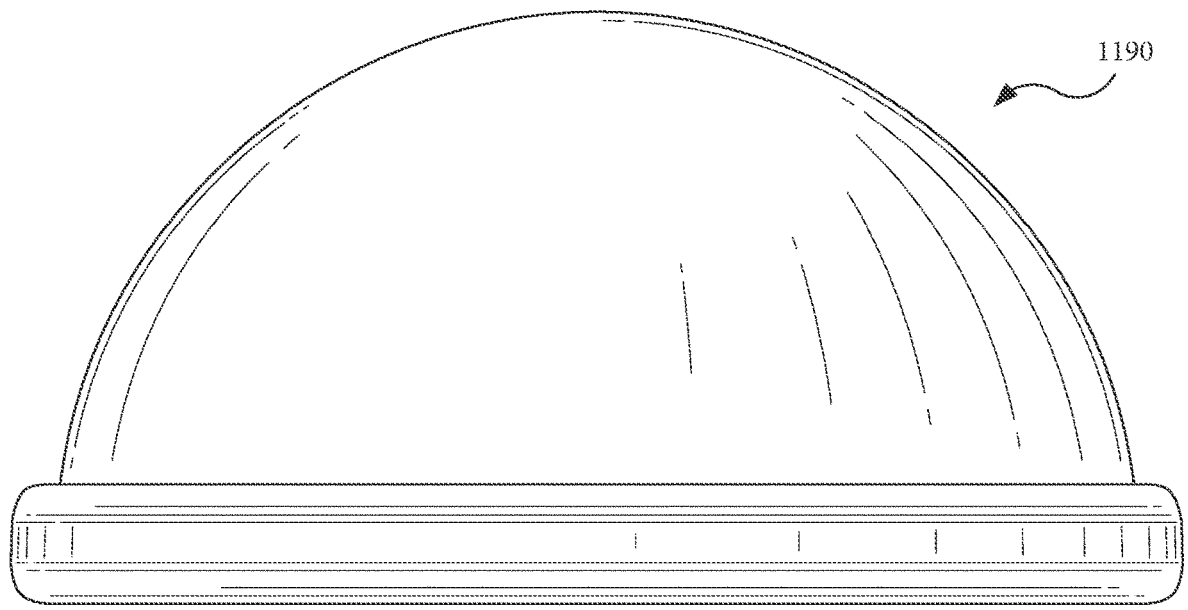
Figure 14F:
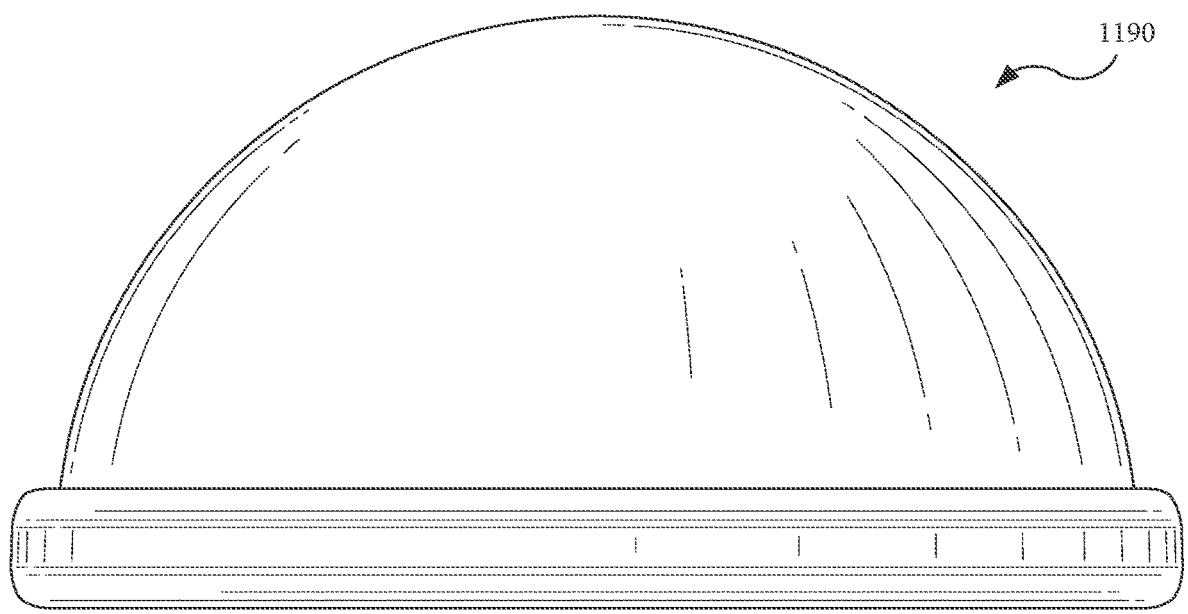
Figure 14G:
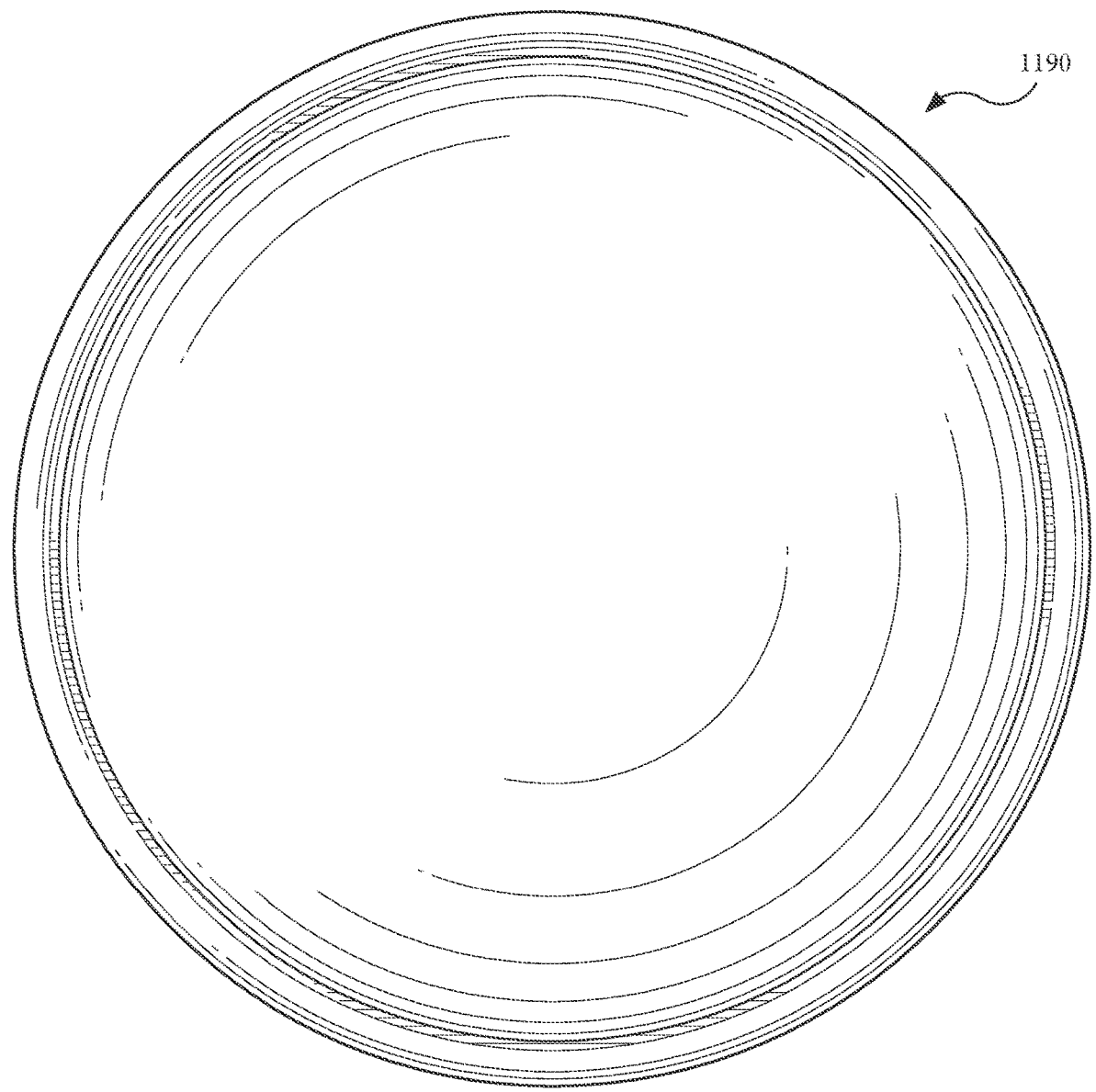
Figure 14H:
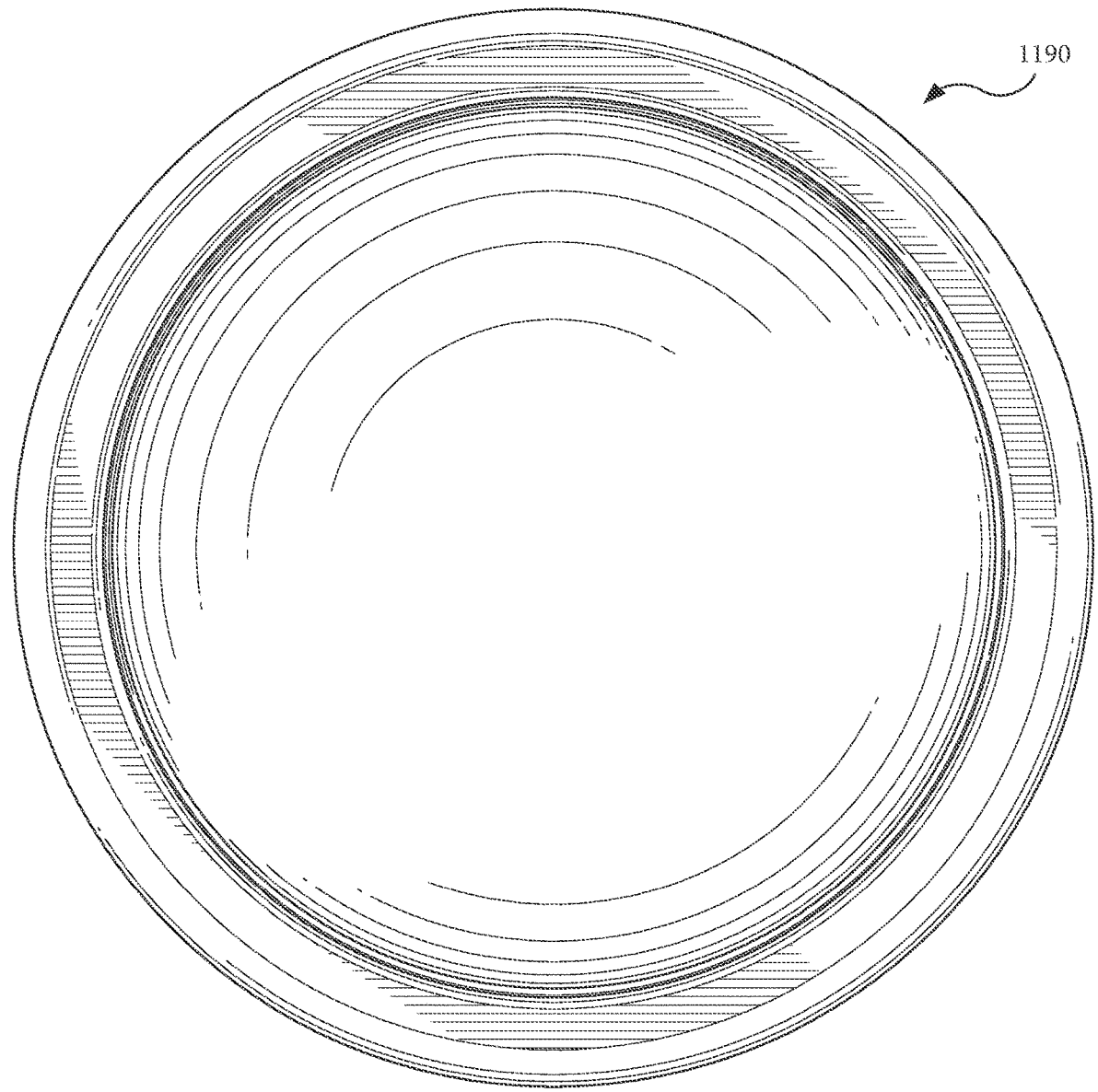
Figure 14I:
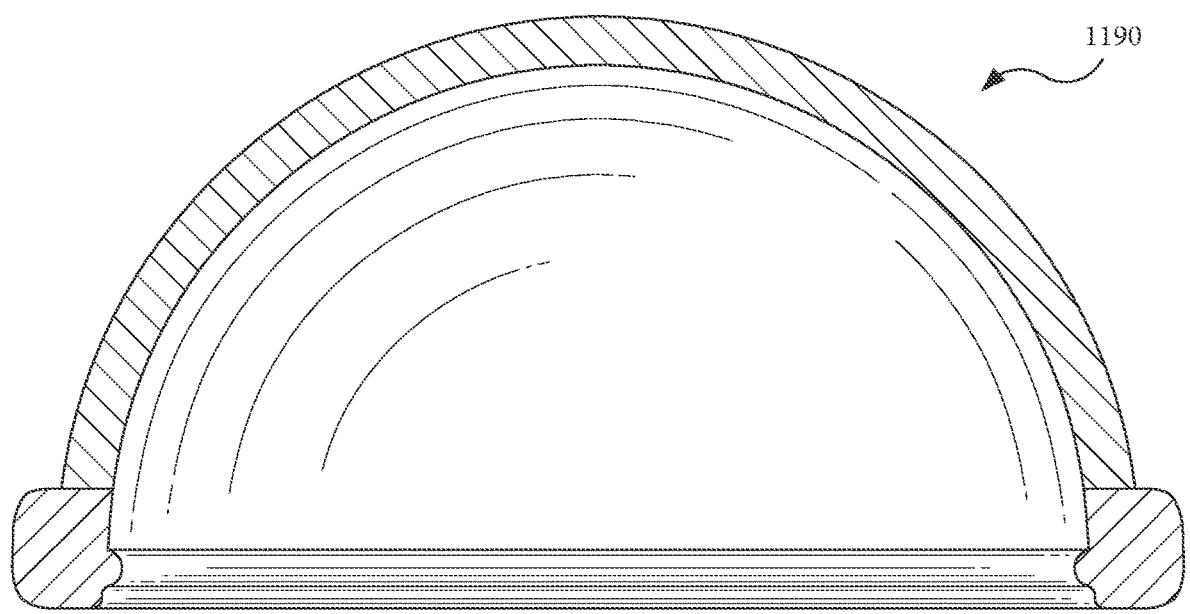
Figure 14J:
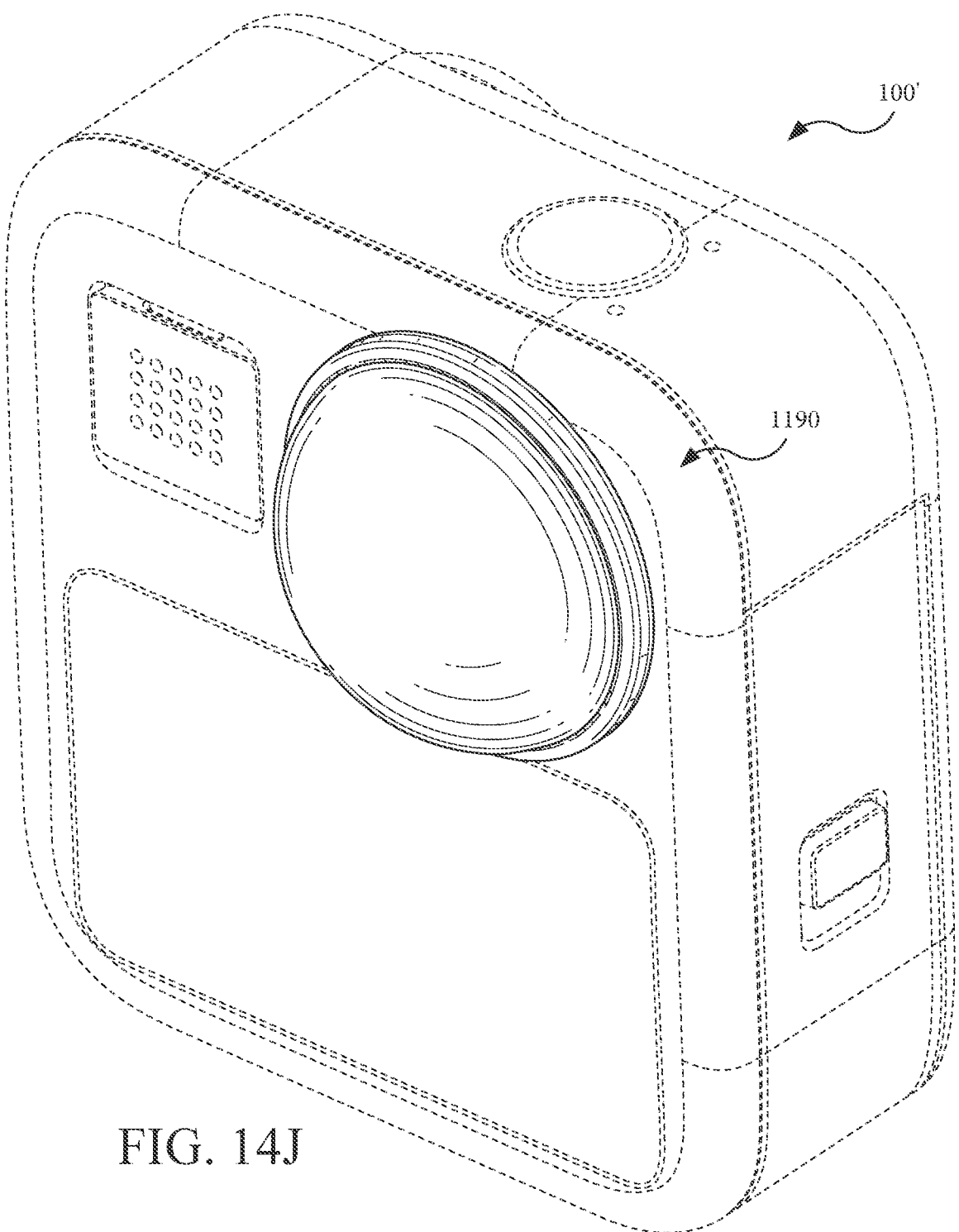

Referring to FIGS. 10B and 11B, each of the lens covers 1090, 1190 defines a recess 1094b in which is received one of the front lens 142a or the rear lens 142b. The coupling flange 1094a protrudes radially inward relative to the recess 1094b to be receivable by one the circumferential channels 550j, 552j for retention therein. The coupling flange 1094a, as shown, may extend entirely around the inner periphery of the recess 1094b or may extend partially therearound in one or more segments. The coupling flange 1094a is formed with an elastic material (e.g., an elastomer, such as rubber), so as to deform (e.g., stretch and/or compress outward) as the coupling flange 1094a passes over the lens bezels 550i, 552i and into the circumferential channel 550j, 552j. The circumferential channels 550j, 552j have smaller diameters than the lens bezels 550i, 552i, so as to hinder longitudinal movement of (i.e., to retain) the lens cover 1090, 1190 when coupled thereto.

The opaque lens cover 1090 may, for example, be formed of an opaque elastomeric material such as a rubber or thermoplastic elastomer. The opaque lens cover 1090 may be a unitary (e.g., monolithic) injection molded or otherwise formed component.

Figure 10C:
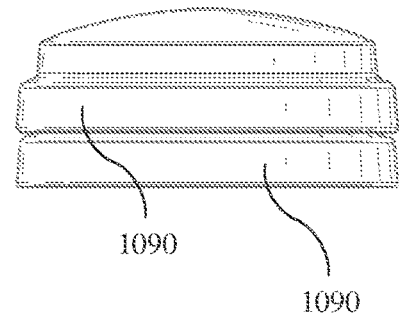
FIG. 10C is a side view of a pair of the lens coves of FIG. 10A in a stacked state.

As shown in FIG. 10C, multiple of the opaque lens covers 1090 may be configured to couple to each other. For example, an upper end of one of the opaque lens covers 1090 may be inserted into the recess 1094b of the other lens cover 1090. When received therein, the coupling flange 1094a of the upper one of the lens covers 1090 couples to (e.g., frictionally engages) the outer surface of the upper end of the lower one of the lens covers 1090.

The transparent lens cover 1190 includes a transparent portion 1190a and an elastomeric portion 1190b. The transparent portion 1190a permits light to pass therethrough for image capture by the ISLA (e.g., the front ISLA 147a or the rear ISLA 147b) over which the transparent lens cover 1190 is positioned. The transparent portion 1190a may, as shown, be dome-shaped so as to both receive the lens 142 therein and limit refracting light therethrough in manners that might otherwise lead to excessive distortion of images captured by the ISLA. The transparent portion 1190a may permit light to pass therethrough substantially without modification (e.g., without polarizing or spectrum filtering). Alternatively, the transparent portion 1190a may modify light passing therethrough, such as with polarizing or light filtering, such that the transparent lens cover 1190 may function as a light filter, as well as to protect the lens 142 thereunder. The transparent portion 1190a of the transparent lens cover 1190 may be formed of any suitable transparent material, such as glass or polycarbonate.

The elastomeric portion 1190b is coupled to the transparent portion 1190a. The elastomeric portion 1190b may, for example, be a rubber or other elastomer. The elastomeric portion 1190b may be coupled to the transparent portion 1190a by any suitable means, such as being overmolded thereto.

The image capture device 100' and two of the opaque lens covers 1090 and/or two of the transparent lens covers 1190 may be considered to form an image capture system. Each group of two of the opaque lens covers 1090 or the two transparent lens covers 1190 may be considered to form a set of lens covers. Within each pair or set of lens covers, the lens covers may be identical, for example, such that each of the two lens covers are interchangeably coupleable to the image capture device 100' to cover and protect either of the lenses 142. Furthermore, each lens cover of the pair or set of lens covers is coupleable to the image capture device 100' independent of the other lens cover, such that one, the other, or both of the lens covers may be coupled to the image capture device 100' at a given time.

Persons skilled in the art will understand that the various embodiments of the disclosure described herein, and shown in the accompanying figures, constitute non-limiting examples, and that additional components and features may be added to any of the embodiments discussed hereinabove without departing from the scope of the present disclosure. Additionally, persons skilled in the art will understand that the elements and features shown or described in connection with one embodiment may be combined with those of another embodiment without departing from the scope of the present disclosure to achieve any desired result and will appreciate further features and advantages of the presently disclosed subject matter based on the description provided. Variations, combinations, and/or modifications to any of the embodiments and/or features of the embodiments described herein that are within the abilities of a person having ordinary skill in the art are also within the scope of the disclosure, as are alternative embodiments that may result from combining, integrating, and/or omitting features from any of the disclosed embodiments.

Use of the term "optionally" with respect to any element of a claim means that the element may be included or omitted, with both alternatives being within the scope of the claim. Additionally, use of broader terms such as "comprises," "includes," and "having" should be understood to provide support for narrower terms such as "consisting of," "consisting essentially of," and "comprised substantially of." Accordingly, the scope of protection is not limited by the description set out above, but is defined by the claims that follow, and includes all equivalents of the subject matter of the claims.

In the preceding description, reference may be made to the spatial relationship between the various structures illustrated in the accompanying drawings, and to the spatial orientation of the structures. However, as will be recognized by those skilled in the art after a complete reading of this disclosure, the structures described herein may be positioned and oriented in any manner suitable for their intended purpose. Thus, the use of terms such as "above," "below," "upper," "lower," "inner," "outer," "left," "right," "upward," "downward," "inward," "outward," "horizontal," "vertical," etc., should be understood to describe a relative relationship between the structures and/or a spatial orientation of the structures. Those skilled in the art will also recognize that the use of such terms may be provided in the context of the illustrations provided by the corresponding figure(s).

Additionally, terms such as "approximately," "generally," "substantially," and the like should be understood to allow for variations in any numerical range or concept with which they are associated. For example, it is intended that the use of terms such as "approximately" and "generally" should be understood to encompass variations on the order of 25%, or to allow for manufacturing tolerances and/or deviations in design.

Although terms such as "first," "second," etc., may be used herein to describe various operations, elements, components, regions, and/or sections, these operations, elements, components, regions, and/or sections should not be limited by the use of these terms in that these terms are used to distinguish one operation, element, component, region, or section from another. Thus, unless expressly stated otherwise, a first operation, element, component, region, or section could be termed a second operation, element, component, region, or section without departing from the scope of the present disclosure.

Each and every claim is incorporated as further disclosure into the specification and represents embodiments of the present disclosure. Also, the phrases "at least one of A, B, and C" and "A and/or B and/or C" should each be interpreted to include only A, only B, only C, or any combination of A, B, and C.

What is claimed is:

1. An image capture device comprising:
    a body including:
        a front housing; and
        a rear housing coupled to the front housing so as to define an internal compartment:
    a front lens extending into a lens opening in the front housing and defining a circumferential channel;
    a rear lens extending into a lens opening defined by the rear housing and defining a circumferential channel;
    a chassis positioned within the internal compartment, wherein the front housing and the rear housing are configured as discrete components to thereby permit connection of the rear housing to the front housing following insertion of the chassis into the internal compartment, the chassis having a generally U-shaped configuration and including:
        a front chassis defining a lens opening for the front lens such that the front lens extends through the front chassis; and
        a rear chassis defining a lens opening for the rear lens such that the rear lens extends through the rear chassis;
    a mount connected to the chassis and configured to couple the image capture device to a support device;
    a front lens cover defining a coupling flange configured for insertion into the circumferential channel defined by the front lens; and
    a rear lens cover defining a coupling flange configured for insertion into the circumferential channel defined by the rear lens.

2. The image capture device of claim 1, wherein the front housing includes an I/O opening.

3. The image capture device of claim 2, wherein the front housing includes a battery opening positioned vertically below the I/O opening.

4. The image capture device of claim 1, wherein the front housing includes a rear flange.

5. The image capture device of claim 4, wherein the rear housing defines an adhesive channel configured to receive the rear flange.

6. The image capture device of claim 1, wherein the front lens and the rear lens are laterally offset from each other.

7. The image capture device of claim 1, wherein the chassis is configured as a heat sink.

8. The image capture device of claim 1, wherein the rear chassis is coupled to the front housing.

9. The image capture device of claim 1, further comprising a fastener extending through the front housing and into the rear chassis so as to avoid the front chassis.

10. The image capture device of claim 1, wherein the mount is repositionable between a stowed position and a deployed position while connected to the chassis, the mount extending externally of the body in the deployed position to facilitate coupling of the image capture device to the support device.

11. An image capture device comprising:
   a body including:
      a front housing; and
      a rear housing coupled to the front housing so as to define an internal compartment:
   a front lens extending into the front housing;
   a rear lens extending into the rear housing; and
   a chassis positioned within the internal compartment, the chassis including:
      a front chassis, the front chassis including:
         a front portion; and
         a bottom portion extending rearwardly from the front portion such that the front chassis includes a generally L-shaped configuration; and
      a rear chassis, the rear chassis including:
         a rear portion; and
         a bottom portion extending forwardly from the rear portion such that the rear chassis includes a generally L-shaped configuration,
   wherein the bottom portion of the front chassis and the bottom portion of the rear chassis are positioned in overlapping engagement, whereby the chassis includes a generally U-shaped configuration.

12. The image capture device of claim 11, wherein the front lens and the rear lens are laterally offset from each other.

13. The image capture device of claim 11, wherein the chassis is configured as a heat sink.

14. The image capture device of claim 11, wherein the rear chassis is coupled to the front housing via a fastener extending through the front housing and into the rear chassis so as to avoid the front chassis.

15. The image capture device of claim 11, wherein the front lens extends through the front chassis, and the rear lens extends through the rear chassis.

16. An image capture device comprising:
   a body including:
      a front housing; and
      a rear housing coupled to the front housing so as to define an internal compartment:
   a chassis positioned within the internal compartment and configured to support various electronic components of the image capture device, wherein the chassis is configured as a heat sink and the body is configured such that the chassis is inserted into the internal compartment in a direction extending in generally parallel relation to optical axes of the image capture device;
   a front lens extending through the chassis and into the front housing;
   a rear lens extending through the chassis and into the rear housing;
   a front lens cover configured for connection to the front lens to protect the front lens; and
   a rear lens cover configured for connection to the rear lens to protect the rear lens.

17. The image capture device of claim 16, wherein the front lens defines a first circumferential channel, and the rear lens defines a second circumferential channel.

18. The image capture device of claim 17, wherein the front lens cover defines a first coupling flange configured for insertion into the first circumferential channel, and the rear lens cover defines a second coupling flange configured for insertion into the second circumferential channel.

19. The image capture device of claim 16, further including:
   a mount connected to the chassis and configured to couple the image capture device to a support device.

20. The image capture device of claim 19, wherein the mount is repositionable between a stowed position and a deployed position while connected to the chassis, the mount extending externally of the body in the deployed position to facilitate coupling of the image capture device to the support device.

* * * * *